United States Patent
Kim et al.

(10) Patent No.: US 8,674,244 B2
(45) Date of Patent: Mar. 18, 2014

(54) TIME DIFFERENCE ADDERS, TIME DIFFERENCE ACCUMULATORS, SIGMA-DELTA TIME-TO-DIGITAL CONVERTERS, DIGITAL PHASE LOCKED LOOPS AND TEMPERATURE SENSORS

(75) Inventors: Sung-Jin Kim, Ulsan (KR); Ji-Hyun Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/462,064

(22) Filed: May 2, 2012

(65) Prior Publication Data

US 2012/0306553 A1   Dec. 6, 2012

(30) Foreign Application Priority Data

May 30, 2011   (KR) .......................... 10-2011-0051105

(51) Int. Cl.
 *G06F 3/041*  (2006.01)
 *G06K 11/06*  (2006.01)
 *G08C 21/00*  (2006.01)
(52) U.S. Cl.
 USPC ....................................... 178/20.04; 327/158
(58) Field of Classification Search
 USPC ........................................ 178/20.04; 327/158
 See application file for complete search history.

(56) References Cited

U.S. PATENT DOCUMENTS

| | | | |
|---|---|---|---|
| 7,257,096 B2 * | 8/2007 | Kim | 370/318 |
| 8,363,703 B2 * | 1/2013 | Ganger et al. | 375/215 |
| 2005/0062513 A1 * | 3/2005 | Sim | 327/307 |
| 2008/0136698 A1 | 6/2008 | Choi et al. | |
| 2009/0225631 A1 | 9/2009 | Shimizu et al. | |
| 2010/0134335 A1 | 6/2010 | Park et al. | |
| 2012/0159226 A1 * | 6/2012 | Prathaban et al. | 713/340 |
| 2012/0200435 A1 * | 8/2012 | Ngo et al. | 341/61 |
| 2012/0306553 A1 * | 12/2012 | Kim et al. | 327/158 |
| 2013/0120170 A1 * | 5/2013 | Gupta et al. | 341/110 |

FOREIGN PATENT DOCUMENTS

| | | | |
|---|---|---|---|
| JP | 2008076542 A * | 4/2008 | |
| JP | 2009-218729 A | 9/2009 | |
| KR | 2008-0043978 A | 5/2008 | |
| KR | 2010-0018934 | 2/2010 | |
| KR | 2010-0062908 A | 6/2010 | |

\* cited by examiner

*Primary Examiner* — Adam Houston

(74) *Attorney, Agent, or Firm* — Harness, Dickey & Pierce, P.L.C.

(57) ABSTRACT

A time difference adder included in a system-on-chip (SOC) includes a first register unit and a second register unit. The first register unit is configured to receive first and second input signals having a first time difference, and generate a first output signal in response to a first signal. The second register unit is configured to receive third and fourth input signals having a second time difference, and generate a second output signal having a third time difference with respect to the first output signal in response to the first signal. The third time difference corresponds to a sum of the first time difference and the second time difference.

17 Claims, 31 Drawing Sheets

TIME DIFFERENCE ADDERS, TIME DIFFERENCE ACCUMULATORS, SIGMA-DELTA TIME-TO-DIGITAL CONVERTERS, DIGITAL PHASE LOCKED LOOPS AND TEMPERATURE SENSORS

CROSS-REFERENCE TO RELATED APPLICATION(S)

This U.S. non-provisional application claims priority under 35 U.S.C. §119 to Korean Patent Application No. 2011-0051105 filed on May 30, 2011 in the Korean Intellectual Property Office (KIPO), the entire contents of which is incorporated herein by reference.

BACKGROUND

1. Technical Field

Example embodiments relate to signal processing. More particularly, for example, example embodiments relate to system-on-chips (SOCs) including time difference adders, SOCs including time difference accumulators, sigma-delta time-to-digital converters, digital phase locked loops and/or temperature sensors.

2. Description of the Related Art

A time-to-digital converter (TDC) is a device that converts a time difference between input signals into a digital signal. As a design rule (DR) and a power supply voltage decrease, a signal-to-noise ratio (SNR) of a voltage signal decreases, and performance of an analog-to-digital converter (ADC) converting the voltage signal into a digital signal may deteriorate. Accordingly, the ADC converting the voltage signal into the digital signal may be replaced by the TDC converting the time difference into the digital signal.

SUMMARY

At least some example embodiments provide a system-on-chip (SOC) including a time difference adder configured to add time differences between input signals.

At least some example embodiments provide an SOC including a time difference accumulator configured to accumulate time differences between input signals.

At least some example embodiments provide a sigma-delta time-to-digital converter configured to convert a time difference between input signals into a digital signal in a sigma-delta manner.

At least some example embodiments provide a digital phase locked loop (DPLL) including a sigma-delta time-to-digital converter.

At least some example embodiments provide a temperature sensor including a sigma-delta time-to-digital converter.

According to one or more example embodiments, a time difference adder included in a system-on-chip (SOC) includes a first register unit and a second register unit. The first register unit receives first and second input signals having a first time difference, and generates a first output signal in response to a first signal. The second register unit receives third and fourth input signals having a second time difference, and generates a second output signal having a third time difference with respect to the first output signal in response to the first signal. The third time difference corresponds to a sum of the first time difference and the second time difference.

According to one or more example embodiments, a time difference adder included in a system-on-chip (SOC) includes a first register unit and a second register unit. The first register unit is configured to receive first and second input signals having a first time difference, and to generate a first output signal in response to a first signal. The second register unit is configured to receive third and fourth input signals having a second time difference, and to generate a second output signal having a third time difference with respect to the first output signal in response to the first signal. The third time difference corresponds to a sum of the first time difference and the second time difference.

In some example embodiments, the first register unit may include a first offset delay unit configured to generate a first hold signal by delaying the second input signal by an offset time, and a first time register including a first input terminal configured to receive the first input signal, a first hold terminal configured to receive the first hold signal, a first awake terminal configured to receive the first signal, and a first output terminal configured to output the first output signal. The second register unit may include a second offset delay unit configured to generate a second hold signal by delaying the third input signal by the offset time, and a second time register including a second input terminal configured to receive the fourth input signal, a second hold terminal configured to receive the second hold signal, a second awake terminal configured to receive the first signal, and a second output terminal configured to output the second output signal.

In some example embodiments, the first time register may output the first output signal that has a rising edge after a first given, desired or predetermined time period after a rising edge of the first signal. The first time interval may be equal or substantially equal to a discharge time minus the offset time minus the first time difference. The second time register may output the second output signal that has a rising edge after a second given, desired or predetermined time period after the rising edge of the first signal. The second time period may be equal or substantially equal to the discharge time minus the offset time plus the second time difference.

In some example embodiments, the first time register may include a first capacitor, and the second time register may include a second capacitor. The first capacitor and the second capacitor may have the same or substantially the same capacitance. The discharge time may be determined according to the capacitance.

In some example embodiments, the first time register may include a first inverter configured to invert the first input signal, an inverter controlling unit configured to deactivate the first inverter in response to the first hold signal, and to activate the first inverter in response to the first signal, a capacitor configured to be charged or discharged in response to an output signal of the first inverter, and a second inverter configured to generate the first output signal based on a voltage of the capacitor.

In some example embodiments, the capacitor may be discharged during a time difference between the first input signal and the first hold signal to store information about the time difference between the first input signal and the first hold signal.

In some example embodiments, a discharging of the capacitor may be started in response to a rising edge of the first input signal, may be stopped in response to a rising edge of the first hold signal, and may be restarted in response to a rising edge of the first signal.

In some example embodiments, the first inverter may include a first (e.g., PMOS) transistor including a gate configured to receive the first input signal, a source coupled to a power supply voltage via the inverter controlling unit, and a drain coupled to a middle node, and a second (e.g., NMOS) transistor including a gate configured to receive the first input signal, a source coupled to a ground voltage via the inverter controlling unit, and a drain coupled to the middle node. The inverter controlling unit may include a third (e.g., PMOS) transistor coupled between the power supply voltage and the first transistor, a fourth (e.g., NMOS) transistor coupled between the ground voltage and the second transistor, a D flip-flop including an output terminal coupled to a gate of the third transistor, an inverted output terminal coupled to a gate of the fourth transistor, a data terminal coupled to the inverted output terminal, and a clock terminal, and a selector configured to selectively output the first hold signal or the first signal to the clock terminal of the D flip-flop in response to an inverted output signal output from the inverted output terminal of the D flip-flop. The capacitor may be coupled between the middle node and the ground voltage. The second inverter may include a fifth (e.g., PMOS) transistor including a gate coupled to the middle node, a source coupled to the power supply voltage, and a drain configured to output the first output signal, and a sixth (e.g., NMOS) transistor including a gate coupled to the middle node, a source coupled to the ground voltage, and a drain configured to output the first output signal.

In some example embodiments, the first time register may include a first inverter configured to invert the first input signal, an inverter controlling unit configured to deactivate the first inverter in response to the first hold signal, and to activate the first inverter in response to the first signal, a capacitor configured to be charged or discharged in response to an output signal of the first inverter, and a comparator configured to generate the first output signal by comparing a voltage of the capacitor with a reference voltage.

In some example embodiments, the first signal may be an awake signal generated by delaying or inverting one of the first input signal, the second input signal, the third input signal and the fourth input signal.

According to example embodiments, a time difference adder included in a system-on-chip (SOC) includes a first register unit and a second register unit. The first register unit is configured to receive first and second input signals having a first time difference, and to generate a first output signal in response to a first signal. The second register unit is configured to receive third and fourth input signals having a second time difference, and to generate a second output signal having a third time difference with respect to the first output signal in response to the first signal. The third time difference corresponds to a sum of the first time difference and the second time difference. The first register unit includes a first offset delay unit configured to generate a first hold signal by delaying the second input signal by an offset time, and a first time register including a first input terminal configured to receive the first input signal, a first hold terminal configured to receive the first hold signal, a first awake terminal configured to receive the first signal, and a first output terminal configured to output the first output signal. The second register unit includes a second offset delay unit configured to generate a second hold signal by delaying the third input signal by the offset time, and a second time register including a second input terminal configured to receive the fourth input signal, a second hold terminal configured to receive the second hold signal, a second awake terminal configured to receive the first signal, and a second output terminal configured to output the second output signal.

According to example embodiments, a time difference adder included in a system-on-chip (SOC) includes a first register unit and a second register unit. The first register unit is configured to receive first and second input signals having a first time difference, and to generate a first output signal in response to a first signal. The second register unit is configured to receive third and fourth input signals having a second time difference, and to generate a second output signal having a third time difference with respect to the first output signal in response to the first signal. The third time difference corresponds to a sum of the first time difference and the second time difference. The first register unit includes a first time register including a first input terminal configured to receive the first input signal, a first hold terminal configured to receive the second input signal, a first awake terminal configured to receive the first signal, and a first output terminal configured to output the first output signal. The second register unit includes a second time register including a second input terminal configured to receive the fourth input signal, a second hold terminal configured to receive the third input signal, a second awake terminal configured to receive the first signal, and a second output terminal configured to output the second output signal.

In some example embodiments, the first time register may output the first output signal that has a rising edge after a first given, desired or predetermined time period after a rising edge of the first signal. The first time period may be equal or substantially equal to a discharge time minus the first time difference. The second time register may output the second output signal that has a rising edge after a second given, desired or predetermined time period after the rising edge of the first signal. The second time period may be equal or substantially equal to the discharge time plus the second time difference.

According to example embodiments, a time difference adder included in a system-on-chip (SOC) includes a first register unit and a second register unit. The first register unit is configured to receive first and second input signals having a first time difference, and to generate a first output signal in response to a first signal. The second register unit is configured to receive third and fourth input signals having a second time difference, and to generate a second output signal having a third time difference with respect to the first output signal in response to the first signal. The third time difference corresponds to a sum of the first time difference and the second time difference. The first register unit includes a first offset delay unit configured to generate a first hold signal by delaying the second input signal by an offset time, and a first time register including a first input terminal receiving the first input signal, a first hold terminal configured to receive the first hold signal, a first precharge terminal configured to receive a second signal, a first awake terminal configured to receive the first signal, and a first output terminal configured to output the first output signal. The second register unit includes a second offset delay unit configured to generate a second hold signal by delaying the third input signal by the offset time, and a second time register including a second input terminal configured to receive the fourth input signal, a second hold terminal configured to receive the second hold signal, a second precharge terminal configured to receive the second signal, a second awake terminal configured to receive the first signal, and a second output terminal configured to output the second output signal.

In some example embodiments, the first time register may include a capacitor coupled between a middle node and a ground voltage, a pull-up transistor coupled between the middle node and a power supply voltage, and configured to charge the capacitor in response to the second signal, a pull-down transistor coupled between the middle node and the ground voltage, a pull-down transistor controlling unit configured to turn on the pull-down transistor in response to the first input signal, to turn off the pull-down transistor in response to the first hold signal, and to turn on the pull-down transistor in response to the first signal, and an output unit configured to generate the first output signal based on a voltage of the capacitor.

In some example embodiments, the pull-down transistor controlling unit may include a set-reset latch including a set terminal receiving the first input signal, a reset terminal receiving the first hold signal, and an output terminal, and an OR gate configured to perform an OR operation on the first signal and an output signal output from the output terminal of the set-reset latch. The OR gate may include an output terminal coupled to a gate of the pull-down transistor.

In some example embodiments, the time difference adder may further include a control unit configured to generate the first signal and the second signal. The control unit may include a first inverter configured to generate an inversion signal of the first input signal by inverting the first input signal, an awake delay unit configured to delay the inversion signal of the first input signal, a first set-reset latch including a set terminal configured to receive the inversion signal of the first input signal, a reset terminal configured to receive an output signal of the awake delay unit, and an output terminal configured to output the first signal, a precharge delay unit configured to delay the output signal of the awake delay unit, a second set-reset latch including a set terminal configured to receive the output signal of the awake delay unit, a reset terminal configured to receive an output signal of the precharge delay unit, and an output terminal, and a second inverter configured to generate the second signal by inverting an output signal of the second set-reset latch.

According to example embodiments, a time difference adder included in a system-on-chip (SOC) includes a first register unit and a second register unit. The first register unit is configured to receive first and second input signals having a first time difference, and to generate a first output signal in response to a first signal. The second register unit is configured to receive third and fourth input signals having a second time difference, and to generate a second output signal having a third time difference with respect to the first output signal in response to the first signal. The third time difference corresponds to a sum of the first time difference and the second time difference. The first register unit includes a first time register including a first input terminal configured to receive the first input signal, a first hold terminal configured to receive the second input signal, a first precharge terminal configured to receive a second signal, a first awake tee aminal configured to receive the first signal, and a first output terminal configured to output the first output signal. The second register unit includes a second time register including a second input terminal configured to receive the fourth input signal, a second hold terminal configured to receive the third input signal, a second precharge terminal configured to receive the second signal, a second awake terminal configured to receive the first signal, and a second output terminal configured to output the second output signal.

According to example embodiments, a time difference accumulator included in a system-on-chip (SOC) includes a first time difference adder and a second time difference adder. The first time difference adder is configured to receive first and second input signals having a first time difference, and to add the first time difference and a second time difference between first and second previous output signals to generate first and second output signals having a third time difference corresponding to a sum of the first time difference and the second time difference. The second time difference adder is configured to receive the first and second output signals having the third time difference, and to add the third time difference and a time difference between the same two signals to generate the first and second previous output signals having the third time difference.

In some example embodiments, the same two signals may be one of the first output signal, the second output signal, an inversion signal of the first output signal and an inversion signal of the second output signal.

According to example embodiments, a time difference accumulator included in a system-on-chip (SOC) includes a time difference adder, a first delay circuit and a second delay circuit. The time difference adder is configured to receive first and second input signals having a first time difference, and to add the first time difference and a second time difference between first and second previous output signals to generate first and second output signals having a third time difference corresponding to a sum of the first time difference and the second time difference. The first delay circuit is configured to generate the first previous output signal by delaying the first output signal by a given, desired or predetermined time. The second delay circuit is configured to generates the second previous output signal by delaying the second output signal by the given, desired or predetermined time.

According to example embodiments, a sigma-delta time-to-digital converter includes a time difference adder, a time difference accumulator, a time domain quantizer and a digital-to-time converter. The time difference adder is configured to receive first and second input signals having a first time difference, and to subtract a second time difference between first and second feedback signals from the first time difference to generate first and second addition signals having a third time difference corresponding to the first time difference minus the second time difference. The time difference accumulator is configured to accumulate the third time difference between the first and second addition signals to generate first and second accumulation signals. The time domain quantizer is configured to convert a time difference between the first and second accumulation signals into a digital output signal. The digital-to-time converter is configured to convert the digital output signal into the first and second feedback signals.

According to example embodiments, a sigma-delta time-to-digital converter includes a time difference adjusting unit, a time difference accumulator and a time domain quantizer. The time difference adjusting unit is configured to receive a first input signal, a second input signal and a digital output signal, and to delay at least one of the first input signal and the second input signal by a delay time determined according to the digital output signal to generate first and second addition signals. The time difference accumulator is configured to accumulate a time difference between the first and second addition signals to generate first and second accumulation signals. The time domain quantizer is configured to convert a time difference between the first and second accumulation signals into the digital output signal.

In some example embodiments, the time difference adjusting unit may include at least one first delay unit configured to delay the first input signal, a first selector configured to selectively output the first input signal or an output signal of the first delay unit as the first addition signal in response to the digital output signal, at least one second delay unit configured to delay the second input signal, and a second selector configured to selectively output the second input signal or an output signal of the second delay unit as the second addition signal in response to the digital output signal.

According to example embodiments, a digital phase locked loop includes a phase detector, a digital loop filter, a digitally controlled oscillator and a divider. The phase detector is configured to generate a digital time difference signal corresponding to a first time difference between a reference input signal and a feedback signal. The digital loop filter is configured to generate a digital control signal by filtering the digital time difference signal. The digitally controlled oscillator is configured to generate an output signal in response to the digital control signal. The divider is configured to generate the feedback signal by dividing the output signal. The phase detector includes a time difference adder configured to receive the reference input signal and the feedback signal having the first time difference, and to subtract a second time difference between first and second internal feedback signals from the first time difference to generate first and second addition signals having a third time difference corresponding to the first time difference minus the second time difference, a time difference accumulator configured to accumulate the third time difference between the first and second addition signals to generate first and second accumulation signals, a time domain quantizer configured to convert a time difference between the first and second accumulation signals into the digital time difference signal, and a digital-to-time converter configured to convert the digital time difference signal into the first and second internal feedback signals.

According to example embodiments, a digital phase locked loop includes a phase detector, a digital loop filter, a digitally controlled oscillator and a divider. The phase detector is configured to generate a digital time difference signal corresponding to a time difference between a reference input signal and a feedback signal. The digital loop filter is configured to generate a digital control signal by filtering the digital time difference signal. The digitally controlled oscillator is configured to generate an output signal in response to the digital control signal. The divider is configured to generate the feedback signal by dividing the output signal. The phase detector includes a time difference adjusting unit configured to receive the reference input signal, the feedback signal and the digital time difference signal, and to delay at least one of the reference input signal and the feedback signal by a delay time determined according to the digital time difference signal to generate first and second addition signals, a time difference accumulator configured to accumulate a time difference between the first and second addition signals to generate first and second accumulation signals, and a time domain quantizer configured to convert a time difference between the first and second accumulation signals into the digital time difference signal.

According to example embodiments, a temperature sensor includes a sensing unit and a sigma-delta time-to-digital converter. The sensing unit is configured to sense a temperature to generate first and second input signals having a first time difference corresponding to the sensed temperature. The sigma-delta time-to-digital converter is configured to generate a digital output signal corresponding to the first time difference between the first and second input signals. The sigma-delta time-to-digital converter includes a time difference adder configured to receive the first and second input signals having the first time difference, and to subtract a second time difference between first and second feedback signals from the first time difference to generate first and second addition signals having a third time difference corresponding to the first time difference minus the second time difference, a time difference accumulator configured to accumulate the third time difference between the first and second addition signals to generate first and second accumulation signals, a time domain quantizer configured to convert a time difference between the first and second accumulation signals into the digital output signal, and a digital-to-time converter configured to convert the digital output signal into the first and second feedback signals.

In some example embodiments, the sensing unit may include a pulse generator configured to generate a pulse, a temperature insensitive delay line configured to delay the pulse by a first delay time that is constant or substantially constant regardless of the temperature to output a first delayed pulse as the first input signal, and a temperature sensitive delay line configured to delay the pulse by a second delay time that is adjusted according to the temperature to output a second delayed pulse as the second input signal.

According to example embodiments, a temperature sensor includes a sensing unit and a sigma-delta time-to-digital converter. The sensing unit is configured to sense a temperature to generate first and second input signals having a time difference corresponding to the sensed temperature. The sigma-delta time-to-digital converter is configured to generate a digital output signal corresponding to the time difference between the first and second input signals. The sigma-delta time-to-digital converter includes a time difference adjusting unit configured to receive the first input signal, the second input signal and the digital output signal, and to delay at least one of the first input signal and the second input signal by a delay time determined according to the digital output signal to generate first and second addition signals, a time difference accumulator configured to accumulate a time difference between the first and second addition signals to generate first and second accumulation signals, and a time domain quantizer configured to convert a time difference between the first and second accumulation signals into the digital output signal.

At least one other example embodiment provides a system on chip including a time difference adder. The time difference adder is configured to generate at least a first and a second output signal based on a plurality of input signals, the first output signal transitioning from a first level to a second level at a first transition time, and the second output signal transitioning from the first level to the second level at a second transition time, the first and second transition times being different. The first output signal is generated based on a first pair of the plurality of input signals and in response to a trigger signal, the first pair of the plurality of signals having a first time difference; the second output signal is generated based on a second pair of the plurality of input signals and in response to the trigger signal, the second pair of the plurality of input signals having a second time difference; and the difference between the first and second transition times is determined based on the first time difference and the second time difference.

According to at least some example embodiments, the time difference adder may include: a first register unit configured to generate the first output signal based on the first pair of the plurality of input signals and in response to the trigger signal; and a second register unit configured to generate the second output signal based on the second pair of the plurality of input signals and in response to the trigger signal.

The first pair of the plurality of input signals may include a first input signal and a second input signal. The first register unit may include: a first offset delay unit configured to generate a first hold signal by delaying the second input signal by an offset time; and a first time register including a first input terminal configured to receive the first input signal, a first hold terminal configured to receive the first hold signal, a first awake terminal configured to receive the trigger signal, and a first output terminal configured to output the first output signal.

The second pair of the plurality of input signals may include a third input signal and a fourth input signal. The second register unit may include: a second offset delay unit configured to generate a second hold signal by delaying the third input signal by the offset time; and a second time register including a second input terminal configured to receive the fourth input signal, a second hold terminal configured to receive the second hold signal, a second awake terminal configured to receive the trigger signal, and a second output terminal configured to output the second output signal.

The first pair of the plurality of input signals may include a first input signal and a second input signal. The first register unit may include: a first time register including a first input terminal configured to receive the first input signal, a first hold terminal configured to receive the second input signal, a first awake terminal configured to receive the trigger signal, and a first output terminal configured to output the first output signal.

The second pair of the plurality of input signals may include a third input signal and a fourth input signal. The second register unit may include: a second time register including a second input terminal receiving the fourth input signal, a second hold terminal receiving the third input signal, a second awake terminal receiving the first signal, and a second output terminal outputting the second output signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
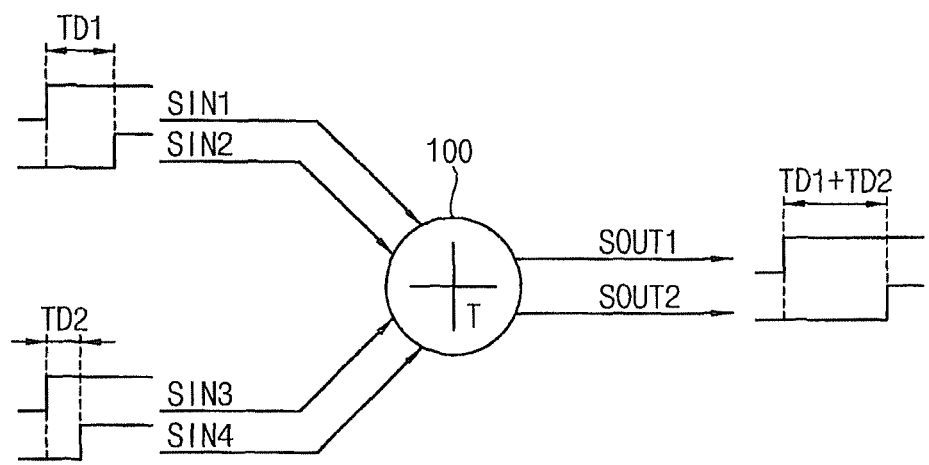
FIG. 1 is a diagram illustrating a time difference adder according to example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
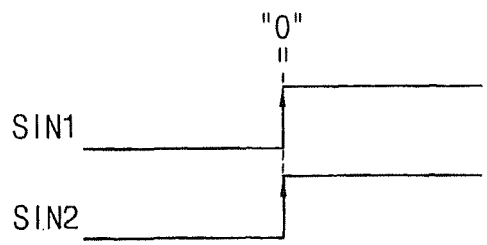
FIGS. 2A and 2B are diagrams illustrating an identity element and an inverse element of time difference addition performed by the time difference adder of FIG. 1.
Figure 2B:
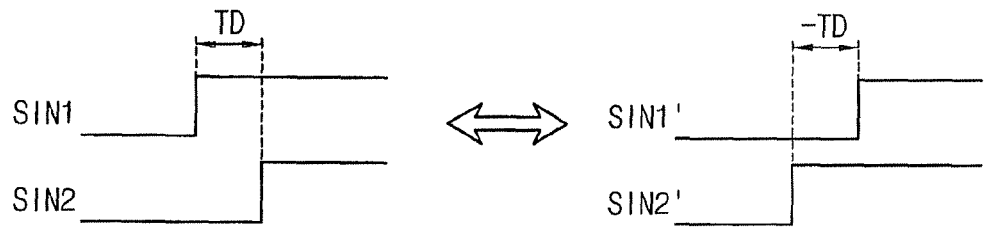

FIG. 1 is a diagram illustrating a time difference adder according to example embodiments, and FIGS. 2A and 2B are diagrams illustrating an identity element and an inverse element of time difference addition performed by a time difference adder of FIG. 1.

Referring to FIG. 1, a time difference adder 100 generates a first output signal SOUT1 and a second output signal SOUT2 in response to a first input signal SIN1, a second input signal SIN2, a third input signal SIN3 and a fourth input signal SIN4. The time difference adder 100 may add a first time difference TD1 between the first input signal SIN1 and the second input signal SIN2 and a second time difference TD2 between the third input signal SIN3 and the fourth input signal SIN4, so that the time difference adder 100 may output the first output signal SOUT1 and the second output signal SOUT2 having a time difference TD1+TD2 corresponding to a sum of the first time difference TD1 and the second time difference TD2.

As illustrated in FIGS. 2A and 2B, an identity element and an inverse element of time difference addition (for which an operator "+" may be used) performed by the time difference adder 100 may be defined with respect to an arbitrary time difference TD. That is, for example, the identity element "0" of the time difference addition satisfies following equation 1 with respect to the arbitrary time difference TD.

$$TD+0=0+TD=TD \qquad \text{[equation 1]}$$

Further, with respect to the time difference addition, the inverse element −TD of the arbitrary time difference TD satisfies following equation 2.

$$TD30\ (-TD)=(-TD)+TD=0 \qquad \text{[equation 2]}$$

Thus, the time difference adder 100 according to at least some example embodiments may perform the time difference addition on the arbitrary time difference TD, which is closed with respect to the time difference addition.

As a design rule (DR) for a semiconductor device decreases, a power supply voltage and/or an operating voltage of the semiconductor device decreases. Accordingly, a signal-to-noise ratio (SNR) decreases in a voltage domain. However, as the power supply voltage and/or the operating voltage decreases, a transition time of a voltage signal from a low level to a high level or from a high level to a low level may be reduced. Accordingly, an SNR may increase in a time domain. Thus, under a relatively low power supply voltage environment, electronic circuits and devices may improve the performance by processing signals in the time domain. That is, for example, under a relatively low power supply voltage environment, the performance of various electronic circuits and devices including the time difference adder 100 and/or the time difference accumulator may be improved because the time difference adder 100 and/or a time difference accumulator according to example embodiments may process signals in the time domain. The time difference adder 100 and/or the time difference accumulator according to example embodiments may be included in a system-on-chip (SOC).

Figure 3:
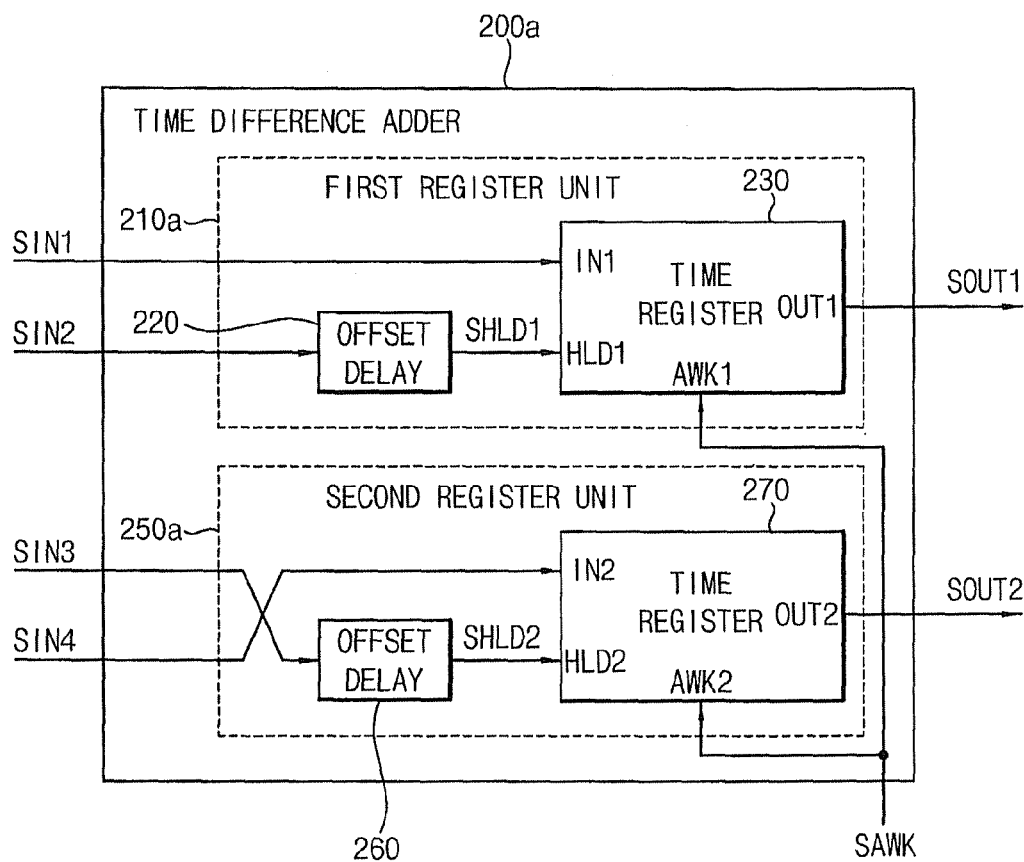
FIG. 3 is a block diagram illustrating a time difference adder according to example embodiments.

FIG. 3 is a block diagram illustrating a time difference adder according to example embodiments.

Referring to FIG. 3, a time difference adder 200*a* includes a first register unit 210*a* and a second register unit 250*a*.

The first register unit 210*a* may receive a first input signal SIN1 and a second input signal SIN2, and may generate a first output signal SOUT1 in response to an awake signal SAWK. The first register unit 210*a* may include a first offset delay unit 220 and a first time register 230. The first offset delay unit 220 may generate a first hold signal SHLD1 by delaying the second input signal SIN2 by an offset time. The first time register 230 may include a first input terminal IN1 receiving the first input signal SIN1, a first hold terminal HLD1 receiving the first hold signal SHLD1, a first awake terminal AWK1 receiving the awake signal SAWK, and a first output terminal OUT1 outputting the first output signal SOUT1.

The second register unit 250*a* may receive a third input signal SIN3 and a fourth input signal SIN4, and may generate a second output signal SOUT2 in response to the awake signal SAWK. The second register unit 250*a* may include a second offset delay unit 260 and a second time register 270. The second offset delay unit 260 may generate a second hold signal SHLD2 by delaying the third input signal SIN3 by the offset time. The second time register 270 may include a second input terminal IN2 receiving the fourth input signal SIN2, a second hold terminal HLD2 receiving the second hold signal SHLD2, a second awake terminal AWK2 receiving the awake signal SAWK, and a second output terminal OUT2 outputting the second output signal SOUT2.

In some example embodiments, the awake signal SAWK may be received from an external circuit or an external device. In other example embodiments, the time difference adder 200*a* may further include a circuit that generates the awake signal SAWK. For example, the circuit included in the time difference adder 200*a* may generate the awake signal SAWK by delaying or inverting one of the first input signal SIN1, the second input signal SIN2, the third input signal SIN3 and the fourth input signals SIN4.

In response to the awake signal SAWK, the first time register 230 may output the first output signal SOUT1 that has a rising edge after a first given, desired or predetermined time period from a rising edge of the awake signal SAWK. The first time period may be equal to a discharge time minus the offset time minus a first time difference between the first input signal SIN1 and the second input signal SIN2. That is, for example, a time difference between the awake signal SAWK and the first output signal SOUT1, or the first time period may be obtained by subtracting the offset time from the discharge time and by further subtracting the first time difference from a result of the subtraction.

In response to the awake signal SAWK, the second time register 270 may output the second output signal SOUT2 that has a rising edge after a second given, desired or predetermined time period from the rising edge of the awake signal SAWK. The second time period may be equal to the discharge time minus the offset time plus a second time difference between the third input signal SIN3 and the fourth input signal SIN4. That is, a time difference between the awake signal SAWK and the second output signal SOUT2, or the second predetermined time may be obtained by subtracting the offset time from the discharge time and by adding the second time difference to a result of the subtraction.

The offset time of the first offset delay unit 220 may be the same or substantially the same as the offset time of the second offset delay unit 260. The offset time may be set corresponding to a range of time differences that are input to the time difference adder 200*a*. For example, the offset time may be set longer than the maximum absolute value of a negative time difference that is input to the time difference adder 200*a*.

The discharge time of the first time register 230 may be the same or substantially the same as the discharge time of the second time register 270. The discharge time may be determined according to a capacitance of a capacitor included in each time register 230 and 270, and the capacitance of the capacitor included in the first time register 230 may be the same or substantially the same as the capacitance of the capacitor included in the second time register 270. The discharge time may be set corresponding to the offset time and the range of time differences that are input to the time difference adder 200*a*. For example, the discharge time may be set longer than a sum of the offset time and the maximum absolute value of a positive time difference that is input to the time difference adder 200*a*. Further, the discharge time may be set shorter than a pulse width of one of the first through fourth input signals SIN1, SIN2, SIN3 and SIN4.

A time difference between the first output signal SOUT1 and the second output signal SOUT2, which may be a time interval from when the first output signal SOUT1 has a rising edge to when the second output signal SOUT2 has a rising edge, may be equal or substantially equal to the time difference between the awake signal SAWK and the second output signal SOUT2 minus the time difference between the awake signal SAWK and the first output signal SOUT1. Since the first offset delay unit 220 and the second offset delay unit 260 have the same or substantially the same offset time, and the first time register 230 and the second time register 270 have the same or substantially the same discharge time, the time difference between the first and second output signals SOUT1 and SOUT2 may correspond to the sum of the first time difference between the first and second input signals SIN1 and SIN2 and the second time difference between the third and fourth input signals SIN3 and SIN4.

As described above, the time difference adder 200*a* according to example embodiments may output the first and second output signals SOUT1 and SOUT2 having the time difference corresponding to the sum of the first time difference and the second time difference.

In some example embodiments, at least a portion of components (e.g., transistors) included in the first register unit 210*a* and at least a portion of components (e.g., transistors) included in the second register unit 250*a* may be alternately arranged. Accordingly, a mismatch between the first register unit 210*a* and the second register unit 250*a* caused by a process, voltage and temperature (PVT) variation may be reduced.

Figure 4:
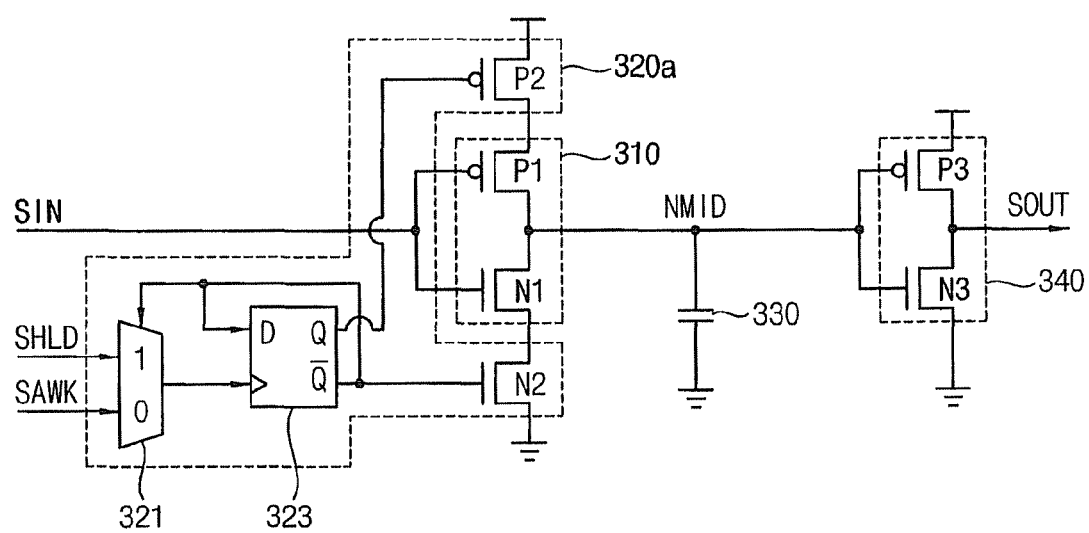
FIG. 4 is a circuit diagram illustrating an example of a time register included in the time difference adder of FIG. 3.

FIG. 4 is a circuit diagram illustrating an example of a time register included in a time difference adder of FIG. 3.

Referring to FIG. 4, a time register 300*a* includes a first inverter 310, an inverter controlling unit 320*a*, a capacitor 330 and an output unit 340. Each of a first time register 230 and a second time register 270 illustrated in FIG. 3 may be implemented as the time register 300a of FIG. 4. For example, if the time register 300a is the first time register 230 of FIG. 3, an input signal SIN of FIG. 4 may correspond to a first input signal SIN1 of FIG. 3, a hold signal SHLD of FIG. 4 may correspond to a first hold signal SHLD1 of FIG. 3, and an output signal SOUT of FIG. 4 may correspond to a first output signal SOUT1 of FIG. 3. Further, if the time register 300a is the second time register 270 of FIG. 3, the input signal SIN of FIG. 4 may correspond to a second input signal SIN2 of FIG. 3, the hold signal SHLD of FIG. 4 may correspond to a second hold signal SHLD2 of FIG. 3, and the output signal SOUT of FIG. 4 may correspond to a second output signal SOUT2 of FIG. 3.

The first inverter 310 may invert the input signal SIN. The first inverter 310 may include a first PMOS transistor P1 and a first NMOS transistor N1. The first PMOS transistor P1 may include a gate receiving the input signal SIN, a source coupled to a power supply voltage via the inverter controlling unit 320a, and a drain coupled to a middle node NMID. The first NMOS transistor N1 may include a gate receiving the input signal SIN, a source coupled to a ground voltage via the inverter controlling unit 320a, and a drain coupled to the middle node NMID.

The inverter controlling unit 320a may deactivate the first inverter 310 in response to the hold signal SHLD, and may activate the first inverter 310 in response to an awake signal SAWK. The inverter controlling unit 320a may include a second PMOS transistor P2, a second NMOS transistor N2, a D flip-flop 323 and a selector 321.

The second PMOS transistor P2 may be coupled between the power supply voltage and the first PMOS transistor P1. For example, the second PMOS transistor P2 may include a gate coupled to an output terminal Q of the D flip-flop 323, a source coupled to the power supply voltage, and a drain coupled to the source of the first PMOS transistor P1. The second NMOS transistor N2 may be coupled between the ground voltage and the first NMOS transistor N1. For example, the second NMOS transistor N2 may include a gate coupled to an inverted output terminal /Q of the D flip-flop 323, a source coupled to the ground voltage, and a drain coupled to the source of the first NMOS transistor N1. The second PMOS transistor P2 and the second NMOS transistor N2 may selectively couple the first inverter 310 to the power supply voltage and the ground voltage. For example, while the second PMOS transistor P2 and the second NMOS transistor N2 are turned on, the first inverter 310 may be electrically coupled to the power supply voltage and the ground voltage. While the second PMOS transistor P2 and the second NMOS transistor N2 are turned off, the first inverter 310 may be electrically decoupled from the power supply voltage and the ground voltage.

The D flip-flop 323 may include the output terminal Q coupled to the gate of the second PMOS transistor P2, the inverted output terminal /Q coupled to the gate of the second NMOS transistor N2, a data terminal D coupled to the inverted output terminal /Q, and a clock terminal receiving an output signal of the selector 321. Since the data terminal D is coupled to the inverted output terminal /Q, an output signal output from the output terminal Q and an inverted output signal output from the inverted output terminal /Q may toggle from high to low or from low to high each time the output signal of the selector 321 applied to the clock terminal has a rising edge.

The selector 321 may selectively output the hold signal SHLD or the awake signal SAWK to the clock terminal in response to the inverted output signal output from the inverted output terminal /Q. For example, the selector 321 may be implemented by a multiplexer 321. The multiplexer 321 may include a first input terminal receiving the hold signal SHLD, a second input terminal receiving the awake signal SAWK, a select terminal receiving the inverted output signal as a selection signal, and an output terminal selectively outputting the hold signal SHLD or the awake signal SAWK in response to the selection signal.

The capacitor 330 may be charged or discharged in response to an output signal of the first inverter 310. The capacitor 330 may include a first electrode coupled to the middle node and a second electrode coupled to the ground voltage. For example, when the output signal of the first inverter 310 has a logic high level, or when the first PMOS transistor P1 and the second PMOS transistor P2 are turned on, the first electrode of the capacitor 330 may be electrically coupled to the power supply voltage through the first and second PMOS transistors P1 and P2, and thus the capacitor 330 may be charged. When the output signal of the first inverter 310 has a logic low level, or when the first NMOS transistor N1 and the second NMOS transistor N2 are turned on, the first electrode of the capacitor 330 may be electrically coupled to the ground voltage through the first and second NMOS transistors N1 and N2, and thus the capacitor 330 may be discharged.

The output unit 340 may generate the output signal SOUT based on a voltage of the capacitor 330 (e.g., a voltage of the middle node NMID). For example, the output unit 340 may include a second inverter 340. The second inverter 340 may include a third PMOS transistor P3 and a third NMOS transistor N3. For example, the third PMOS transistor P3 may include a gate coupled to the middle node NMID, a source coupled to the power supply voltage, and a drain outputting the output signal SOUT. The third NMOS transistor N3 may include a gate coupled to the middle node NMID, a source coupled to the ground voltage, and a drain outputting the output signal SOUT. The second inverter 340 may output the output signal SOUT having a logic high level when the voltage of the capacitor 330 is lower than a predetermined threshold voltage. For example, when the voltage of the capacitor 330 is lower than a threshold voltage of the third PMOS transistor P3, the third PMOS transistor P3 may be turned on, and thus the second inverter 340 may output the output signal SOUT having the logic high level.

The capacitor 330 may be discharged during a time difference between the input signal SIN and the hold signal SHLD to store information about the time difference between the input signal SIN and the hold signal SHLD. For example, the discharging of the capacitor 330 may be started in response to a rising edge of the input signal SIN, and may be stopped in response to a rising edge of the hold signal SHLD, so that the capacitor 330 may be discharged during the time difference between the input signal SIN and the hold signal SHLD. Further, the discharging of the capacitor 330 may be restarted in response to a rising edge of the awake signal SAWK. Accordingly, the voltage of the capacitor 330 may become lower than the given, desired or predetermined threshold voltage (e.g., the threshold voltage of the third PMOS transistor P3) after a given, desired or predetermined time period from the rising edge of the awake signal SAWK, and the time period may be determined according to the time difference between the input signal SIN and the hold signal SHLD. For example, if the time difference increases, the time period may decrease, and, if the time difference decreases, the time period may increase. The output unit 340 may output the output signal SOUT having the logic high level when the voltage of the capacitor 330 becomes lower than the threshold voltage. Accordingly, the output signal SOUT may have a rising edge after the time period determined according to the time difference from the rising edge of the awake signal SAWK. Thus, a time point when the output signal SOUT has the rising edge may be determined according to the time difference between the input signal SIN and the hold signal SHLD.

For example, to start the discharging of the capacitor 330, the first inverter 310 may electrically couple the capacitor 330 to the ground voltage in response to the rising edge of the input signal SIN. To stop the discharging of the capacitor 330, the inverter controlling unit 320a may deactivate the first inverter 310 in response to the rising edge of the hold signal SHLD. To restart the discharging of the capacitor 330, the inverter controlling unit 320a may activate the first inverter 310 in response to the rising edge of the awake signal SAWK. After the discharging of the capacitor 330 is restarted, the output unit 340 may output the output signal SOUT having the logic high level when the voltage of the capacitor 330, or the voltage of the middle node NMID becomes lower than the threshold voltage.

Accordingly, in response to the awake signal SAWK, the time register 300a may output the output signal SOUT having a rising edge at a time point determined according to the time difference between the input signal SIN and the hold signal SHLD.

Figure 5:
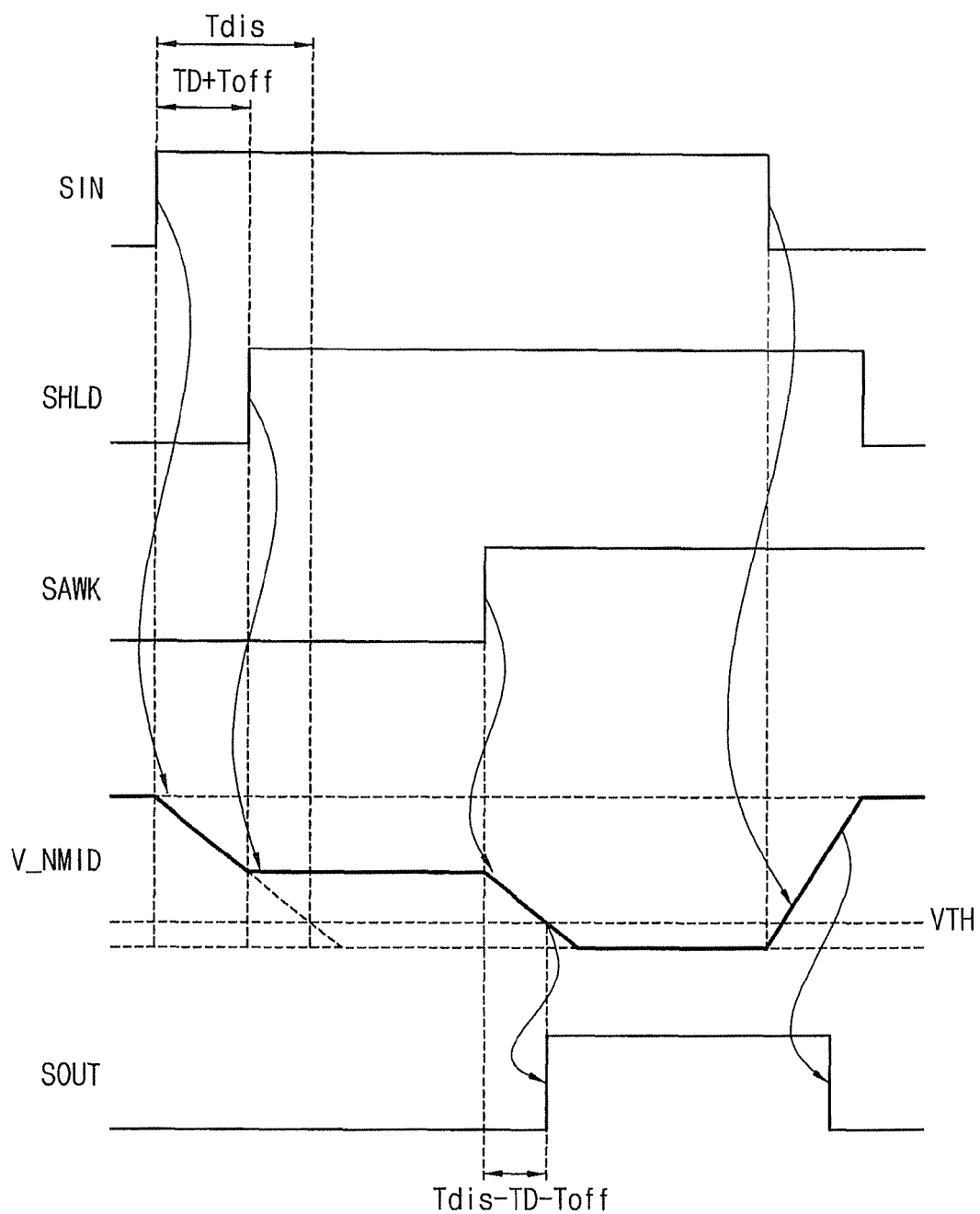
FIG. 5 is a timing diagram for describing example operation of the time register of FIG. 4.

FIG. 5 is a timing diagram for describing an operation of a time register of FIG. 4.

Referring to FIGS. 4 and 5, a first inverter 310 may output an output signal having a logic low level in response to a rising edge of an input signal SIN. When the input signal SIN has the rising edge, a D flip-flop 323 may output an output signal having a logic low level at an output terminal Q, and may output an inverted output signal having a logic high level at an inverted output terminal /Q. Accordingly, a first NMOS transistor N1 may be turned on in response to the rising edge of the input signal SIN, and a second NMOS transistor N2 may be turned on in response to the inverted output signal having the logic low level, and a second NMOS transistor N2 may be turned on in response to the inverted output signal having the logic high level. If the first and second NMOS transistors N1 and N2 are turned on, a middle node NMID, or a first electrode of a capacitor 330 may be coupled to a ground voltage through the first and second NMOS transistors N1 and N2, and thus the capacitor 330 may be discharged. As described above, the capacitor 330 may be discharged in response to the rising edge of the input signal SIN, and the voltage of the capacitor 330, or the voltage V_NMID of the middle node NMID may decrease.

An inverter controlling unit 320a may deactivate the first inverter 310 in response to a rising edge of a hold signal SHLD. For example, a selector 321 may output the hold signal SHLD to a clock terminal of the D flip-flop 323 in response to the inverted output signal having the logic high level output from the inverted output terminal /Q of the D flip-flop 323. In response to the rising edge of the hold signal SHLD from the selector 321, the D flip-flop 323 may output the output signal having a logic high level at the output terminal Q, and may output the inverted output signal having a logic low level at the inverted output terminal /Q. Accordingly, a second PMOS transistor P2 may be turned off in response to the output signal having the logic high level, and the second NMOS transistor N2 may be turned off in response to the inverted output signal having the logic low level. If the second NMOS transistor N2 is turned off, then the discharging of the capacitor 330 may be stopped. As described above, the discharging of the capacitor 330 may be stopped in response to the rising edge of the hold signal SHLD, and the decrease of the voltage of the capacitor 330, or the decrease of the voltage V_NMID of the middle node NMID may be stopped.

The inverter controlling unit 320a may activate the first inverter 310 in response to a rising edge of an awake signal SAWK. For example, the selector 321 may output the awake signal SAWK to the clock terminal of the D flip-flop 323 in response to the inverted output signal having the logic low level output from the inverted output terminal /Q of the D flip-flop 323. In response to the rising edge of the awake signal SAWK from the selector 321, the D flip-flop 323 may output the output signal having a logic low level at the output terminal Q, and may output the inverted output signal having a logic high level at the inverted output terminal /Q. Accordingly, the second PMOS transistor P2 may be turned on in response to the output signal having the logic low level, and the second NMOS transistor N2 may be turned on in response to the inverted output signal having the logic high level. Further, the first NMOS transistor N1 may be turned on in response to the input signal SIN having a logic high level. If the first and second NMOS transistors N1 and N2 are turned on, the middle node NMID may be coupled to the ground voltage through the first and second NMOS transistors N1 and N2, and thus the discharging of the capacitor 330 may be restarted. As described above, the discharging of the capacitor 330 may be restarted in response to the rising edge of the awake signal SAWK, and the voltage of the capacitor 330, or the voltage V_NMID of the middle node NMID may decrease again.

The output unit 340 may output an output signal SOUT based on the voltage of the capacitor 330, or the voltage V_NMID of the middle node NMID. The output unit 340 may output the output signal SOUT having a logic high level when the voltage V_NMID of the middle node NMID becomes lower than a given, desired or predetermined threshold voltage VTH. For example, the given, desired or predetermined threshold voltage VTH may be a threshold voltage of a third PMOS transistor P3. Thus, if the voltage V_NMID of the middle node NMID becomes lower than the threshold voltage of the third PMOS transistor P3, the third PMOS transistor P3 may be turned on, and the output signal SOUT may have the logic high level.

The output signal SOUT may have a rising edge after a given, desired or predetermined time Tdis−TD−Toff from the rising edge of the awake signal SAWK. The given, desired or predetermined time Tdis−TD−Toff may be equal to a discharge time Tdis minus a time difference TD+Toff between the input signal SIN and the hold signal SHLD. For example, in a case where the input signal SIN is the first input signal SIN1 of FIG. 3, and the hold signal SHLD is the first hold signal SHLD1 output from a first offset delay unit 220 of FIG. 3, the time difference TD+Toff between the input signal SIN and the hold signal SHLD may correspond to a sum of a time difference TD between the first input signal SIN1 and a second input signal SIN2 and an offset time Toff of the first offset delay unit 220. In this case, the output signal SOUT may have the rising edge after the given, desired or predetermined time Tdis−TD−Toff from the rising edge of the awake signal SAWK, and the given, desired or predetermined time Tdis−TD−Toff may be obtained by subtracting the sum of time difference TD between the first and second input signals SIN1 and SIN2 and the offset time Toff of the first offset delay unit 220 from the discharge time Tdis.

The discharge time Tdis may be a time period for the voltage of the capacitor 330 to decrease from a high level to the given, desired or predetermined threshold voltage VTH while the first electrode of the capacitor 330 is electrically coupled to the ground voltage, and may be determined according to current driving capabilities of the first and second NMOS transistors N1 and N2 and a capacitance of the capacitor 330. Thus, if the current driving capabilities of the first and second NMOS transistors N1 and N2 are fixed, the discharge time Tdis may be determined according to the capacitance of the capacitor 330. A capacitor included in the first time register 230 of FIG. 3 and a capacitor included in the second time register 270 of FIG. 3 may have the same or substantially the same capacitance, and thus the first time register 230 and the second time register 270 may have the same or substantially the same discharge time Tdis. Further, the first offset delay unit 220 and the second offset delay unit 260 of FIG. 3 may have the same or substantially the same offset time Toff.

Figure 9A:
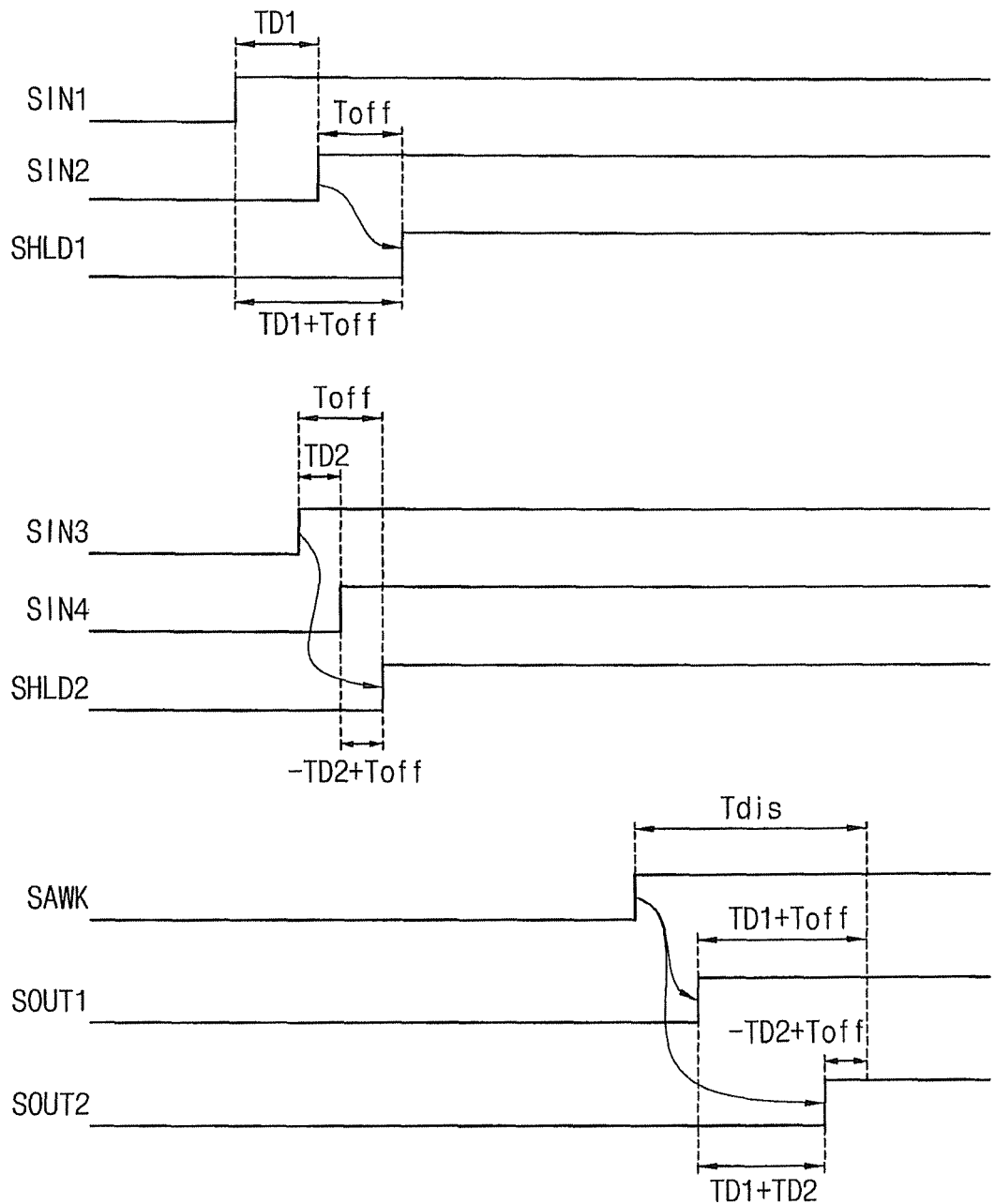
FIG. 9A is a timing diagram for describing an example operation of the time difference adder of FIG. 3.
Figure 9B:
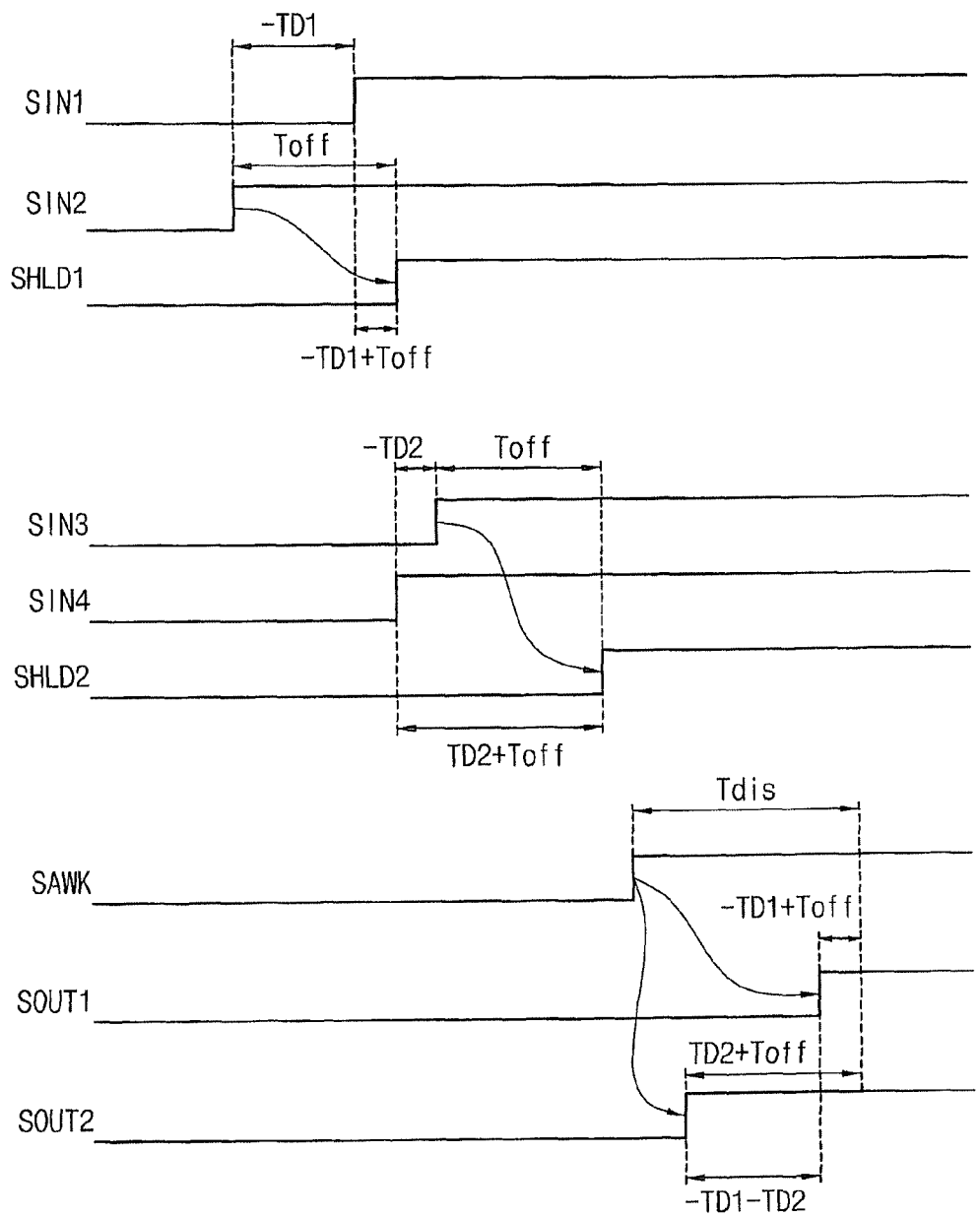
FIG. 9B is a timing diagram for describing another example operation of the time difference adder of FIG. 3.

Accordingly, a time difference between a first output signal SOUT1 and a second output signal SOUT2 of FIG. 3 (e.g., a time difference between a time point when the first output signal SOUT1 has a rising edge and a time point when the second output signal SOUT2 has a rising edge) may be determined according to a first time difference between a first input signal SIN1 and a second input signal SIN2 and a second time difference between a third input signal SIN3 and a fourth input signal SIN4, which will be described below with reference to FIGS. 9A and 9B.

After the output unit 340 outputs the output signal SOUT having the logic high level, the first inverter 310 may output an output signal having a logic low level in response to a falling edge of the input signal SIN. For example, a first PMOS transistor P1 may be turned on in response to the falling edge of the input signal SIN, and the second PMOS transistor P2 may be turned on in response to the inverted output signal having a logic low level. If the first and second PMOS transistors P1 and P2 are turned on, the middle node NMID, or the first electrode of the capacitor 330 may be coupled to a power supply voltage through the first and second PMOS transistors P1 and P2, and the capacitor 330 may be charged. In other example embodiments, the awake signal SAWK may be an inversion signal of the input signal SIN, and logical gates may be located between the input signal SIN and the first inverter 310 to apply a signal having a logic high level to the first inverter 310 during a given, desired or predetermined time period even if the input signal SIN has the falling edge. In this case, the first inverter 310 may charge the capacitor 330 in response to an output signal of the logic gates.

Figure 6:
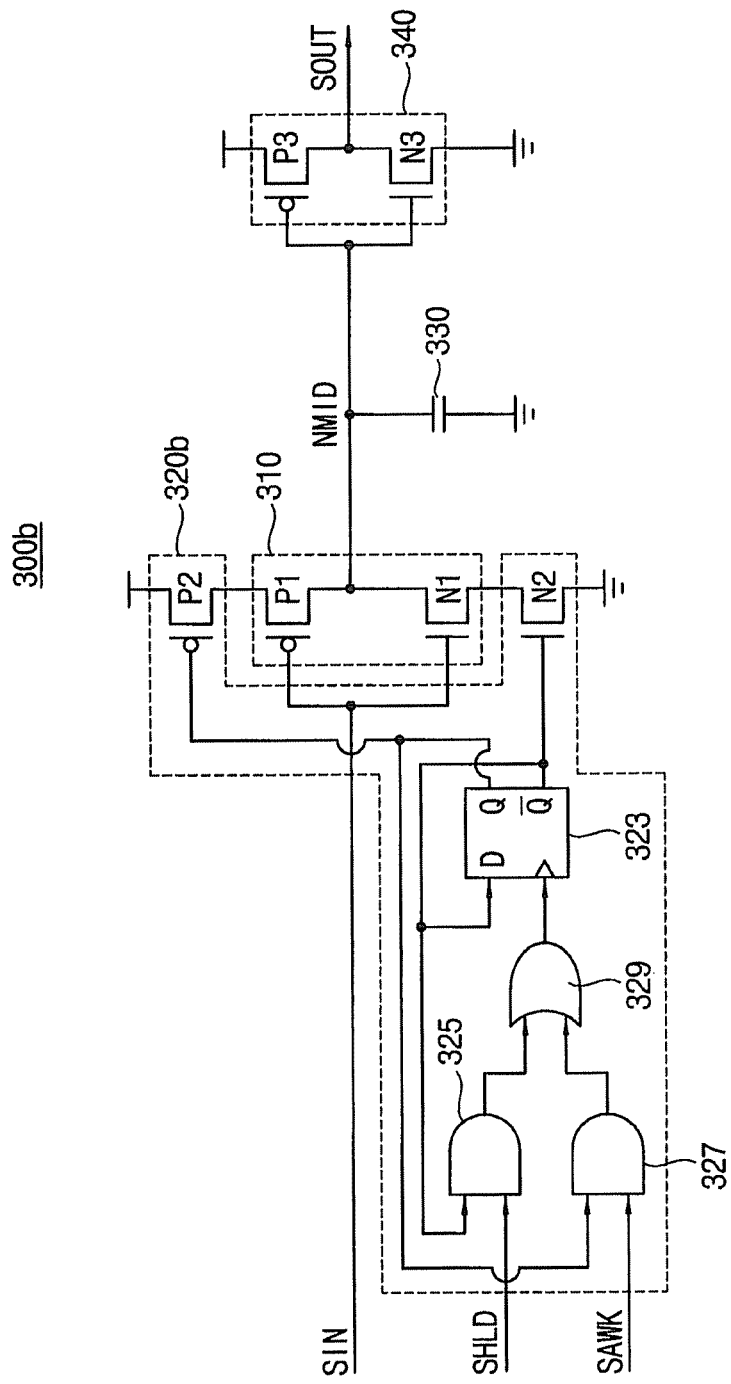
FIG. 6 is a circuit diagram illustrating another example embodiment of a time register included in a time difference adder of FIG. 3.

FIG. 6 is a circuit diagram illustrating another example of a time register included in a time difference adder of FIG. 3.

Referring to FIG. 6, a time register 300b includes a first inverter 310, an inverter controlling unit 320b, a capacitor 330 and an output unit 340. The time register 300b of FIG. 6 may have a similar or substantially similar configuration and may perform a similar or substantially similar operation to a time register 300a of FIG. 4, except for a configuration and an operation of a selector 325, 327 and 329 included in the inverter controlling unit 320b.

The inverter controlling unit 320b may deactivate the first inverter 310 in response to a hold signal SHLD, and may activate the first inverter 310 in response to an awake signal SAWK. The inverter controlling unit 320b may include a second PMOS transistor P2, a second NMOS transistor N2, a D flip-flop 323 and the selector 325, 327 and 329.

The selector 325, 327 and 329 may be implemented by logic gates 325, 327 and 329. For example, the selector 325, 327 and 329 may include a first AND gate 325, a second AND gate 327 and an OR gate 329. The first AND gate 325 may perform an AND operation on the hold signal SHLD and an inverted output signal output from an inverted output terminal /Q of the D flip-flop 323. The second AND gate 327 may perform an AND operation on the awake signal SAWK and an output signal output from an output terminal Q of the D flip-flop 323. The OR gate 329 may perform an OR operation on an output signal of the first AND gate 325 and an output signal of the second AND gate 327. When the inverted output signal output from the inverted output terminal /Q has a logic high level, and the output signal output from the output terminal Q has a logic low level, the logic gates 325, 327 and 329 may output the hold signal SHLD. When the inverted output signal output from the inverted output terminal /Q has a logic low level, and the output signal output from the output terminal Q has a logic high level, the logic gates 325, 327 and 329 may output the awake signal SAWK.

Figure 7:
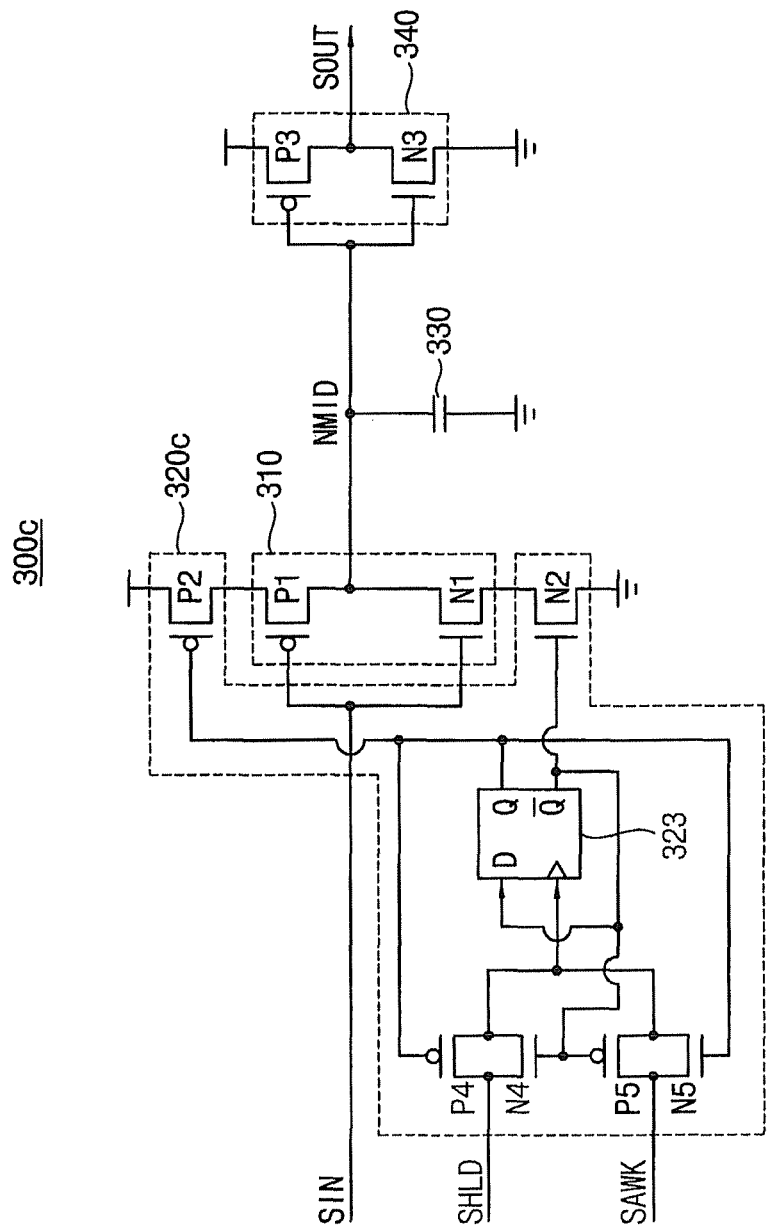
FIG. 7 is a circuit diagram illustrating still another example embodiment of a time register included in the time difference adder of FIG. 3.

FIG. 7 is a circuit diagram illustrating still another example of a time register included in a time difference adder of FIG. 3.

Referring to FIG. 7, a time register 300c includes a first inverter 310, an inverter controlling unit 320c, a capacitor 330 and an output unit 340. The time register 300c of FIG. 7 may have a similar or substantially similar configuration and may perform a similar or substantially similar operation to a time register 300a of FIG. 4, except for a configuration and an operation of a selector P4, N4, P5 and N5 included in the inverter controlling unit 320c.

The inverter controlling unit 320c may deactivate the first inverter 310 in response to a hold signal SHLD, and may activate the first inverter 310 in response to an awake signal SAWK. The inverter controlling unit 320c may include a second PMOS transistor P2, a second NMOS transistor N2, a D flip-flop 323 and the selector P4, N4, P5 and N5.

The selector P4, N4, P5 and N5 may be implemented by transmission gates P4, N4, P5 and N5. For example, the selector P4, N4, P5 and N5 may include a first transmission gate P4 and N4 and a second transmission gate P5 and N5. The first transmission gate P4 and N4 may output the hold signal SHLD when an inverted output signal output from an inverted output terminal /Q of the D flip-flop 323 has a logic high level and an output signal output from an output terminal Q of the D flip-flop 323 has a logic low level. The first transmission gate P4 and N4 may include a fourth PMOS transistor P4 including a gate coupled to the output terminal Q, and a fourth NMOS transistor N4 including a gate coupled to the inverted output terminal /Q. The second transmission gate P5 and N5 may output the awake signal SAWK when the inverted output signal output from the inverted output terminal /Q has a logic low level and the output signal output from the output terminal Q has a logic high level. The second transmission gate P5 and N5 may include a fifth PMOS transistor P5 including a gate coupled to the inverted output terminal /Q, and a fifth NMOS transistor N5 including a gate coupled to the output terminal Q.

Figure 8:
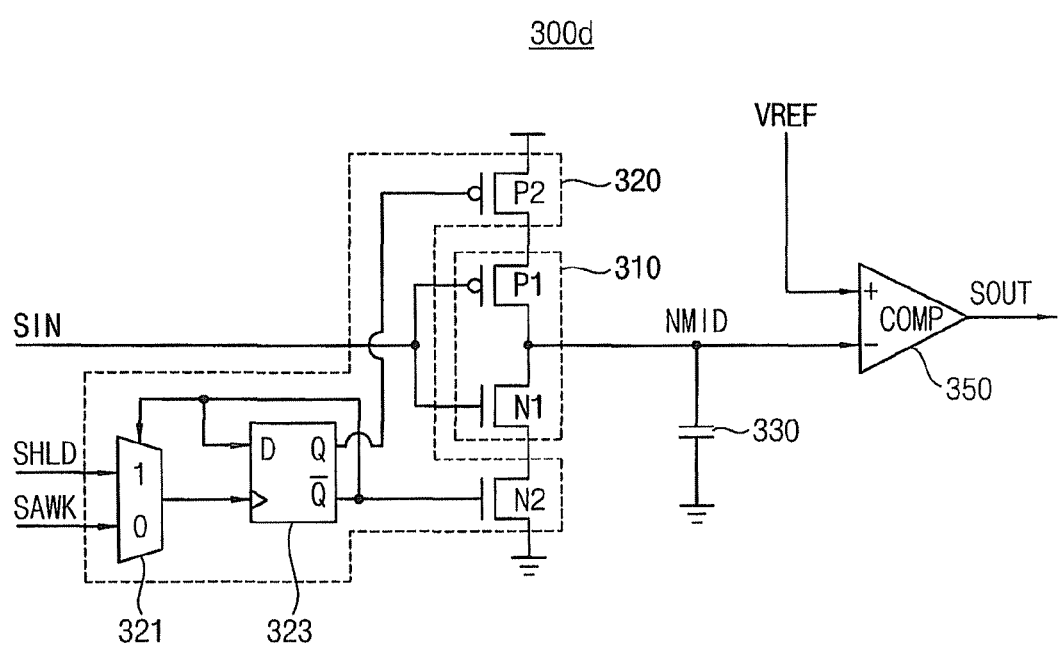
FIG. 8 is a circuit diagram illustrating further still another example embodiment of a time register included in the time difference adder of FIG. 3.

FIG. 8 is a circuit diagram illustrating further still another example of a time register included in a time difference adder of FIG. 3.

Referring to FIG. 8, a time register 300d includes a first inverter 310, an inverter controlling unit 320, a capacitor 330 and an output unit 350. The time register 300d of FIG. 8 may have a similar or substantially similar configuration and may perform a similar or substantially similar operation to a time register 300a of FIG. 4, except for a configuration and an operation of the output unit 350. According to example embodiments, the inverter controlling unit 320 may be implemented as an inverter controlling unit 320a of FIG. 4, an inverter controlling unit 320b of FIG. 6, an inverter controlling unit 320c of FIG. 7, or the like.

The output unit 350 may generate an output signal SOUT based on a voltage of the capacitor 330 (i.e., a voltage of a middle node NMID). For example, the output unit 350 may be implemented as a comparator 350. The comparator 350 may include a non-inverting input terminal receiving a reference voltage VREF, an inverting input terminal receiving the voltage of the capacitor 330, and an output terminal outputting the output signal SOUT. The comparator 350 may generate the output signal SOUT having a logic high level when the voltage of the capacitor 330 is lower than the reference voltage VREF. According to example embodiments, the reference voltage VREF may be received from an external circuit or device, or alternatively, the time register 300d may include a circuit generating the reference voltage VREF. The reference voltage VREF may be lower than a power supply voltage. For example, the reference voltage VREF may be about one-fifth of the power supply voltage.

FIG. 9A is a timing diagram for describing an example of an operation of a time difference adder of FIG. 3. FIG. 9A illustrates an example where a first input signal SIN1 and a second input signal SIN2 have a positive first time difference TD1, and a third input signal SIN3 and a fourth input signal SIN4 have a positive second time difference TD2.

Referring to FIGS. 3 and 9A, the first input signal SIN1 may be applied to a first input terminal IN1 of a first time register 230. The second input signal SIN2 may be delayed by an offset time Toff by a first offset delay unit 220, and then may be applied as a first hold signal SHLD1 to a first hold terminal HLD1 of the first time register 230. Accordingly, the first input signal SIN1 and the first hold signal SHLD1 may have a time difference TD1+Toff being equal or substantially equal to the offset time Toff plus the first time difference TD1 between the first and second input signals SIN1 and SIN2.

The fourth input signal SIN4 may be applied to a second input terminal IN2 of a second time register 270. The third input signal SIN3 may be delayed by the offset time Toff by a second offset delay unit 230, and then may be applied as a second hold signal SHLD2 to a second hold terminal HLD2 of the second time register 270. Accordingly, the fourth input signal SIN4 and the second hold signal SHLD2 may have a time difference −TD2+Toff being equal to the offset time Toff minus the second time difference TD2 between the third and fourth input signals SIN3 and SIN4.

In response to an awake signal SAWK, the first time register 230 may output a first output signal SOUT1 that has a rising edge after a first given, desired or predetermined time period Tdis−TD1−Toff from a rising edge of the awake signal SWAK. The first time period Tdis−TD1−Toff may be equal or substantially equal to a discharge time Tdis minus the time difference TD1+Toff between the first input signal SIN1 and the first hold signal SHLD1. That is, for example, the awake signal SAWK and the first output signal SOUT1 may have a time difference Tdis−TD1−Toff obtained by subtracting the time difference TD1+Toff between the first input signal SIN1 and the first hold signal SHLD1 from the discharge time Tdis.

In response to the awake signal SAWK, the second time register 270 may output a second output signal SOUT2 that has a rising edge after a second given, desired or predetermined time period Tdis+TD2−Toff from the rising edge of the awake signal SWAK.

The second time period Tdis+TD2−Toff may be equal or substantially equal to the discharge time Tdis minus the time difference −TD2+Toff between the fourth input signal SIN4 and the second hold signal SHLD2. That is, for example, the awake signal SAWK and the second output signal SOUT2 may have a time difference Tdis+TD2−Toff obtained by subtracting the time difference −TD2+Toff between the fourth input signal SIN4 and the second hold signal SHLD2 from the discharge time Tdis.

The first offset delay unit 220 and the second offset delay unit 260 may have the same or substantially the same offset time Toff, and the first time register 230 and the second time register 270 may have the same or substantially the same discharge time Tdis. Accordingly, a time difference between the first output signal SOUT1 and the second output signal SOUT2, which is equal or substantially equal to the time difference Tdis+TD2−Toff between the awake signal SAWK and the second output signal SOUT2 minus the time difference Tdis−TD1−Toff between the awake signal SAWK and the first output signal SOUT1 (i.e., (Tdis+TD2−Toff)−(Tdis−TD1−Toff)=TD2+TD1), may correspond to a sum TD1+TD2 of the first time difference TD1 between the first input signal SIN1 and the second input signal SIN2 and the second time difference TD2 between the third input signal SIN3 and the fourth input signal SIN4.

As described above, the time difference adder 200a according to example embodiments may accurately add the time differences TD1 and TD2 between the input signals SIN1, SIN2, SIN3 and SIN4.

FIG. 9B is a timing diagram for describing another example of an operation of a time difference adder of FIG. 3. FIG. 9B illustrates an example where a first input signal SIN1 and a second input signal SIN2 have a negative first time difference −TD1, and a third input signal SIN3 and a fourth input signal SIN4 have a negative second time difference −TD2.

Referring to FIGS. 3 and 9B, the first input signal SIN1 may be applied to a first input terminal IN1 of a first time register 230. The second input signal SIN2 may be delayed by an offset time Toff by a first offset delay unit 220, and then may be applied as a first hold signal SHLD1 to a first hold terminal HLD1 of the first time register 230. Accordingly, the first input signal SIN1 and the first hold signal SHLD1 may have a time difference −TD1+Toff being equal or substantially equal to the offset time Toff plus the first time difference −TD1 between the first and second input signals SIN1 and SIN2.

The fourth input signal SIN4 may be applied to a second input terminal IN2 of a second time register 270. The third input signal SIN3 may be delayed by the offset time Toff by a second offset delay unit 230, and then may be applied as a second hold signal SHLD2 to a second hold terminal HLD2 of the second time register 270. Accordingly, the fourth input signal SIN4 and the second hold signal SHLD2 may have a time difference TD2+Toff being equal or substantially equal to the offset time Toff minus the second time difference −TD2 between the third and fourth input signals SIN3 and SIN4.

In response to an awake signal SAWK, the first time register 230 may output a first output signal SOUT1 that has a rising edge after a first given, desired or predetermined time period Tdis+TD1−Toff from a rising edge of the awake signal SWAK. The first time period Tdis+TD1−Toff may be equal or substantially equal to a discharge time Tdis minus the time difference −TD1+Toff between the first input signal SIN1 and the first hold signal SHLD1. That is, for example, the awake signal SAWK and the first output signal SOUT1 may have a time difference Tdis+TD1−Toff obtained by subtracting the time difference −TD1+Toff between the first input signal SIN1 and the first hold signal SHLD1 from the discharge time Tdis.

In response to the awake signal SAWK, the second time register 270 may output a second output signal SOUT2 that has a rising edge after a second given, desired or predetermined time period Tdis−TD2−Toff from the rising edge of the awake signal SWAK. The second time period Tdis−TD2−Toff may be equal or substantially equal to the discharge time Tdis minus the time difference TD2+Toff between the fourth input signal SIN4 and the second hold signal SHLD2. That is, for example, the awake signal SAWK and the second output signal SOUT2 may have a time difference Tdis−TD2−Toff obtained by subtracting the time difference TD2+Toff between the fourth input signal SIN4 and the second hold signal SHLD2 from the discharge time Tdis.

The first offset delay unit 220 and the second offset delay unit 260 may have the same or substantially the same offset time Toff, and the first time register 230 and the second time register 270 may have the same or substantially the same discharge time Tdis. Accordingly, a time difference between the first output signal SOUT1 and the second output signal SOUT2, which is equal or substantially equal to the time difference Tdis−TD2−Toff between the awake signal SAWK and the second output signal SOUT2 minus the time difference Tdis+TD1−Toff between the awake signal SAWK and the first output signal SOUT1 (i.e., (Tdis−TD2−Toff)−(Tdis+TD1−Toff)=(-TD2)+(-TD1)), may correspond to a sum −TD1−TD2 of the first time difference −TD1 between the first input signal SIN1 and the second input signal SIN2 and the second time difference −TD2 between the third input signal SIN3 and the fourth input signal SIN4.

As described above, the time difference adder 200a according to example embodiments may accurately add the time differences −TD1 and −TD2 between the input signals SIN1, SIN2, SIN3 and SIN4.

Although FIGS. 9A and 9B illustrate examples of time difference addition that adds a first time difference between a rising edge of the first input signal SIN1 and a rising edge of the second input signal SIN2 and a second time difference between a rising edge of the third input signal SIN3 and a rising edge of the fourth input signal SIN4, in other example embodiments, a time difference adder may perform time difference addition that adds a third time difference between a falling edge of the first input signal SIN1 and a falling edge of the second input signal SIN2 and a fourth time difference between a falling edge of the third input signal SIN3 and a falling edge of the fourth input signal SIN4. In still other example embodiments, the time difference adder may perform in both of the time difference addition for the rising edges and the time difference addition for the falling edges.

Figure 10:
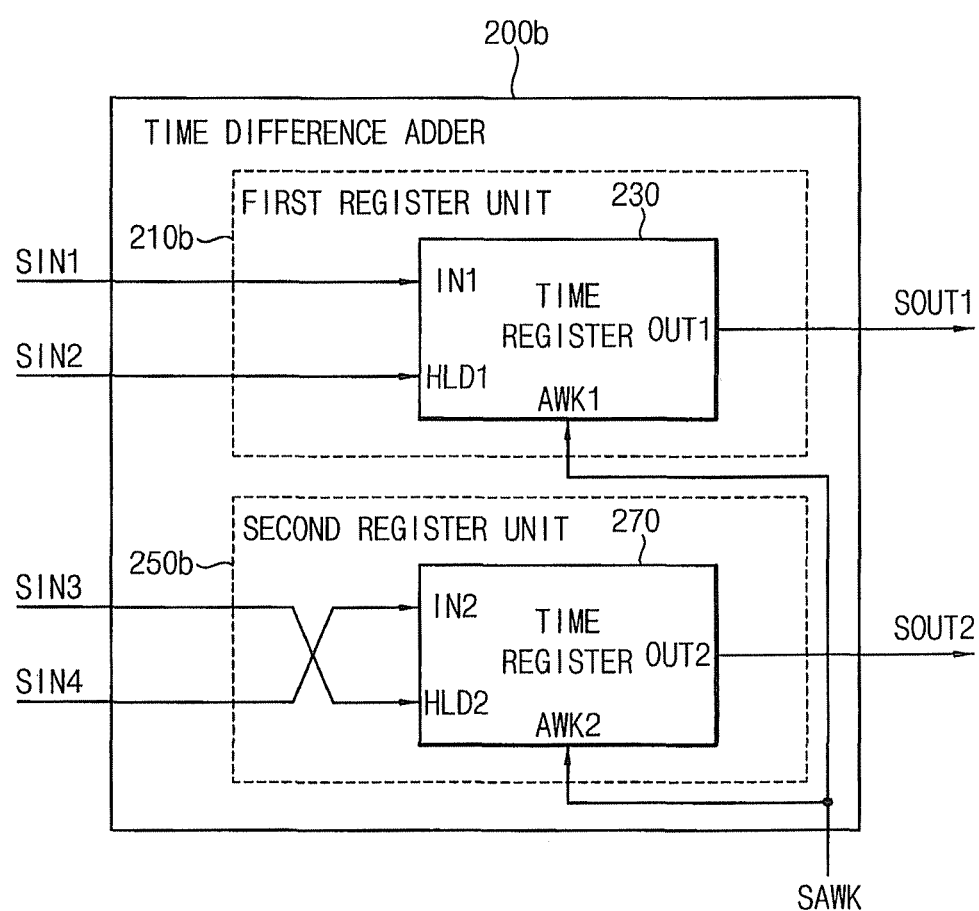
FIG. 10 is a block diagram illustrating a time difference adder according to example embodiments.

FIG. 10 is a block diagram illustrating a time difference adder according to example embodiments.

Referring to FIG. 10, a time difference adder 200b includes a first register unit 210b and a second register unit 250b. The time difference adder 200b may not include first and second offset delay units 220 and 260 illustrated in FIG. 3. The time difference adder 200b may receive first and second input signals SIN1 and SIN2 having a positive time difference and third and fourth input signals SIN3 and SIN4 having a negative time difference.

The first register unit 210b may receive the first input signal SIN1 and the second input signal SIN2, and may generate a first output signal SOUT1 in response to an awake signal SAWK. The first register unit 210b may include a first time register 230. The first time register 230 may include a first input terminal IN1 receiving the first input signal SIN1, a first hold terminal HLD1 receiving the second input signal SIN2, a first awake terminal AWK1 receiving the awake signal SAWK, and a first output terminal OUT1 outputting the first output signal SOUT1.

The second register unit 250b may receive the third input signal SIN3 and the fourth input signal SIN4, and may generate a second output signal SOUT2 in response to the awake signal SAWK. The second register unit 250b may include a second time register 270. The second time register 270 may include a second input terminal IN2 receiving the fourth input signal SIN2, a second hold terminal HLD2 receiving the third input signal SIN3, a second awake terminal AWK2 receiving the awake signal SAWK, and a second output terminal OUT2 outputting the second output signal SOUT2.

According to example embodiments, each of the first time register 230 and the second time register 270 may be implemented as a time register 300a of FIG. 4, a time register 300b of FIG. 6, a time register 300c of FIG. 7, a time register 300d of FIG. 8, or the like.

In response to the awake signal SAWK, the first time register 230 may output the first output signal SOUT1 that has a rising edge after a first given, desired or predetermined time period from a rising edge of the awake signal SAWK. The first time period may be equal or substantially equal to a discharge time minus a first time difference between the first input signal SIN1 and the second input signal SIN2. That is, for example, a time difference between the awake signal SAWK and the first output signal SOUT1 may be obtained by subtracting the first time difference from the discharge time.

In response to the awake signal SAWK, the second time register 270 may output the second output signal SOUT2 that has a rising edge after a second given, desired or predetermined time period from the rising edge of the awake signal SAWK. The second time period may be equal or substantially equal to the discharge time plus a second time difference between the third input signal SIN3 and the fourth input signal SIN4. That is, for example, a time difference between the awake signal SAWK and the second output signal SOUT2 may be obtained by adding the second time difference to the discharge time.

The discharge time of the first time register 230 may be the same or substantially the same as the discharge time of the second time register 270. Accordingly, a time difference between the first output signal SOUT1 and the second output signal SOUT2, which is equal or substantially equal to the time difference between the awake signal SAWK and the second output signal SOUT2 minus the time difference between the awake signal SAWK and the first output signal SOUT1, may correspond to a sum of the first time difference between the first and second input signals SIN1 and SIN2 and the second time difference between the third and fourth input signals SIN3 and SIN4.

As described above, the time difference adder 200b according to example embodiments may output the first and second output signals SOUT1 and SOUT2 having the time difference corresponding to the sum of the first time difference and the second time difference.

Figure 11:
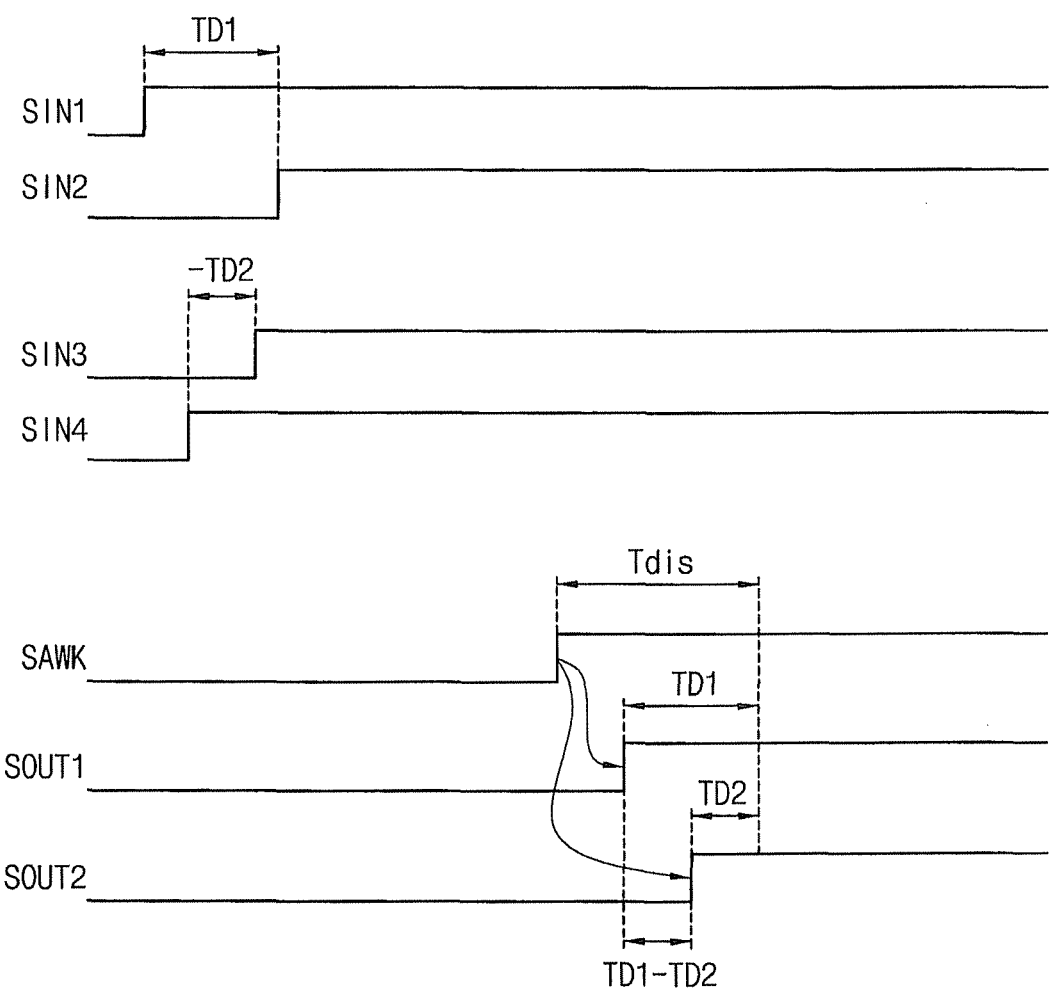
FIG. 11 is a timing diagram for describing an example operation of the time difference adder of FIG. 10.

FIG. 11 is a timing diagram for describing an example of an operation of a time difference adder of FIG. 10. FIG. 11 illustrates an example where a first input signal SIN1 and a second input signal SIN2 have a positive first time difference TD1, and a third input signal SIN3 and a fourth input signal SIN4 have a negative second time difference −TD2.

Referring to FIGS. 10 and 11, the first input signal SIN1 may be applied to a first input terminal IN1 of a first time register 230, and the second input signal SIN2 may be applied to a first hold terminal HLD1 of the first time register 230. The fourth input signal SIN4 may be applied to a second input terminal IN2 of a second time register 270, and the third input signal SIN3 may be applied to a second hold terminal HLD2 of the second time register 270.

In response to an awake signal SAWK, the first time register 230 may output a first output signal SOUT1 that has a rising edge after a first given, desired or predetermined time period Tdis−TD1 from a rising edge of the awake signal SWAK. The first time period Tdis−TD1 may be equal or substantially equal to a discharge time Tdis minus the first time difference TD1 between the first input signal SIN1 and the second input signal SIN2. That is, for example, the awake signal SAWK and the first output signal SOUT1 may have a time difference Tdis−TD1 obtained by subtracting the first time difference TD1 between the first and second input signals SIN1 and SIN2 from the discharge time Tdis.

In response to the awake signal SAWK, the second time register 270 may output a second output signal SOUT2 that has a rising edge after a second given, desired or predetermined time period Tdis−TD2 from the rising edge of the awake signal SWAK. The second time interval Tdis−TD2 may be equal or substantially equal to the discharge time Tdis plus the second time difference −TD2 between the third input signal SIN3 and the fourth input signal SIN4. That is, for example, the awake signal SAWK and the second output signal SOUT2 may have a time difference Tdis−TD2 obtained by adding the second time difference −TD2 between the third and fourth input signals SIN3 and SIN4 to the discharge time Tdis.

The first time register 230 and the second time register 270 may have the same or substantially the same discharge time Tdis. Accordingly, a time difference between the first output signal SOUT1 and the second output signal SOUT2, which is equal or substantially equal to the time difference Tdis−TD2 between the awake signal SAWK and the second output signal SOUT2 minus the time difference Tdis−TD1 between the awake signal SAWK and the first output signal SOUT1 (i.e., (Tdis−TD2)−(Tdis−TD1)=−TD2+TD1), may correspond to a sum TD1−TD2 of the first time difference TD1 between the first and second input signals SIN1 and SIN2 and the second time difference −TD2 between the third and fourth input signals SIN3 and SIN4.

As described above, the time difference adder 200b according to example embodiments may accurately add the time differences TD1 and −TD2 between the input signals SIN1, SIN2, SIN3 and SIN4.

Figure 12:
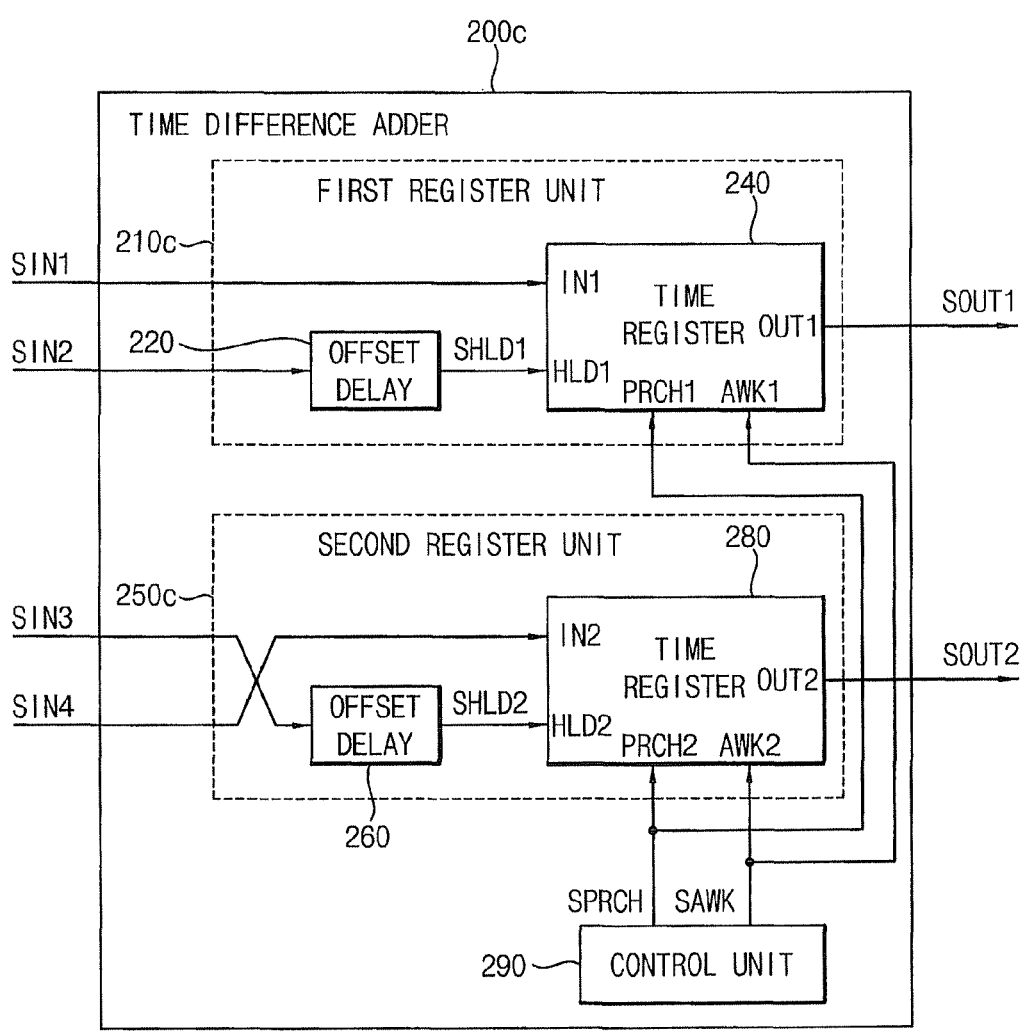
FIG. 12 is a block diagram illustrating a time difference adder according to example embodiments.

FIG. 12 is a block diagram illustrating a time difference adder according to example embodiments.

Referring to FIG. 12, a time difference adder 200c includes a first register unit 210c, a second register unit 250c and a control unit 290.

The first register unit 210c may receive a first input signal SIN1 and a second input signal SIN2, and may generate a first output signal SOUT1 in response to an awake signal SAWK. The first register unit 210c may include a first offset delay unit 220 and a first time register 240. The first offset delay unit 220 may generate a first hold signal SHLD1 by delaying the second input signal SIN2 by an offset time. The first time register 240 may include a first input terminal IN1 receiving the first input signal SIN1, a first hold terminal HLD1 receiving the first hold signal SHLD1, a first precharge terminal receiving a precharge signal SPRCH, a first awake terminal AWK1 receiving the awake signal SAWK, and a first output terminal OUT1 outputting the first output signal SOUT1.

The second register unit 250c may receive a third input signal SIN3 and a fourth input signal SIN4, and may generate a second output signal SOUT2 in response to the awake signal SAWK. The second register unit 250c may include a second offset delay unit 260 and a second time register 280. The second offset delay unit 260 may generate a second hold signal SHLD2 by delaying the third input signal SIN3 by the offset time. The second time register 280 may include a second input terminal IN2 receiving the fourth input signal SIN2, a second hold terminal HLD2 receiving the second hold signal SHLD2, a second precharge terminal receiving the precharge signal SPRCH, a second awake terminal AWK2 receiving the awake signal SAWK, and a second output terminal OUT2 outputting the second output signal SOUT2.

The control unit 290 may generate the precharge signal SPRCH and the awake signal SAWK. For example, the control unit 290 may generate the precharge signal SPRCH and the awake signal SAWK by delaying and/or inverting at least one of the first through fourth input signals SIN1, SIN2, SIN3 and SIN4. In some example embodiments, the control unit 290 may generate the precharge signal SPRCH and the awake signal SAWK such that the precharge signal SPRCH has a rising edge after the awake signal SAWK has a rising edge.

In response to the awake signal SAWK, the first time register 240 may output the first output signal SOUT1 that has a rising edge after a first given, desired or predetermined time period from a rising edge of the awake signal SAWK. The first time period may be equal or substantially equal to a discharge time minus the offset time minus a first time difference between the first and second input signals SIN1 and SIN2. That is, for example, a time difference between the awake signal SAWK and the first output signal SOUT1 may be obtained by subtracting the offset time from the discharge time and by further subtracting the first time difference from a result of the subtraction.

In response to the awake signal SAWK, the second time register 280 may output the second output signal SOUT2 that has a rising edge after a second given, desired or predetermined time period from the rising edge of the awake signal SAWK. The second time period may be equal or substantially equal to the discharge time minus the offset time plus a second time difference between the third and the fourth input signals SIN3 and SIN4. That is, for example, a time difference between the awake signal SAWK and the second output signal SOUT2 may be obtained by subtracting the offset time from the discharge time and by adding the second time difference to a result to the subtraction.

The offset time of the first offset delay unit 220 may be the same or substantially the same as the offset time of the second offset delay unit 260. The discharge time of the first time register 240 may be the same or substantially the same as the discharge time of the second time register 280. Accordingly, a time difference between the first output signal SOUT1 and the second output signal SOUT2, which is equal to the time difference between the awake signal SAWK and the second output signal SOUT2 minus the time difference between the awake signal SAWK and the first output signal SOUT1, may correspond to a sum of the first time difference between the first and second input signals SIN1 and SIN2 and the second time difference between the third and fourth input signals SIN3 and SIN4.

As described above, the time difference adder 200c according to example embodiments may output the first and second output signals SOUT1 and SOUT2 having the time difference corresponding to the sum of the first time difference and the second time difference.

Figure 13:
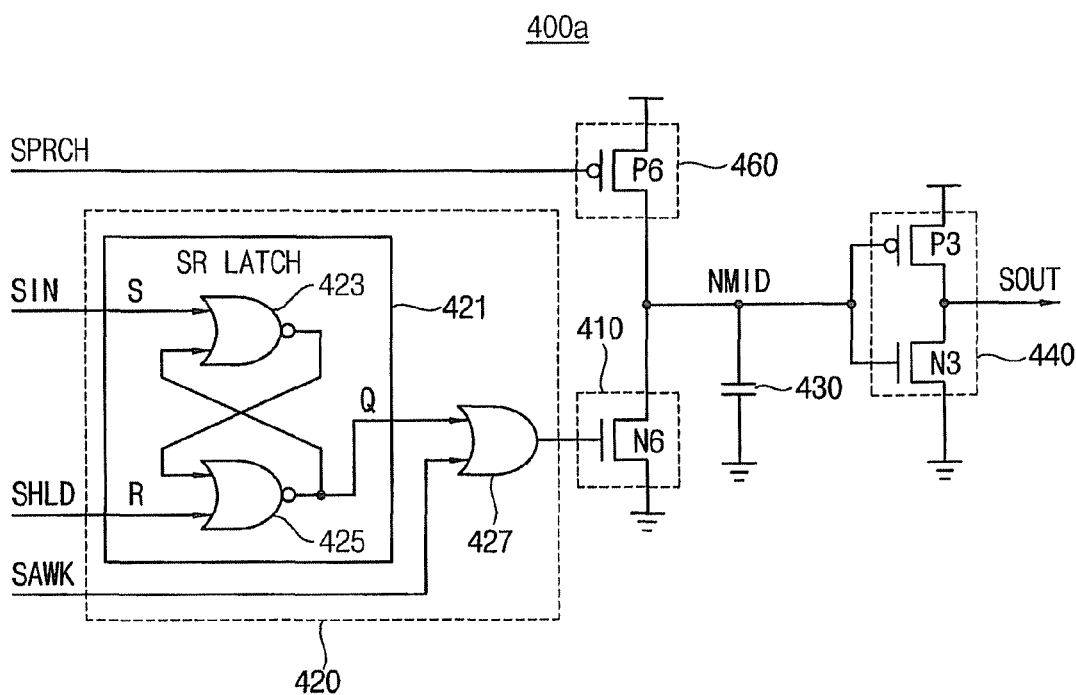
FIG. 13 is a circuit diagram illustrating an example embodiment of a time register included in the time difference adder of FIG. 12.

FIG. 13 is a circuit diagram illustrating an example of a time register included in a time difference adder of FIG. 12.

Referring to FIG. 13, a time register 400a includes a pull-down transistor 410, a pull-up transistor 460, a pull-down transistor controlling unit 420, a capacitor 430 and an output unit 440. In some example embodiments, each of a first time register 240 and a second time register 280 illustrated in FIG. 12 may be implemented as the time register 400a of FIG. 13.

The pull-down transistor 410 may be coupled between a middle node NMID and a ground voltage, and may be controlled by the pull-down transistor controlling unit 420 to discharge the capacitor 430. For example, the pull-down transistor 410 may include an NMOS transistor N6 including a gate receiving an output signal of the pull-down transistor controlling unit 420, a source coupled to the ground voltage and a drain coupled to the middle node NMID.

The pull-up transistor 460 may be coupled between the middle node NMID and a power supply voltage, and may charge the capacitor 430 in response to a precharge signal SPRCH. For example, the pull-up transistor 460 may include a PMOS transistor P6 including a gate receiving the precharge signal SPRCH, a source coupled to the power supply voltage and a drain coupled to the middle node NMID.

The pull-down transistor controlling unit 420 may turn on the pull-down transistor 410 in response to an input signal SIN, may turn off the pull-down transistor 410 in response to a hold signal SHLD, and may again turn on the pull-down transistor 410 in response to an awake signal SAWK. The pull-down transistor controlling unit 420 may include a set-reset latch 421 and an OR gate 427.

The set-reset latch 421 includes a set terminal S receiving the input signal SIN, a reset terminal R receiving the hold signal SHLD, and an output terminal Q outputting an output signal. The set-reset latch 421 may include a first NOR gate 423 and a second NOR gate 425. The first NOR gate 423 may perform a NOR operation on the input signal SIN and an output signal of the second NOR gate 425, and the second NOR gate 425 may perform a NOR operation on the hold signal SHLD and an output signal of the first NOR gate 423

The set-reset latch 421 may output the output signal having a logic high level when the input signal SIN has a logic high level and the hold signal SHLD has a logic low level. While the hold signal SHLD has a logic high level, the set-reset latch 421 may output the output signal having a logic low level regardless of a logic level of the input signal SIN. Further, when both of the input signal SIN and the hold signal SHLD have logic low levels, the set-reset latch 421 may output the output signal having a logic level the same as that of a previous output signal.

The OR gate 427 may perform an OR operation on the output signal output from the output terminal Q of the set-reset latch 421 and the awake signal SAWK. An output terminal of the OR gate 427 may be coupled to the gate of the pull-down transistor 410, and the pull-down transistor 410 may be controlled by an output signal of the OR gate 427.

The capacitor 430 may be charged by the pull-up transistor 460, and may be discharged by the pull-down transistor 410. The capacitor 430 may include a first electrode coupled to the middle node NMID and a second electrode coupled to the ground voltage. For example, when the pull-up transistor 460 is turned on, the first electrode of the capacitor 430 may be electrically coupled to the power supply voltage through the pull-up transistor 460, and thus the capacitor 430 may be charged. When the pull-down transistor 410 is turned on, the first electrode of the capacitor 430 may be electrically coupled to the ground voltage through the pull-down transistor 410, and thus the capacitor 430 may be discharged.

The output unit 440 may generate an output signal SOUT based on a voltage of the capacitor 430 (i.e., a voltage of the middle node NMID). For example, the output unit 440 may include an inverter 440. The inverter 440 may include a PMOS transistor P3 and an NMOS transistor N3. The inverter 440 may output the output signal SOUT having a logic high level when the voltage of the capacitor 430 is lower than a given, desired or predetermined threshold voltage. For example, when the voltage of the capacitor 430 is lower than a threshold voltage of the PMOS transistor P3, the PMOS transistor P3 may be turned on, and thus the inverter 440 may output the output signal SOUT having the logic high level.

The capacitor 430 may be discharged during a time difference between the input signal SIN and the hold signal SHLD to store information about the time difference between the input signal SIN and the hold signal SHLD. For example, the discharging of the capacitor 430 may be started in response to a rising edge of the input signal SIN, and may be stopped in response to a rising edge of the hold signal SHLD, so that the capacitor 430 may be discharged during the time difference between the input signal SIN and the hold signal SHLD. Further, the discharging of the capacitor 430 may be restarted in response to a rising edge of the awake signal SAWK. Accordingly, the voltage of the capacitor 430 may become lower than the threshold voltage (e.g., the threshold voltage of the PMOS transistor P3) after a given, desired or predetermined time period from the rising edge of the awake signal SAWK, and the time period may be determined according to the time difference between the input signal SIN and the hold signal SHLD. The output unit 440 may output the output signal SOUT having the logic high level when the voltage of the capacitor 430 becomes lower than the threshold voltage. Accordingly, the output signal SOUT may have a rising edge after the time period determined according to the time difference from the rising edge of the awake signal SAWK. Thus, a time point when the output signal SOUT has the rising edge may be determined according to the time difference between the input signal SIN and the hold signal SHLD.

For example, the set-reset latch 421 may output an output signal having a logic high level in response to a rising edge of the input signal SIN, and the OR gate 427 may output an output signal having a logic high level in response to the output signal of the set-reset latch 421 having the logic high level. The pull-down transistor 410 may be turned on in response to the output signal of the OR gate 427 having the logic high level, and the discharging of the capacitor 430 may be stated by the turned-on pull-down transistor 410.

The set-reset latch 421 may output the output signal having a logic low level in response to a rising edge of the hold signal SHLD, and the OR gate 427 may output the output signal having a logic low level in response to the output signal of the set-reset latch 421 having the logic low level and the awake signal SAWK having a logic low level. The pull-down transistor 410 may be turned off in response to the output signal of the OR gate 427 having the logic low level, and the discharging of the capacitor 430 may be stopped by the turned-off pull-down transistor 410.

The OR gate 427 may output the output signal having a logic high level in response to a rising edge of the awake signal SAWK. The pull-down transistor 410 may be turned on in response to the output signal of the OR gate 427 having the logic high level, and the discharging of the capacitor 430 may be restarted by the turned-on pull-down transistor 410. After the discharging of the capacitor 430 is restarted, the output unit 440 may output the output signal SOUT having the logic high level when the voltage of the capacitor 430, or the voltage of the middle node NMID becomes lower than the threshold voltage.

Accordingly, in response to the awake signal SAWK, the time register 400*a* may output the output signal SOUT having a rising edge at a time point determined according to the time difference between the input signal SIN and the hold signal SHLD.

Figure 14:
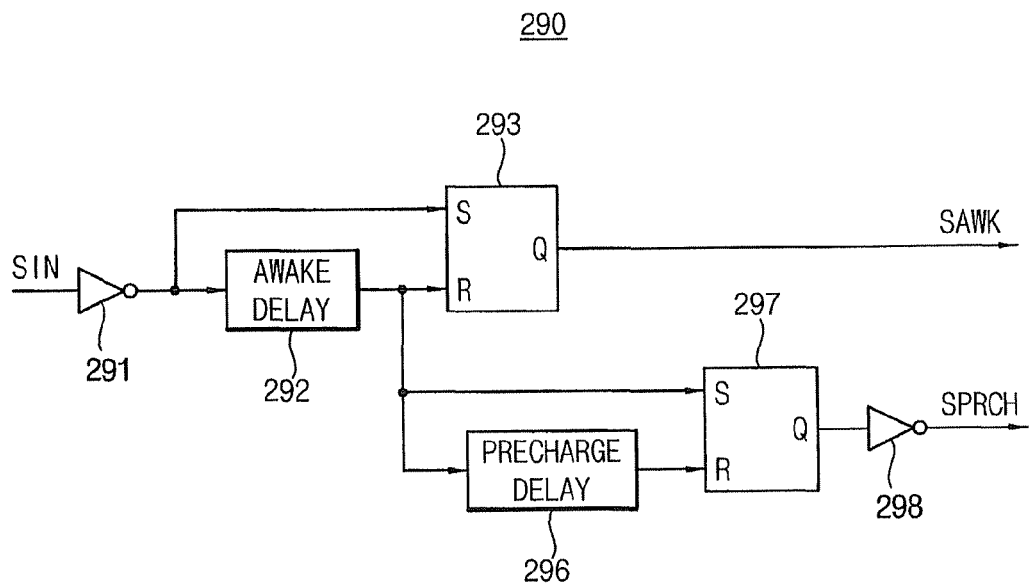
FIG. 14 is a circuit diagram illustrating an example embodiment of a control unit included in the time difference adder of FIG. 12.

FIG. 14 is a circuit diagram illustrating an example of a control unit included in a time difference adder of FIG. 12.

Referring to FIG. 14, a control unit 290 includes a first inverter 291, an awake delay unit 292, a first set-reset latch 293, a precharge delay unit 296, a second set-reset latch 297 and a second inverter 298.

The first inverter 291 may generate an inversion signal of an input signal SIN by inverting the input signal SIN. According to example embodiments, the input signal SIN may be a first input signal SIN1 of FIG. 12, a second input signal SIN2 of FIG. 12, a third input signal SIN3 of FIG. 12, a fourth input signal SIN4 of FIG. 12 or another signal. The first inverter 291 may provide the inversion signal of the input signal SIN to the awake delay unit 292 and the first set-reset latch 293.

The awake delay unit 292 and the first set-reset latch 293 may form an awake pulse generator. The awake delay unit 292 may delay the inversion signal of the input signal SIN by a first delay time. In some example embodiments, the first delay time of the awake delay unit 292 may be set longer than a discharge time of a time register.

The first set-reset latch 293 may include a set terminal S receiving the inversion signal of the input signal SIN, a reset terminal R receiving an output signal of the awake delay unit 292, and an output terminal Q outputting an awake signal SAWK. The first set-reset latch 293 may generate the awake signal SAWK such that the awake signal SAWK has a rising edge in response to a rising edge of the inversion signal of the input signal SIN (e.g., the inversion signal that is not delayed by the awake delay unit 292), and has a falling edge in response to a rising edge of the output signal of the awake delay unit 292. Accordingly, a pulse width of the awake signal SAWK, or a time interval between the rising edge of the awake signal SAWK and the falling edge of the awake signal SAWK may correspond to the first delay time of the awake delay unit 292.

The precharge delay unit 296 and the second set-reset latch 297 may form a precharge pulse generator. The precharge delay unit 296 may delay the output signal of the awake delay unit 292 by a second delay time. In some example embodiments, the second delay time of the precharge delay unit 296 may be set longer than a time required to substantially fully charge a capacitor included in the time register.

The second set-reset latch 297 may include a set terminal S receiving the output signal of the awake delay unit 292, a reset terminal R receiving an output signal of the precharge delay unit 296, and an output terminal Q outputting an output signal. The second inverter 298 may generate a precharge signal SPRCH by inverting the output signal of the second set-reset latch 297.

The second set-reset latch 297 and the second inverter 298 may generate the precharge signal SPRCH such that the precharge signal SPRCH has a falling edge in response to a rising edge of the output signal of the awake delay unit 292, and has a rising edge in response to a rising edge of the output signal of the precharge delay unit 296. Accordingly, a time interval between the falling edge of the precharge signal SPRCH and the rising edge of the precharge signal SPRCH may correspond to the second delay time of the precharge delay unit 296.

Figure 15:
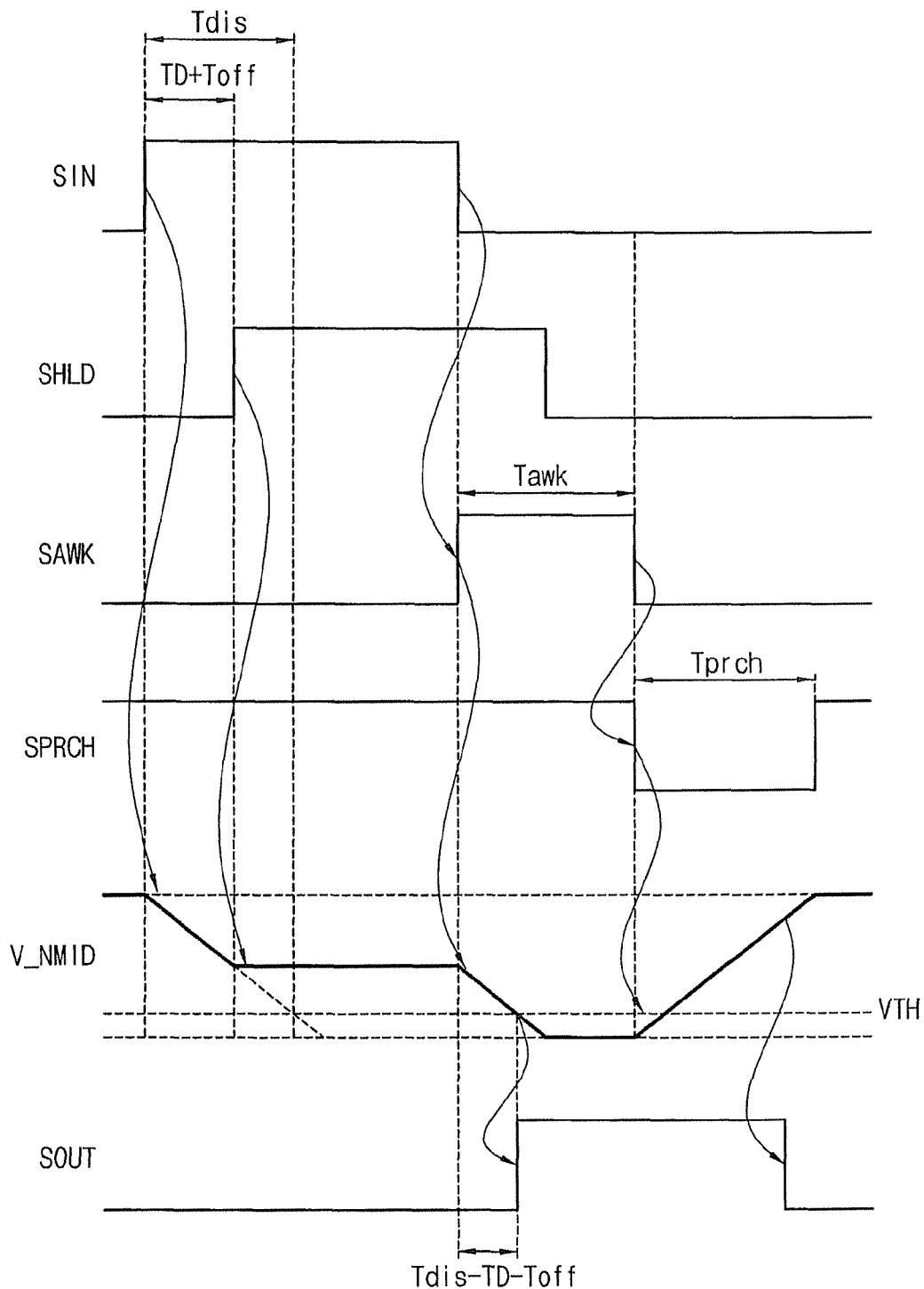
FIG. 15 is a timing diagram for describing example operation of the time register of FIG. 13.

FIG. 15 is a timing diagram for describing an operation of a time register of FIG. 13.

Referring to FIGS. 13, 14 and 15, a pull-down transistor controlling unit 420 may generate an output signal having a logic high level in response to a rising edge of an input signal SIN. For example, a set-reset latch 421 may output an output signal having a logic high level at an output terminal Q in response to the rising edge of the input signal SIN, and an OR gate 427 may output an output signal having a logic high level in response to the output signal of the set-reset latch 421 having the logic high level. An NMOS transistor N6 of a pull-down transistor 410 may be turned on in response to the output signal of the OR gate 427 having the logic high level. If the NMOS transistor N6 is turned on, a middle node NMID, or a first electrode of a capacitor 430 may be coupled to a ground voltage through the NMOS transistor N6, and thus the capacitor 430 may be discharged. Accordingly, the capacitor 430 may be discharged in response to the rising edge of the input signal SIN, and the voltage of the capacitor 430, or the voltage V_NMID of the middle node NMID may decrease.

The pull-down transistor controlling unit 420 may generate the output signal having a logic low level in response to a rising edge of a hold signal SHLD. For example, the set-reset latch 421 may output the output signal having a logic low level at the output terminal Q in response to the rising edge of the hold signal SHLD, and the OR gate 427 may output the output signal having a logic low level in response to the output signal of the set-reset latch 421 having the logic low level and an awake signal SAWK having a logic low level. The NMOS transistor N6 of the pull-down transistor 410 may be turned off in response to the output signal of the OR gate 427 having the logic low level. If the NMOS transistor N6 is turned off, the discharging of the capacitor 430 may be stopped. Accordingly, the discharging of the capacitor 430 may be stopped in response to the rising edge of the hold signal SHLD, and the decrease of the voltage of the capacitor 430, or the decrease of the voltage V_NMID of the middle node NMID may be stopped.

The control unit 290 may generate the awake signal SAWK having a logic high level in response to a falling edge of the input signal SIN. The awake signal SAWK may have a logic high period Tawk longer than a discharge time Tdis of a time register 400a. A pulse width of the awake signal SAWK, or the logic high period Tawk may correspond to a first delay time of an awake delay unit 292.

The pull-down transistor controlling unit 420 may generate the output signal having a logic high level in response to a rising edge of the awake signal SAWK. For example, the OR gate 427 may output the output signal having the logic high level in response to the rising edge of the awake signal SAWK. The NMOS transistor N6 of the pull-down transistor 410 may be turned on in response to the output signal of the OR gate 427 having the logic high level. If the NMOS transistor N6 is turned on, the discharging of the capacitor 430 may be restarted. Accordingly, the discharging of the capacitor 430 may be restarted in response to the rising edge of the awake signal SAWK, and the decrease of the voltage of the capacitor 430, or the voltage V_NMID of the middle node NMID may decrease again.

The output unit 440 may output an output signal SOUT based on the voltage of the capacitor 430, or the voltage V_NMID of the middle node NMID. The output unit 440 may output the output signal SOUT having a logic high level when the voltage V_NMID of the middle node NMID becomes lower than a given, desired or predetermined threshold voltage VTH. For example, the threshold voltage VTH may be a threshold voltage of a PMOS transistor P3. Thus, if the voltage V_NMID of the middle node NMID becomes lower than the threshold voltage of the PMOS transistor P3, the PMOS transistor P3 may be turned on, and the output signal SOUT may have the logic high level.

The output signal SOUT may have a rising edge after a given, desired or predetermined time period Tdis−TD−Toff from the rising edge of the awake signal SAWK. The time period Tdis−TD−Toff may be equal or substantially equal to a discharge time Tdis minus a time difference TD+Toff between the input signal SIN and the hold signal SHLD.

Thus, a time point when the output signal SOUT has the rising edge may be determined according to the time difference TD+Toff between the input signal SIN and the hold signal SHLD.

The control unit 290 may generate a precharge signal SPRCH having a logic low level in response to a falling edge of the awake signal SAWK. The precharge signal SPRCH may have a logic low period Tprch longer than a time required to fully or substantially fully charge the capacitor 430. The logic low period Tprch of the precharge signal SPRCH may correspond to a second delay time of a precharge delay unit 296.

A PMOS transistor P6 of a pull-up transistor 460 may be turned on in response to a falling edge of the precharge signal SPRCH. If the PMOS transistor P6 is turned on, the middle node NMID, or the first terminal of the capacitor 430 may be coupled to a power supply voltage through the PMOS transistor P6, and the capacitor 430 may be charged.

Figure 16:
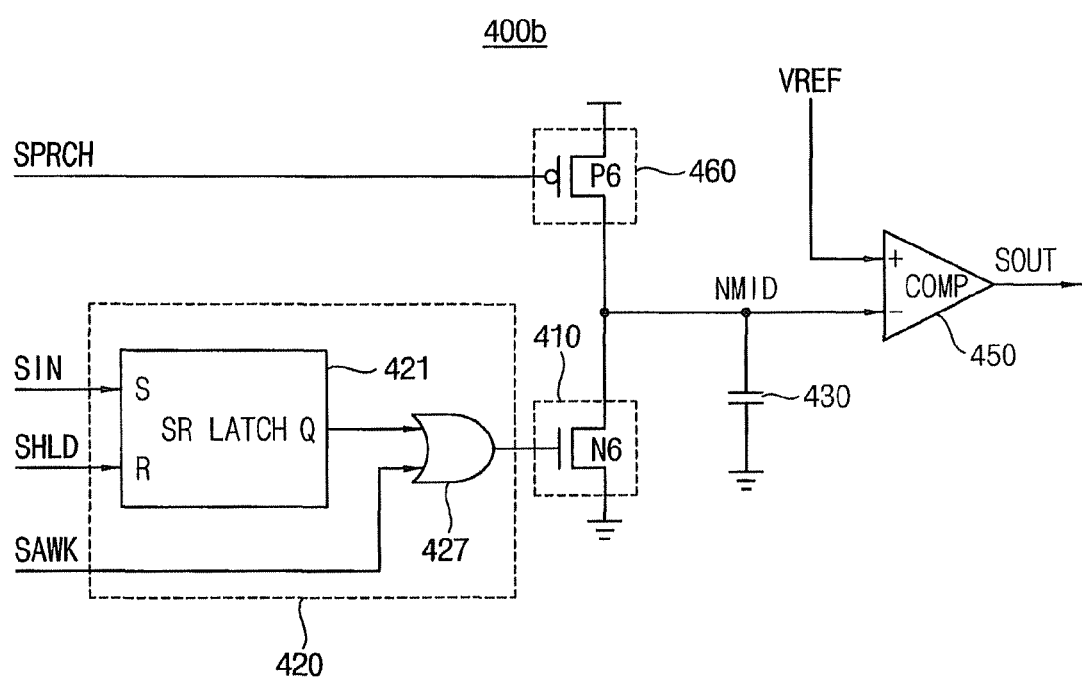
FIG. 16 is a circuit diagram illustrating another example embodiment of a time register included in the time difference adder of FIG. 12.

FIG. 16 is a circuit diagram illustrating another example of a time register included in a time difference adder of FIG. 12.

Referring to FIG. 16, a time register 400b includes a pull-down transistor 410, a pull-up transistor 460, a pull-down transistor controlling unit 420, a capacitor 430 and an output unit 450. The time register 400b of FIG. 16 may have a similar or substantially similar configuration and may perform a similar or substantially similar operation to a time register 400a of FIG. 13, except for a configuration and an operation of the output unit 450.

The output unit 450 may generate an output signal SOUT based on a voltage of the capacitor 430 (e.g., a voltage of the middle node NMID). For example, the output unit 450 may be implemented as a comparator 450. The comparator 450 may include a non-inverting input terminal receiving a reference voltage VREF, an inverting input terminal receiving the voltage of the capacitor 430, and an output terminal outputting the output signal SOUT. According to example embodiments, the reference voltage VREF may be received from an external circuit or device, or alternatively, the time register 400d may include a circuit generating the reference voltage VREF.

Figure 17:
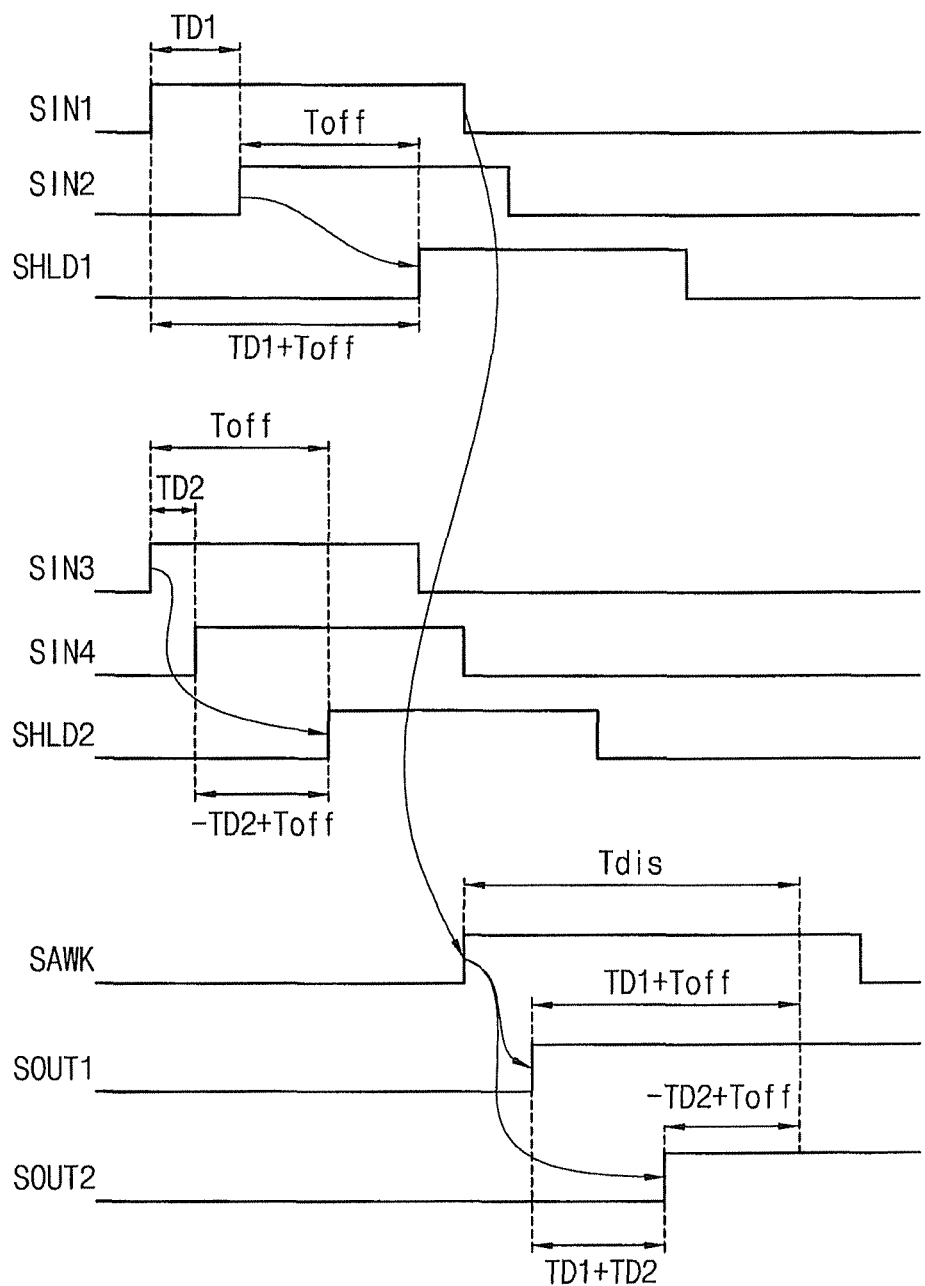
FIG. 17 is a timing diagram for describing an example operation of the time difference adder of FIG. 12.

FIG. 17 is a timing diagram for describing an example of an operation of a time difference adder of FIG. 12. FIG. 17 illustrates an example where a first input signal SIN1 and a second input signal SIN2 have a positive first time difference TD1, and a third input signal SIN3 and a fourth input signal SIN4 have a positive second time difference TD2.

Referring to FIGS. 12 and 17, the first input signal SIN1 may be applied to a first input terminal IN1 of a first time register 240. The second input signal SIN2 may be delayed by an offset time Toff by a first offset delay unit 220, and then may be applied as a first hold signal SHLD1 to a first hold terminal HLD1 of the first time register 240. Accordingly, the first input signal SIN1 and the first hold signal SHLD1 may have a time difference TD1+Toff being equal to the offset time Toff plus the first time difference TD1 between the first and second input signals SIN1 and SIN2.

The fourth input signal SIN4 may be applied to a second input terminal IN2 of a second time register 280. The third input signal SIN3 may be delayed by the offset time Toff by a second offset delay unit 260, and then may be applied as a second hold signal SHLD2 to a second hold terminal HLD2 of the second time register 280. Accordingly, the fourth input signal SIN4 and the second hold signal SHLD2 may have a time difference −TD2+Toff being equal or substantially equal to the offset time Toff minus the second time difference TD2 between the third and fourth input signals SIN3 and SIN4.

In response to an awake signal SAWK, the first time register 240 may output a first output signal SOUT1 that has a rising edge after a first given, desired or predetermined time period Tdis−TD1−Toff from a rising edge of the awake signal SWAK. The first time period Tdis−TD1−Toff may be equal to a discharge time Tdis minus the time difference TD1+Toff between the first input signal SIN1 and the first hold signal SHLD1. That is, for example, the awake signal SAWK and the first output signal SOUT1 may have a time difference Tdis−TD1−Toff obtained by subtracting the time difference TD1+Toff between the first input signal SIN1 and the first hold signal SHLD1 from the discharge time Tdis.

In response to the awake signal SAWK, the second time register 280 may output a second output signal SOUT2 that has a rising edge after a second, given, desired or predetermined time period Tdis+TD2−Toff from the rising edge of the awake signal SWAK. The second time period Tdis+TD2−Toff may be equal or substantially equal to the discharge time Tdis minus the time difference −TD2+Toff between the fourth input signal SIN4 and the second hold signal SHLD2. That is, for example, the awake signal SAWK and the second output signal SOUT2 may have a time difference Tdis+TD2−Toff obtained by subtracting the time difference −TD2+Toff between the fourth input signal SIN4 and the second hold signal SHLD2 from the discharge time Tdis.

The first offset delay unit 220 and the second offset delay unit 260 may have the same or substantially the same offset time Toff, and the first time register 240 and the second time register 280 may have the same or substantially the same discharge time Tdis. Accordingly, a time difference between the first output signal SOUT1 and the second output signal SOUT2, which is equal or substantially equal to the time difference Tdis+TD2−Toff between the awake signal SAWK and the second output signal SOUT2 minus the time difference Tdis−TD1−Toff between the awake signal SAWK and the first output signal SOUT1 (e.g., (Tdis+TD2−Toff)−(Tdis−TD1−Toff)=TD2+TD1), may correspond to a sum TD1+TD2 of the first time difference TD1 between the first and second input signal SIN1 and SIN2 and the second time difference TD2 between the third and fourth input signal SIN3 and SIN4.

As described above, the time difference adder 200c according to example embodiments may accurately add the time differences TD1 and TD2 between the input signals SIN1, SIN2, SIN3 and SIN4.

Figure 18:
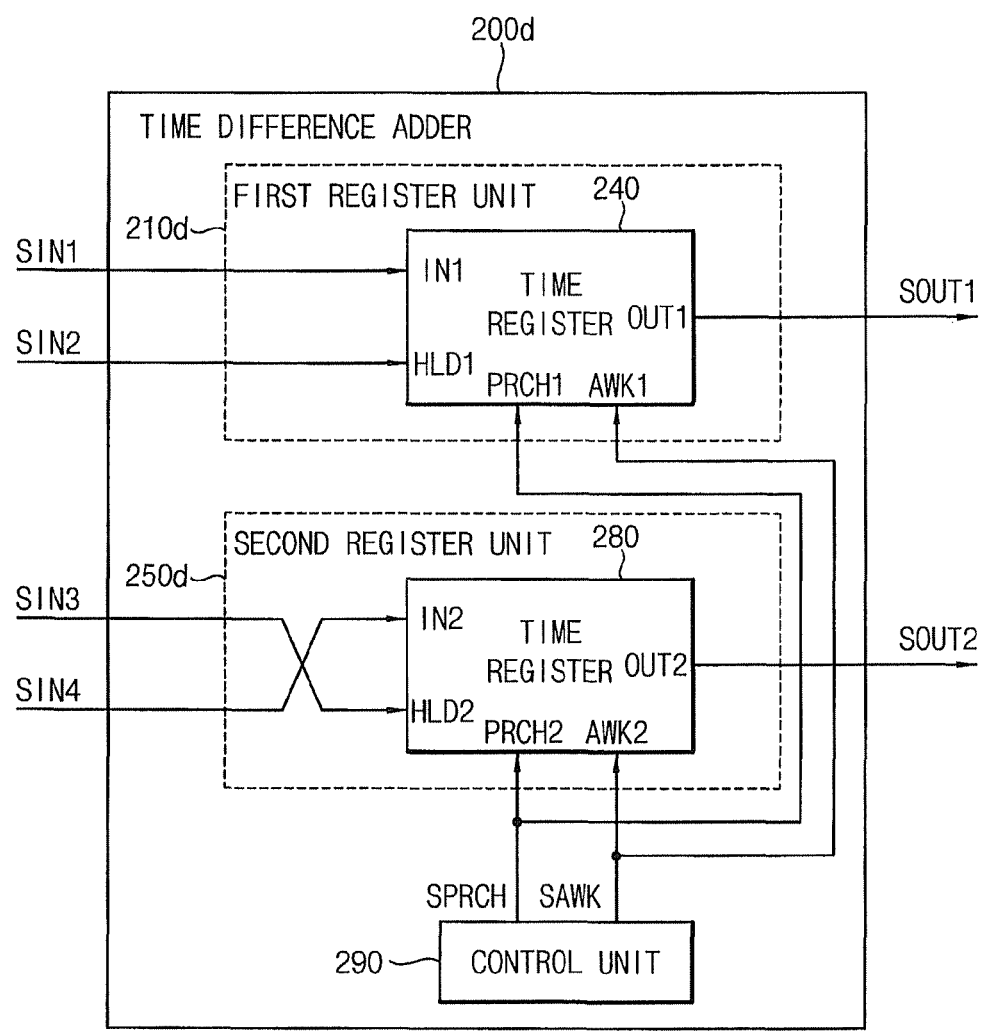
FIG. 18 is a block diagram illustrating a time difference adder according to example embodiments.

FIG. 18 is a block diagram illustrating a time difference adder according to example embodiments.

Referring to FIG. 18, a time difference adder 200d includes a first register unit 210d and a second register unit 250d. The time difference adder 200d may not include first and second offset delay units 220 and 260 illustrated in FIG. 12. The time difference adder 200d may receive first and second input signals SIN1 and SIN2 having a positive time difference and third and fourth input signals SIN3 and SIN4 having a negative time difference.

The first register unit 210d may receive the first input signal SIN1 and the second input signal SIN2, and may generate a first output signal SOUT1 in response to an awake signal SAWK. The first register unit 210d may include a first time register 240. The first time register 240 may include a first input terminal IN1 receiving the first input signal SIN1, a first hold terminal HLD1 receiving the second input signal SIN2, a first precharge terminal PRCH1 receiving a precharge signal SPRCH, a first awake terminal AWK1 receiving the awake signal SAWK, and a first output terminal OUT1 outputting the first output signal SOUT1.

The second register unit 250d may receive the third input signal SIN3 and the fourth input signal SIN4, and may generate a second output signal SOUT2 in response to the awake signal SAWK. The second register unit 250d may include a second time register 280. The second time register 280 may include a second input terminal IN2 receiving the fourth input signal SIN2, a second hold terminal HLD2 receiving the third input signal SIN3, a second precharge terminal PRCH2 receiving the precharge signal SPRCH, a second awake terminal AWK2 receiving the awake signal SAWK, and a second output terminal OUT2 outputting the second output signal SOUT2.

According to example embodiments, each of the first time register 240 and the second time register 280 may be implemented as a time register 400a of FIG. 13, a time register 400b of FIG. 16, or the like.

The control unit 290 may generate the precharge signal SPRCH and the awake signal SAWK. For example, the control unit 290 may generate the precharge signal SPRCH and the awake signal SAWK by delaying and/or inverting at least one of the first through fourth input signals SIN1, SIN2, SIN3 and SIN4.

In response to the awake signal SAWK, the first time register 240 may output the first output signal SOUT1 that has a rising edge after a first given, desired or predetermined time period from a rising edge of the awake signal SAWK. The first time period may be equal or substantially equal to a discharge time minus a first time difference between the first input signal SIN1 and the second input signal SIN2. That is, for example, a time difference between the awake signal SAWK and the first output signal SOUT1 may be obtained by subtracting the first time difference from the discharge time.

In response to the awake signal SAWK, the second time register 280 may output the second output signal SOUT2 that has a rising edge with a second given, desired or predetermined time period from the rising edge of the awake signal SAWK. The second time period may be equal or substantially equal to the discharge time plus a second time difference between the third input signal SIN3 and the fourth input signal SIN4. That is, for example, a time difference between the awake signal SAWK and the second output signal SOUT2 may be obtained by adding the second time difference to the discharge time.

The discharge time of the first time register 240 may be the same or substantially the same as the discharge time of the second time register 280. Accordingly, a time difference between the first output signal SOUT1 and the second output signal SOUT2, which is equal or substantially equal to the time difference between the awake signal SAWK and the second output signal SOUT2 minus the time difference between the awake signal SAWK and the first output signal SOUT1, may correspond to a sum of the first time difference between the first and second input signals SIN1 and SIN2 and the second time difference between the third and fourth input signals SIN3 and SIN4.

As described above, the time difference adder 200d according to example embodiments may output the first and second output signals SOUT1 and SOUT2 having the time difference corresponding to the sum of the first time difference and the second time difference.

Figure 19:
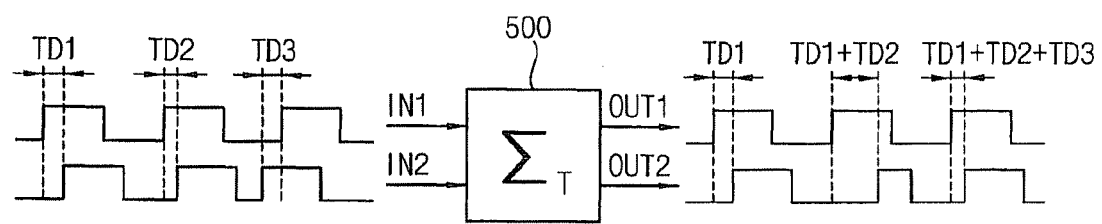
FIG. 19 is a diagram illustrating a time difference accumulator according to example embodiments.

FIG. 19 is a diagram illustrating a time difference accumulator according to example embodiments.

Referring to FIG. 19, a time difference accumulator 500 may generate a first output signal OUT1 and a second output signal OUT2 in response to a first input signal IN1 and a second input signal IN2. The time difference accumulator 500 may accumulate a time difference between the first and second input signals IN1 and IN2 to generate the first and second output signal OUT1 and OUT2 having the accumulated time difference. For example, if the first and second input signals IN1 and IN2 having a first time difference TD1 are initially input, the time difference accumulator 500 may generate the first and second output signals OUT1 and OUT2 having the first time difference TD1. Subsequently, if the first and second input signals IN1 and IN2 having a second time difference TD2 are input, the time difference accumulator 500 may generate the first and second output signals OUT1 and OUT2 having a time difference TD1+TD2 corresponding to a sum of the first time difference TD1 and the second time difference TD2. Thereafter, if the first and second input signals IN1 and IN2 having a third time difference TD3 are input, the time difference accumulator 500 may generate the first and second output signals OUT1 and OUT2 having a time difference TD1+TD2+TD3 corresponding to a sum of the first through third time differences TD1, TD2 and TD3. The time difference accumulator 500 according to example embodiments may be included in a system-on-chip (SOC).

Figure 20:
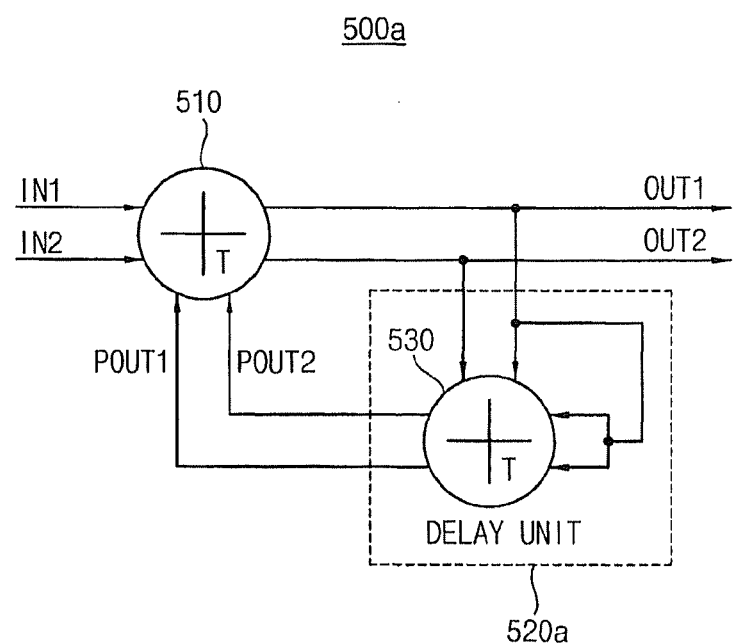
FIG. 20 is a block diagram illustrating a time difference accumulator according to example embodiments.

FIG. 20 is a block diagram illustrating a time difference accumulator according to example embodiments.

Referring to FIG. 20, a time difference accumulator 500a includes a first time difference adder 510 and a delay unit 520a.

The first time difference adder 510 may generate a first output signal OUT1 and a second output signal OUT2 in response to a first input signal IN1, a second input signal IN2, a first previous output signal POUT1 and a second previous output signal POUT2. The first time difference adder 510 may add a first time difference between the first and second input signals IN1 and IN2 and a second time difference between the first and second previous output signals POUT1 and POUT2 to generate the first and second output signals OUT1 and OUT2 having a time difference corresponding to a sum of the first time difference and the second time difference. The first and second previous output signals POUT1 and POUT2 may be the first and second output signals OUT1 and OUT2 generated by a previous time difference addition performed by the time difference adder 510.

According to example embodiments, the first time difference adder 510 may be implemented as a time difference adder 200a of FIG. 3, a time difference adder 200b of FIG. 10, a time difference adder 200c of FIG. 12, a time difference adder 200d of FIG. 18, or the like.

The delay unit 520a may generate the first previous output signal POUT1 and the second previous output signal POUT2 by delaying the first output signal OUT1 and the second output signal OUT2, respectively. The delay unit 520a may include a second time difference adder 530. According to example embodiments, the second time difference adder 530 may be implemented as a time difference adder 200a of FIG. 3, a time difference adder 200b of FIG. 10, a time difference adder 200c of FIG. 12, a time difference adder 200d of FIG. 18, or the like.

The second time difference adder 530 may generate the first and second previous output signals POUT1 and POUT2 in response to the first and second output signals OUT1 and OUT2 and substantially the same two signals. The second time difference adder 530 may add a third time difference between the first and second output signals OUT1 and OUT2 and a fourth time difference between the same two signals to generate the first and second previous output signals POUT1 and POUT2 having a time difference corresponding to a sum of the third time difference and the fourth time difference. The same two signals may have rising edges at the same or substantially the same time points, and the fourth time difference may be an identity element "0" of the time difference addition. Accordingly, the time difference between the first and second previous output signals POUT1 and POUT2 may be the same or substantially the same as the third time difference between the first and second output signals OUT1 and OUT2. Thus, the second time difference adder 530 may generate the first and second previous output signals POUT1 and POUT2 by delaying the first and second output signals OUT1 and OUT2 by the same or substantially the same delay times, respectively, without changing the time difference.

Although FIG. 20 illustrates an example where the first output signal OUT1 is used as the same two signals, according to example examples, the same two signals may be the second output signal OUT2, an inversion signal of the first output signal OUT1, an inversion signal of the second output signal OUT2, or another signal.

Figure 21:
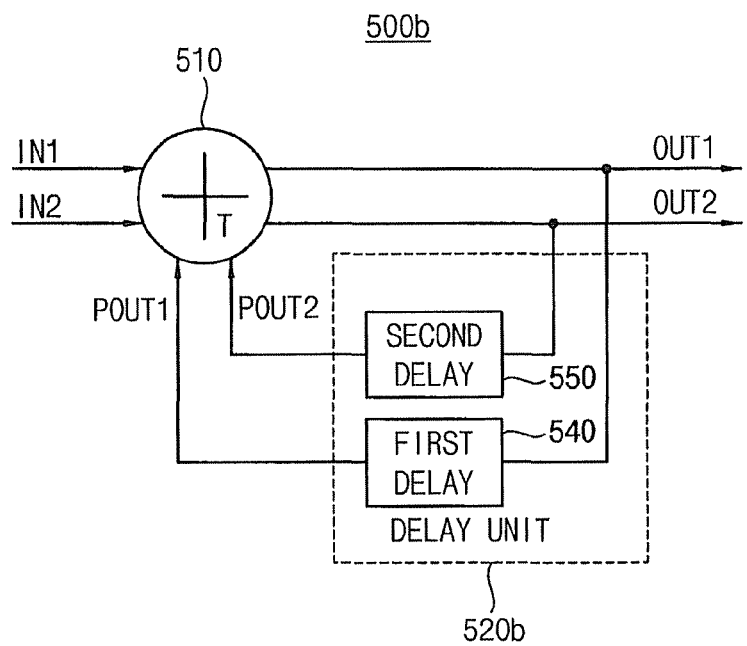
FIG. 21 is a block diagram illustrating a time difference accumulator according to example embodiments.

FIG. 21 is a block diagram illustrating a time difference accumulator according to example embodiments.

Referring to FIG. 21, a time difference accumulator 500b includes a first time difference adder 510 and a delay unit 520b. The time difference accumulator 500b of FIG. 21 may have a similar or substantially similar configuration and may perform a similar or substantially similar operation to a time difference accumulator 500a of FIG. 20, except for a configuration and an operation of the delay unit 520b.

The delay unit 520b may generate a first previous output signal POUT1 and a second previous output signal POUT2 by delaying a first output signal OUT1 and a second output signal OUT2, respectively. The delay unit 520b may include a first delay circuit 540 and a second delay circuit 550.

The first delay circuit 540 may generate the first previous output signal POUT1 by delaying the first output signal OUT1, and the second delay circuit 550 may generate the second previous output signal POUT2 by delaying the second output signal OUT2. A delay time of the first delay circuit 540 may be the same or substantially the same as a delay time of the second delay circuit 550. Accordingly, the first delay circuit 540 and the second delay circuit 550 may generate the first and second previous output signals POUT1 and POUT2 by delaying the first and second output signals OUT1 and OUT2 by the same or substantially the same delay times, respectively.

Figure 22:
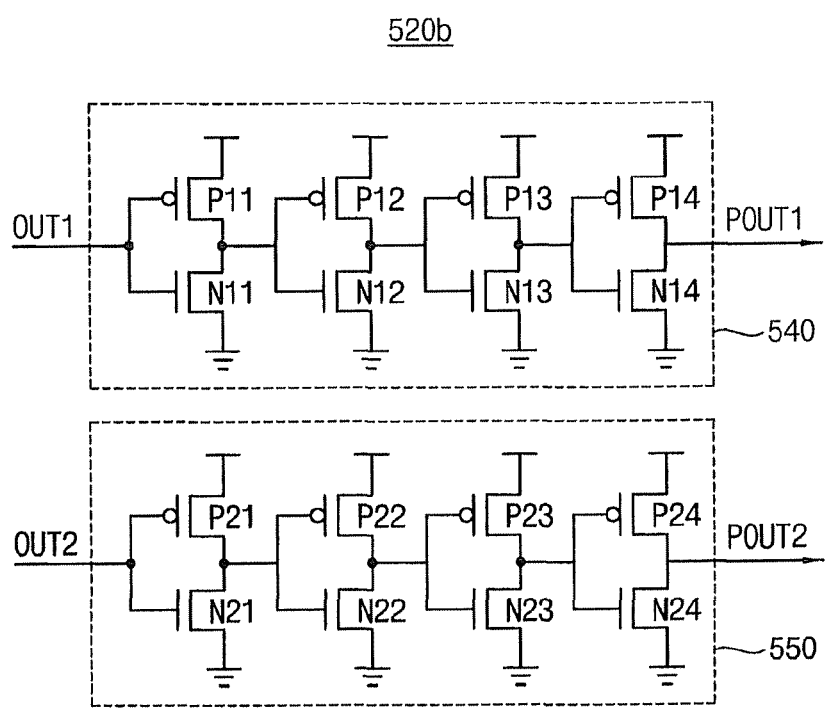
FIG. 22 is a circuit diagram illustrating an example of a delay unit included in the time difference accumulator of FIG. 21.
Figure 23:
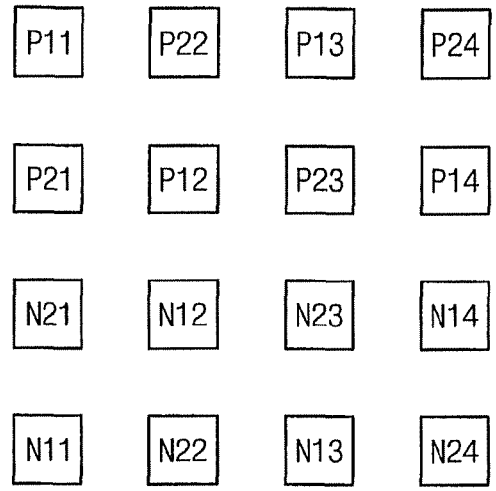
FIG. 23 is a diagram for describing an example of arrangement of transistors included in the delay unit of FIG. 22.

FIG. 22 is a circuit diagram illustrating an example of a delay unit included in a time difference accumulator of FIG. 21, and FIG. 23 is a diagram for describing an example of arrangement of transistors included in a delay unit of FIG. 22.

Referring to FIG. 22, a delay unit 520b may include a first delay circuit 540 and a second delay circuit 550. The first delay circuit 540 may include a plurality of inverters having a plurality of PMOS transistors P11, P12, P13 and P14 and a plurality of NMOS transistors N11, N12, N13 and N14. The second delay circuit 550 may include a plurality of inverters having a plurality of PMOS transistors P21, P22, P23 and P24 and a plurality of NMOS transistors N21, N22, N23 and N24. The first delay circuit 540 and the second delay circuit 550 may have the same or substantially the same number of the inverters, and may have the same or substantially the same delay time.

As illustrated in FIG. 23, the plurality of transistors P11, P12, P13, P14, N11, N12, N13 and N14 included in the first delay circuit 540 and the plurality of transistors P21, P22, P23, P24, N21, N22, N23 and N24 included in the second delay circuit 550 may be alternately arranged. For example, a first PMOS transistor P21 and a first NMOS transistor N21 of the second delay circuit 550 may be disposed between a first PMOS transistor P11 and a first NMOS transistor N11 of the first delay circuit 540, and a second PMOS transistor P12 and a second NMOS transistor N12 of the first delay circuit 540 may be disposed between a second PMOS transistor P22 and a second NMOS transistor N22 of the second delay circuit 550. Because the transistors of the first and second delay circuits 540 and 550 are alternately arranged, a mismatch between the first and second delay circuits 540 and 550 caused by a PVT variation may be reduced.

Figure 24:
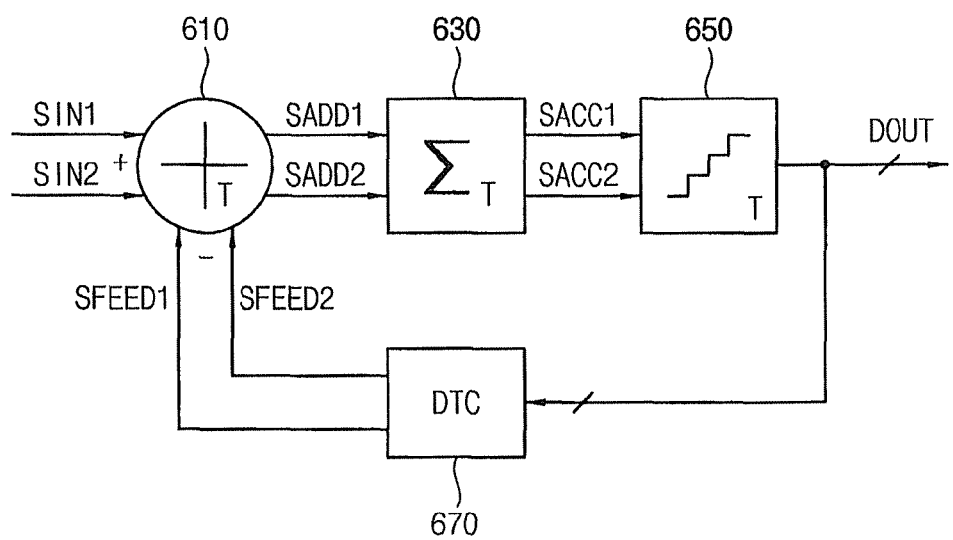
FIG. 24 is a block diagram illustrating a sigma-delta time-to-digital converter according to example embodiments.

FIG. 24 is a block diagram illustrating a sigma-delta time-to-digital converter according to example embodiments.

Referring to FIG. 24, a sigma-delta time-to-digital converter 600a includes a time difference adder 610, a time difference accumulator 630, a time domain quantizer 650 and a digital-to-time converter 670.

The time difference adder 610 may subtract a second time difference between a first feedback signal SFEED1 and a second feedback signal SFEED2 from a first time difference between a first input signal SIN1 and a second input signal SIN2 to generate a first addition signal SADD1 and a second addition signal SADD2 having a third time difference corresponding to the first time difference minus the second time difference. According to example embodiments, the time difference adder 610 may be implemented as a time difference adder 200a of FIG. 3, a time difference adder 200b of FIG. 10, a time difference adder 200c of FIG. 12, a time difference adder 200d of FIG. 18, or the like. For example, in a case where the time difference adder 610 is implemented as the time difference adder 200a of FIG. 3, the first input signal SIN1 may be applied to a first input terminal IN1 of a first time register 230 of FIG. 3, a second input signal SIN2 may be applied to a first offset delay unit 220 of FIG. 3, the first feedback signal SFEED1 may be applied to a second input terminal IN2 of a second time register 270 of FIG. 3, and the second feedback signal SFEED2 may be applied to a second offset delay unit 260 of FIG. 3. That is, the first feedback signal SFEED1 may correspond to a fourth input signal SIN4 of FIG. 3, and the second feedback signal SFEED2 may correspond to a third input signal SIN3 of FIG. 3. Thus, the time difference adder 610 may perform time difference subtraction that subtracts the second time difference the first and second feedback signals SFEED1 and SFEED2 from the first time difference between the first and second input signals SIN1 and SIN2.

The time difference accumulator 630 may accumulate the third time difference between the first addition signal SADD1 and the second addition signal SADD2 to generate a first accumulation signal SACC1 and a second accumulation signal SACC2. According to example embodiments, the time difference accumulator 630 may be implemented as a time difference accumulator 500a of FIG. 20, a time difference accumulator 500b of FIG. 21, or the like.

The time domain quantizer 650 may convert a time difference between the first accumulation signal SACC1 and the second accumulation signal SACC2 into a digital output signal DOUT. According to example embodiments, the digital output signal DOUT may be a signal of one bit having two levels, or alternatively may be a signal of two or more bits having three or more levels.

The digital-to-time converter 670 may convert the digital output signal DOUT into the first feedback signal SFEED1 and the second feedback signal SFEED2. For example, as a value of the digital output signal DOUT increases, the digital-to-time converter 670 may increase the second time difference between the first feedback signal SFEED1 and the second feedback signal SFEED2.

In the sigma-delta time-to-digital converter 600a according to example embodiments, the time difference adder 610 may output a difference (e.g., delta) between the first time difference and the second time difference, the time difference accumulator 630 may accumulate (e.g. sigma) such a difference, the time domain quantizer 650 may convert the accumulated difference into a digital value, and the digital-to-time converter 670 may convert the digital value into the second time difference. That is, for example, the sigma-delta time-to-digital converter 600a may perform a time-to-digital conversion in a sigma-delta manner by using the time difference adder 610, the time difference accumulator 630, the time domain quantizer 650 and the digital-to-time converter 670. Accordingly, the sigma-delta time-to-digital converter 600a according to example embodiments may have relatively high resolution.

Figure 25:
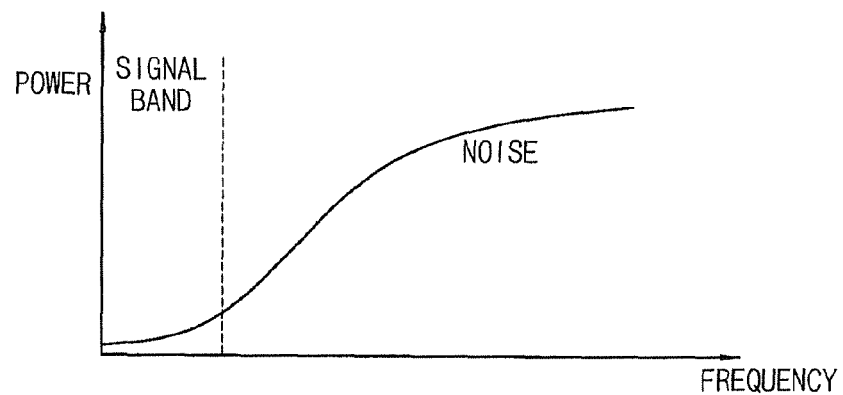
FIG. 25 is a diagram for describing noise shaping performed by the sigma-delta time-to-digital converter of FIG. 24.

FIG. 25 is a diagram for describing noise shaping performed by a sigma-delta time-to-digital converter of FIG. 24.

Referring to FIG. 25, a sigma-delta time-to-digital converter according to example embodiments may perform oversampling and noise shaping. Because the sigma-delta time-to-digital converter performs the oversampling, a quantization noise may be spread in a wide band, which results in a decrease of the quantization noise in a signal band. Further, because the sigma-delta time-to-digital converter performs the noise shaping, the quantization noise may be moved to an unused band. That is, for example, the sigma-delta time-to-digital converter may operate as a high pass filter with respect to the quantization noise, thereby moving the quantization noise to the unused band.

Accordingly, the sigma-delta time-to-digital converter according to example embodiments may reduce a noise, and may have relatively high resolution.

Figure 26:
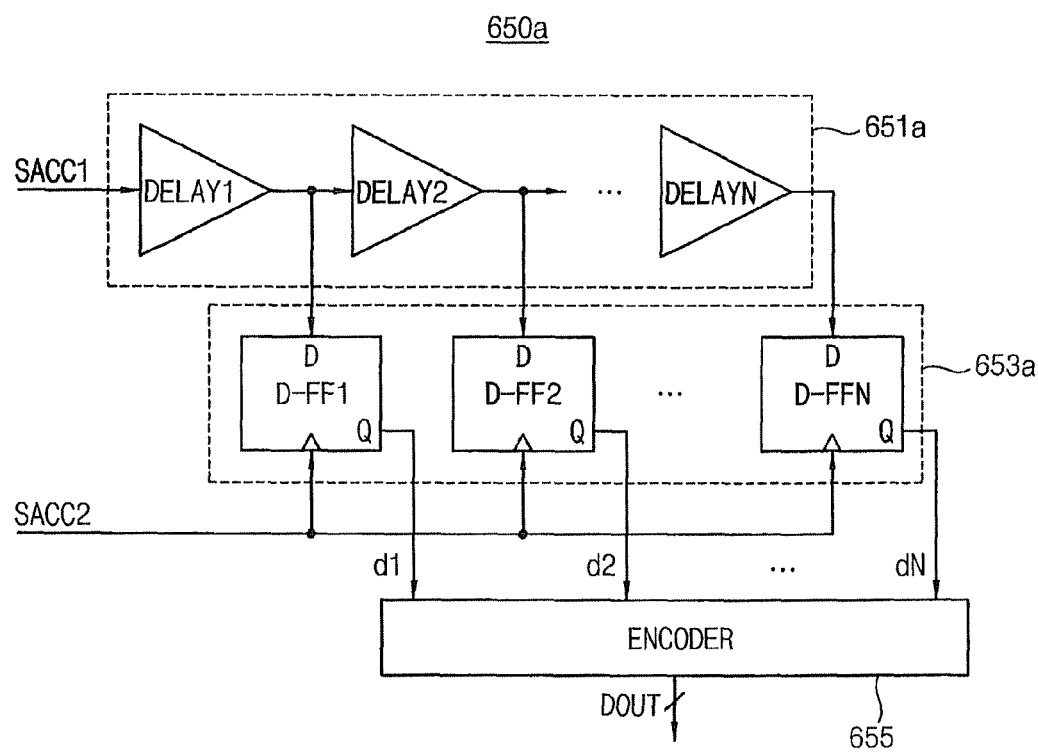
FIG. 26 is a block diagram illustrating an example embodiment of a time domain quantizer included in the sigma-delta time-to-digital converter of FIG. 24.

FIG. 26 is a block diagram illustrating an example of a time domain quantizer included in a sigma-delta time-to-digital converter of FIG. 24.

Referring to FIG. 26, a time domain quantizer 650a includes a delay line 651a, a plurality of D flip-flops 653a and an encoder 655.

The delay line 651a may include N delay cells DELAY1, DELAY2 and DELAYN that subsequently delay a first accumulation signal SACC1, where N is an integer greater than 0. Signals output from the delay cells DELAY1, DELAY2 and DELAYN may be applied to the D flip-flops 653a, respectively. The D flip-flops 653a may output N output signals d1, d2 and dN in response to a rising edge of a second accumulation signal SACC2. Accordingly, the number of the output signals d1, d2 and dN having a value of "1" may be determined according to a time difference between the first accumulation signal SACC1 and the second accumulation signal SACC2.

The encoder 655 may generate a digital output signal DOUT based on the output signals d1, d2 and dN of the D flip-flops 653a. For example, the encoder 655 may convert the output signals that are a thermometer code into the digital output signal DOUT that is a binary code.

Accordingly, the time domain quantizer 650a may generate the digital output signal DOUT corresponding to the time difference between the first accumulation signal SACC1 and the second accumulation signal SACC2.

Figure 27:
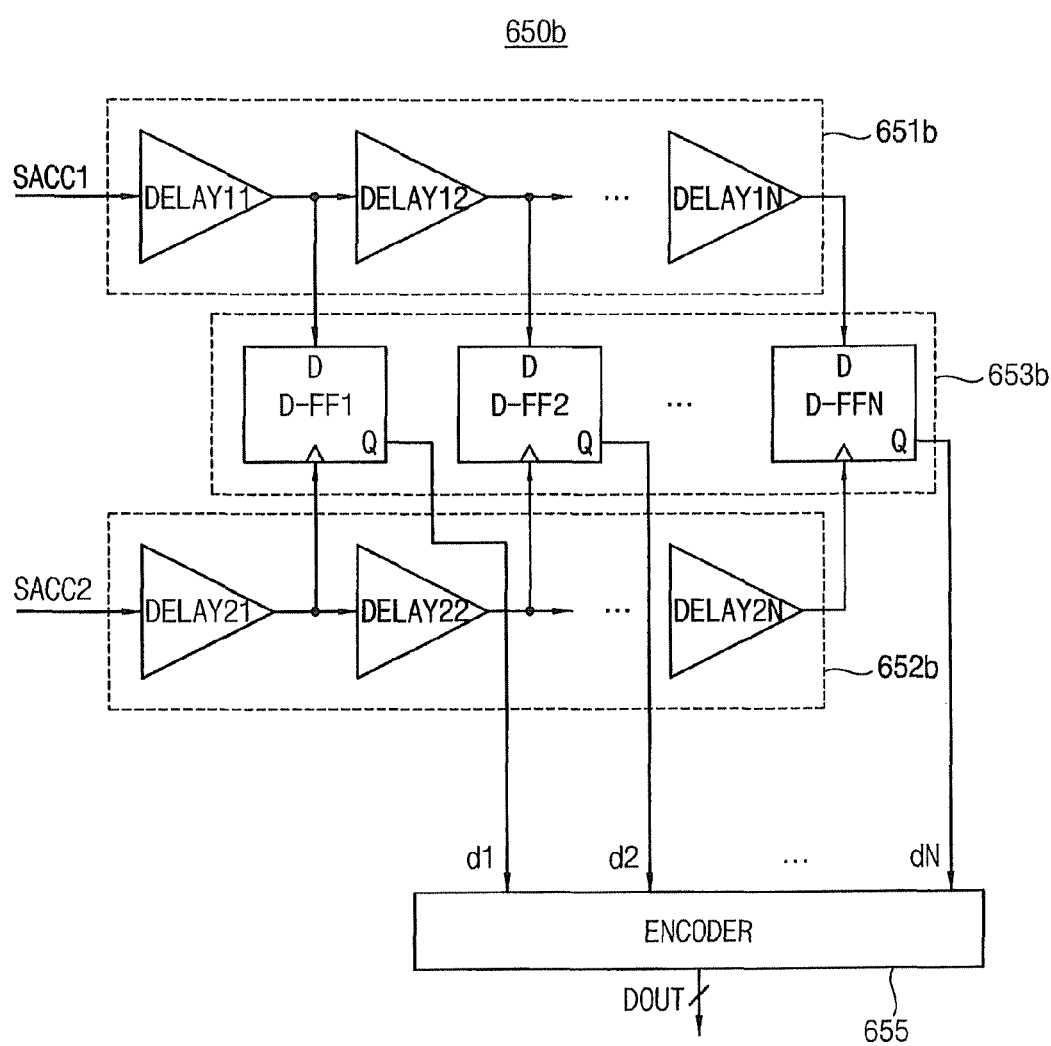
FIG. 27 is a block diagram illustrating another example embodiment of a time domain quantizer included in the sigma-delta time-to-digital converter of FIG. 24.

FIG. 27 is a block diagram illustrating another example of a time domain quantizer included in a sigma-delta time-to-digital converter of FIG. 24.

Referring to FIG. 27, a time domain quantizer 650b includes a first delay line 651b, a second delay line 652b, a plurality of D flip-flops 653b and an encoder 655.

The first delay line 651b may include N delay cells DELAY11, DELAY12 and DELAY that subsequently delay a first accumulation signal SACC1, where N is an integer greater than 0. The second delay line 652b may include N delay cells DELAY21, DELAY22 and DELAY2N that subsequently delay a second accumulation signal SACC2. Signals output from the first delay cells DELAY11, DELAY12 and DELAY1N may be applied to data terminals of the D flip-flops 653b, respectively, and signals output from the second delay cells DELAY21, DELAY22 and DELAY2N may be applied to clock terminals of the D flip-flops 653b, respectively. The D flip-flops 653b may output N output signals d1, d2 and dN in response to the signals output from the second delay cells DELAY21, DELAY22 and DELAY2N, respectively. Accordingly, the number of the output signals d1, d2 and dN having a value of "1" may be determined according to a time difference between the first accumulation signal SACC1 and the second accumulation signal SACC2.

In some example embodiments, a first delay time of each delay cell DELAY11, DELAY12 and DELAY1N included in the first delay line 651b may be longer than a second delay time of each delay cell DELAY21, DELAY22 and DELAY2N included in the second delay line 652b. Because a time difference may be converted into a digital value in a unit of time corresponding to a difference between the first delay time and the second delay time, the time domain quantizer 650b may have relatively high resolution.

The encoder 655 may generate a digital output signal DOUT based on the output signals d1, d2 and dN of the D flip-flops 653b.

Accordingly, the time domain quantizer 650b may generate the digital output signal DOUT corresponding to the time difference between the first accumulation signal SACC1 and the second accumulation signal SACC2.

Although FIGS. 26 and 27 illustrate examples of a time domain quantizer included in a signal-delta time-to-digital converter according to example embodiments, however, the time domain quantizer included in the signal-delta time-to-digital converter according to example embodiments may not be limited thereto.

Figure 28:
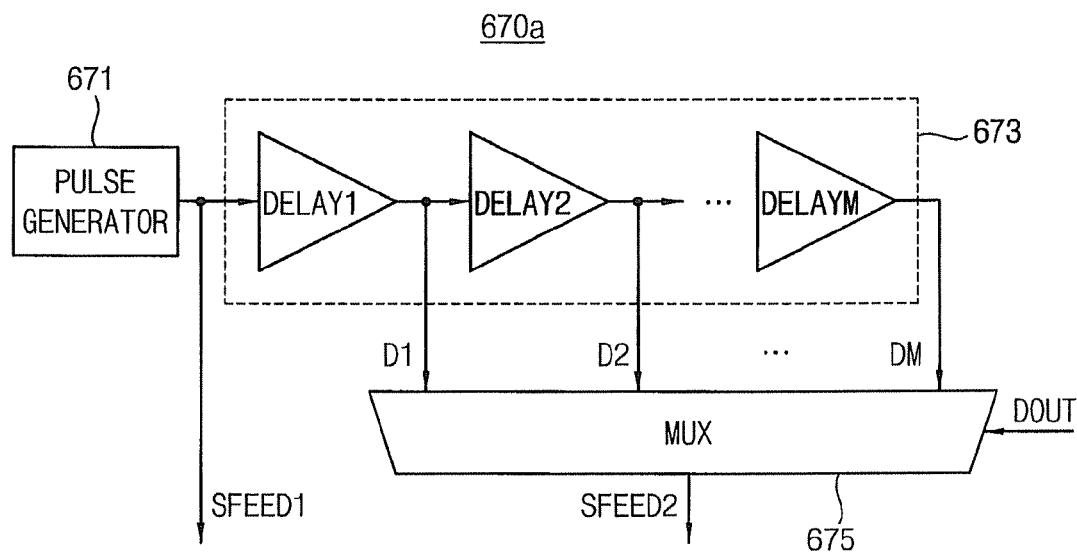
FIG. 28 is a block diagram illustrating an example embodiment of a digital-to-time converter included in the sigma-delta time-to-digital converter of FIG. 24.

FIG. 28 is a block diagram illustrating an example of a digital-to-time converter included in a sigma-delta time-to-digital converter of FIG. 24.

Referring to FIG. 28, a digital-to-time converter 670a includes a pulse generator 671, a delay line 673 and a multiplexer 675.

The pulse generator 671 may generate a pulse, and may output the pulse as a first feedback signal SFEED1. The delay line 673 may include M delay cells DELAY1, DELAY2 and DELAYM that subsequently delay the pulse, where M is an integer greater than 0. The multiplexer 675 may output one of output signals D1, D2 and DM output from the delay cells DELAY1, DELAY2 and DELAYM as a second feedback signal SFEED2 in response to a digital output signal DOUT. Accordingly, the digital-to-time converter 670a may generate the first and second feedback signals SFEED1 and SFEED2 having a time difference corresponding to the digital output signal DOUT.

Figure 29:
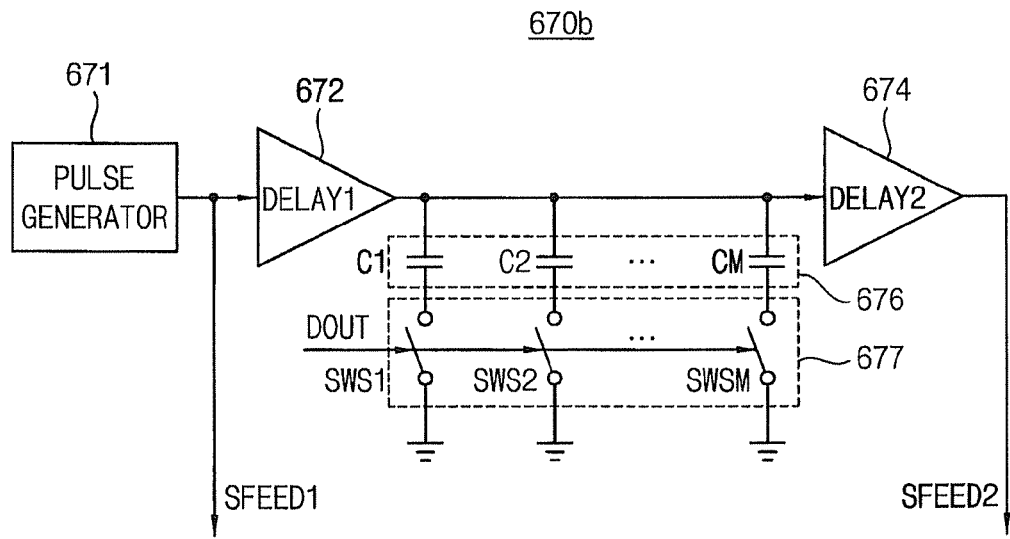
FIG. 29 is a block diagram illustrating another example embodiment of a digital-to-time converter included in the sigma-delta time-to-digital converter of FIG. 24.

FIG. 29 is a block diagram illustrating another example of a digital-to-time converter included in a sigma-delta time-to-digital converter of FIG. 24.

Referring to FIG. 29, a digital-to-time converter 670b includes a pulse generator 671, a first delay cell 672, a second delay cell 674, M capacitors C1, C2 and CM, and M switches SWS1, SWS2 and SWSM.

The pulse generator 671 may generate a pulse, and may output the pulse as a first feedback signal SFEED1. The first delay cell 672 and the second delay cell 674 may delay the pulse, and may output the delayed pulse as a second feedback signal SFEED2. The M capacitors C1, C2 and CM may be coupled to a node between the first delay cell 672 and the second delay cell 674, and may be coupled to a ground voltage through the M switches SWS1, SWS2 and SWSM, where M is an integer greater than 0. The M switches SWS1, SWS2 and SWSM may be selectively turned on or off in response to a digital output signal DOUT, and the M capacitors C1, C2 and CM may be selectively electrically coupled to the first and second delay cell 672 and 674 by the M switches SWS1, SWS2 and SWSM. Thus, a delay time of the first and second delay cell 672 and 674 may be adjusted by adjusting a capacitance of the capacitors C1, C2 and CM coupled to the first and second delay cell 672 and 674 based on the digital output signal DOUT. Accordingly, the digital-to-time converter 670b may generate the first and second feedback signals SFEED1 and SFEED2 having a time difference corresponding to the digital output signal DOUT.

Although FIGS. 28 and 29 illustrate examples of a digital-to-time converter included in a signal-delta time-to-digital converter according to example embodiments, however, the digital-to-time converter included in the signal-delta time-to-digital converter according to example embodiments may not be limited thereto.

Figure 30:
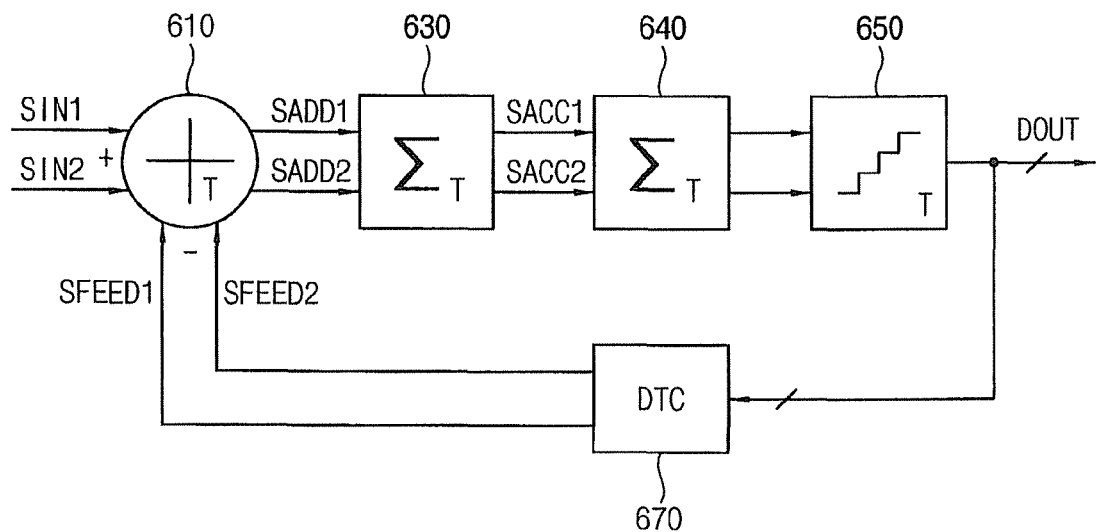
FIG. 30 is a block diagram illustrating a sigma-delta time-to-digital converter according to example embodiments.

FIG. 30 is a block diagram illustrating a sigma-delta time-to-digital converter according to example embodiments.

Referring to FIG. 30, a sigma-delta time-to-digital converter 600b includes a time difference adder 610, a first time difference accumulator 630, a second time difference accumulator 640, a time domain quantizer 650 and a digital-to-time converter 670. Compared with a sigma-delta time-to-digital converter 600a of FIG. 24, the sigma-delta time-to-digital converter 600b may further include the second time difference accumulator 640.

The first time difference accumulator 630 and the second time difference accumulator 640 may form a second-order accumulator, and the sigma-delta time-to-digital converter 600b may be a second-order sigma-delta time-to-digital converter. Although FIG. 30 illustrates an example of the second-order sigma-delta time-to-digital converter 600b, in some example embodiments, the sigma-delta time-to-digital converter 600b may be a third (or more) order time-to-digital converter.

The sigma-delta time-to-digital converter 600b according to example embodiments may further reduce a quantization noise in a signal band by including a second (or more) order accumulator.

Figure 31:
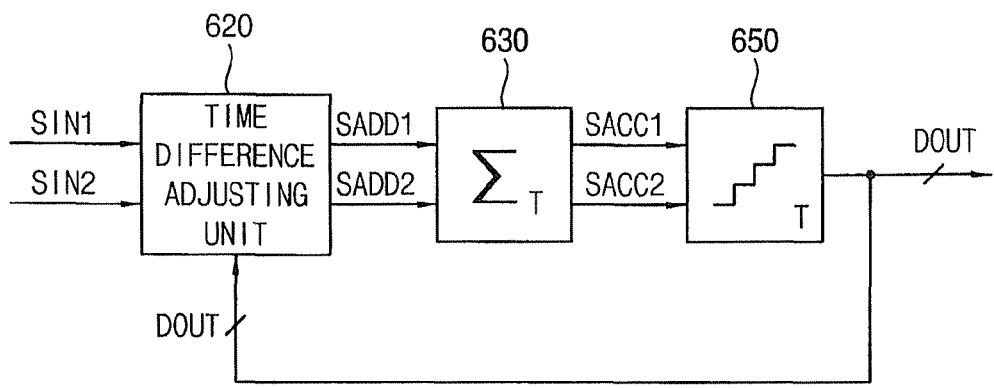
FIG. 31 is a block diagram illustrating a sigma-delta time-to-digital converter according to example embodiments.

FIG. 31 is a block diagram illustrating a sigma-delta time-to-digital converter according to example embodiments.

Referring to FIG. 31, a sigma-delta time-to-digital converter 600c includes a time difference adjusting unit 620, a time difference accumulator 630 and a time domain quantizer 650. Compared with a sigma-delta time-to-digital converter 600a of FIG. 24, the sigma-delta time-to-digital converter 600c may include the time difference adjusting unit 620 instead of a time difference adder 610 and a digital-to-time converter 670.

The time difference adjusting unit 620 may receive a first input signal SIN1, a second input signal SIN2 and a digital output signal DOUT, and may generate a first addition signal SADD1 and a second addition signal SADD2 by delaying one of the first input signal SIN1 and the second input signal SIN2 by a delay time corresponding to the digital output signal DOUT. The time difference adjusting unit 620 may generate the first and second addition signals SADD1 and SADD2 having a time difference corresponding to a first time difference between the first and second input signals SIN1 and SIN2 minus a second time difference represented by the digital output signal DOUT.

The time difference accumulator 630 may accumulate the time difference between the first addition signal SADD1 and the second addition signal SADD2 to generate a first accumulation signal SACC1 and a second accumulation signal SACC2. The time domain quantizer 650 may convert a time difference between the first accumulation signal SACC1 and the second accumulation signal SACC2 into the digital output signal DOUT.

In the sigma-delta time-to-digital converter 600c according to example embodiments, the time difference adjusting unit 620 may output a difference (e.g., delta) between the first time difference and the second time difference, the time difference accumulator 630 may accumulate (e.g. sigma) such a difference, and the time domain quantizer 650 may convert the accumulated difference into a digital value. That is, the sigma-delta time-to-digital converter 600c may perform a time-to-digital conversion in a sigma-delta manner by using the time difference adjusting unit 620, the time difference accumulator 630 and the time domain quantizer 650. Accordingly, the sigma-delta time-to-digital converter 600c according to example embodiments may have relatively high resolution.

Figure 32:
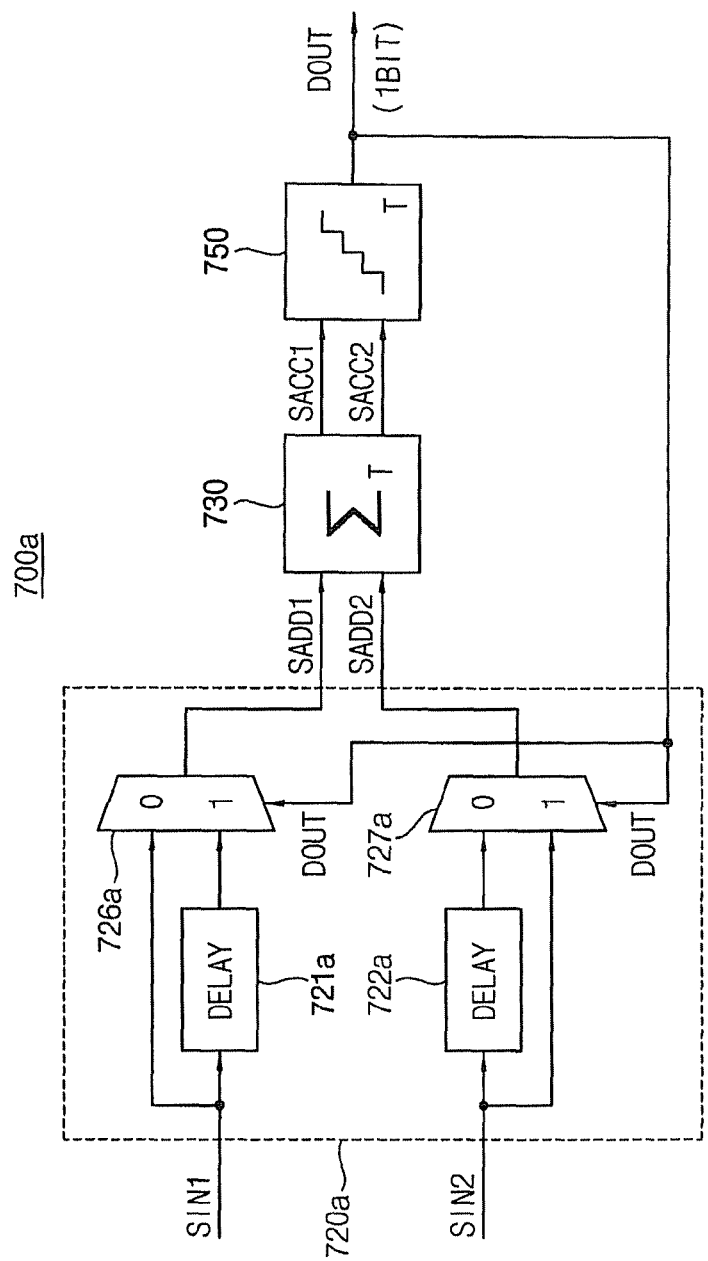
FIG. 32 is a block diagram illustrating an example embodiment of the sigma-delta time-to-digital converter of FIG. 31.

FIG. 32 is a block diagram illustrating an example of a sigma-delta time-to-digital converter of FIG. 31.

Referring to FIG. 32, a sigma-delta time-to-digital converter 700a includes a time difference adjusting unit 720a, a time difference accumulator 730 and a time domain quantizer 750. The sigma-delta time-to-digital converter 700a may output a digital output signal DOUT having one bit.

The time difference adjusting unit 720a may include a first delay unit 721a, a first selector 726a, a second delay unit 722a and a second selector 727a. The first delay unit 721a may delay a first input signal SIN1, and the first selector 726a may selectively output the first input signal SIN1 or an output signal of the first delay unit 721a as a first addition signal SADD1 in response to the digital output signal DOUT. The second delay unit 722a may delay a second input signal SIN2, and the second selector 727a may selectively output the second input signal SIN2 or an output signal of the second delay unit 722a as a second addition signal SADD2 in response to the digital output signal DOUT.

For example, if the digital output signal DOUT has a value of "0", the first selector 726a may output the first input signal SIN1 as the first addition signal SADD1, and the second selector 727a may output the output signal of the second delay unit 722a that is delayed by a delay time with respect to the second input signal SIN2 as the second addition signal SADD2. Thus, the time difference adjusting unit 720a may generate the first and second addition signals SADD1 and SADD2 having a time difference longer than a time difference between the first and second input signals SIN1 and SIN2 in response to the digital output signal DOUT having the value of 0.

If the digital output signal DOUT has a value of "1", the first selector 726a may output the output signal of the first delay unit 721a that is delayed by the delay time with respect to the first input signal SIN1 as the first addition signal SADD1, and the second selector 727a may output the second input signal SIN2 as the second addition signal SADD2. Thus, the time difference adjusting unit 720a may generate the first and second addition signals SADD1 and SADD2 having a time difference shorter than the time difference between the first and second input signals SIN1 and SIN2 in response to the digital output signal DOUT having the value of 1.

Accordingly, the time difference adjusting unit 720a may adjust the time difference between the first and second input signals SIN1 and SIN2 based on the value of the digital output signal DOUT, and may generate the first and second addition signals SADD1 and SADD2 having the adjusted time difference. That is, for example, the time difference adjusting unit 720a may generate the first and second addition signals SADD1 and SADD2 having the adjusted time difference corresponding to the time difference between the first and second input signals SIN1 and SIN2 minus a time difference represented by the digital output signal DOUT.

The time difference accumulator 730 may accumulate the time difference between the first addition signal SADD1 and the second addition signal SADD2 to generate a first accumulation signal SACC1 and a second accumulation signal SACC2. The time domain quantizer 750 may convert a time difference between the first accumulation signal SACC1 and the second accumulation signal SACC2 into the digital output signal DOUT.

As described above, the sigma-delta time-to-digital converter 700a may perform a time-to-digital conversion in a sigma-delta manner by using the time difference adjusting unit 720a, the time difference accumulator 730 and the time domain quantizer 750. Accordingly, the sigma-delta time-to-digital converter 700a according to example embodiments may have relatively high resolution.

Although FIG. 32 illustrates an example where the time difference adjusting unit 720a includes the delay units 721a and 722a and the selectors 726a and 727a in both of a path of the first input signal SIN1 and a path of the second input signal SIN2, according to example embodiments, the time difference adjusting unit 720a may include a delay unit and a selector in only one of the path of the first input signal SIN1 and the path of the second input signal SIN2.

Figure 33:
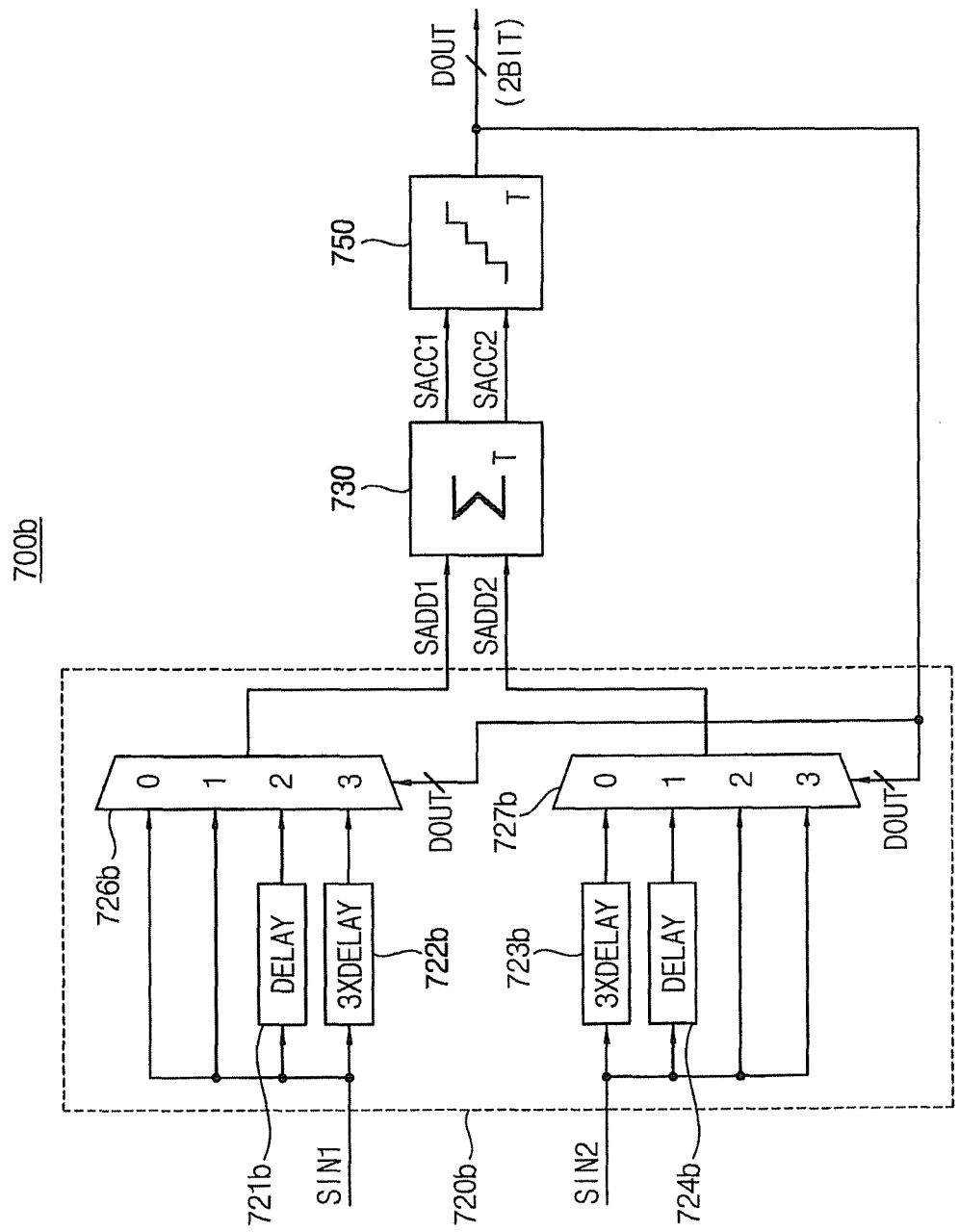
FIG. 33 is a block diagram illustrating another example embodiment of the sigma-delta time-to-digital converter of FIG. 31.

FIG. 33 is a block diagram illustrating another example of a sigma-delta time-to-digital converter of FIG. 31.

Referring to FIG. 33, a sigma-delta time-to-digital converter 700b includes a time difference adjusting unit 720b, a time difference accumulator 730 and a time domain quantizer 750. The sigma-delta time-to-digital converter 700b may output a digital output signal DOUT having two bits.

The time difference adjusting unit 720b may include a first delay unit 721b, a second delay unit 722b, a first selector 726b, a third delay unit 723b, a fourth delay unit 724b and a second selector 727b. The first delay unit 721b may delay a first input signal SIN1 by a first delay time, the second delay unit 722b may delay the first input signal SIN1 by a second delay time, and the first selector 726b may selectively output the first input signal SIN1, an output signal of the first delay unit 721b or an output signal of the second delay unit 722b as a first addition signal SADD1 in response to the digital output signal DOUT. For example, the second delay time may be about three times as long as the first delay time. The third delay unit 723b may delay a second input signal SIN2 by the second delay time, the fourth delay unit 724b may delay the second input signal SIN2 by the first delay time, and the second selector 727b may selectively output the second input signal SIN2, an output signal of the third delay unit 723b or an output signal of the fourth delay unit 724b as a second addition signal SADD2 in response to the digital output signal DOUT.

For example, if the digital output signal DOUT has a value of "0", the first selector 726b may output the first input signal SIN1 as the first addition signal SADD1, and the second selector 727b may output the output signal of the third delay unit 723b that is delayed by the second delay time with respect to the second input signal SIN2 as the second addition signal SADD2. If the digital output signal DOUT has a value of "1", the first selector 726b may output the first input signal SIN1 as the first addition signal SADD1, and the second selector 727b may output the output signal of the fourth delay unit 724b that is delayed by the first delay time with respect to the second input signal SIN2 as the second addition signal SADD2. If the digital output signal DOUT has a value of "2", the first selector 726b may output the output signal of the first delay unit 721b that is delayed by the first delay time with respect to the first input signal SIN1 as the first addition signal SADD1, and the second selector 727b may output the second input signal SIN2 as the second addition signal SADD2. If the digital output signal DOUT has a value of "3", the first selector 726b may output the output signal of the second delay unit 722b that is delayed by the second delay time with respect to the first input signal SIN1 as the first addition signal SADD1, and the second selector 727b may output the second input signal SIN2 as the second addition signal SADD2.

Accordingly, the time difference adjusting unit 720b may adjust the time difference between the first and second input signals SIN1 and SIN2 based on the value of the digital output signal DOUT, and may generate the first and second addition signals SADD1 and SADD2 having the adjusted time difference. That is, for example, the time difference adjusting unit 720b may generate the first and second addition signals SADD1 and SADD2 having the adjusted time difference corresponding to the time difference between the first and second input signals SIN1 and SIN2 minus a time difference represented by the digital output signal DOUT.

As described above, the sigma-delta time-to-digital converter 700b may perform a time-to-digital conversion in a sigma-delta manner by using the time difference adjusting unit 720b, the time difference accumulator 730 and the time domain quantizer 750. Accordingly, the sigma-delta time-to-digital converter 700b according to example embodiments may have relatively high resolution.

Although FIG. 33 illustrates an example where the time difference adjusting unit 720b includes the delay units 721b, 722b, 723b and 724b and the selectors 726b and 727b in both of a path of the first input signal SIN1 and a path of the second input signal SIN2, according to example embodiments, the time difference adjusting unit 720b may include a delay unit and a selector in only one of the path of the first input signal SIN1 and the path of the second input signal SIN2.

Figure 34:
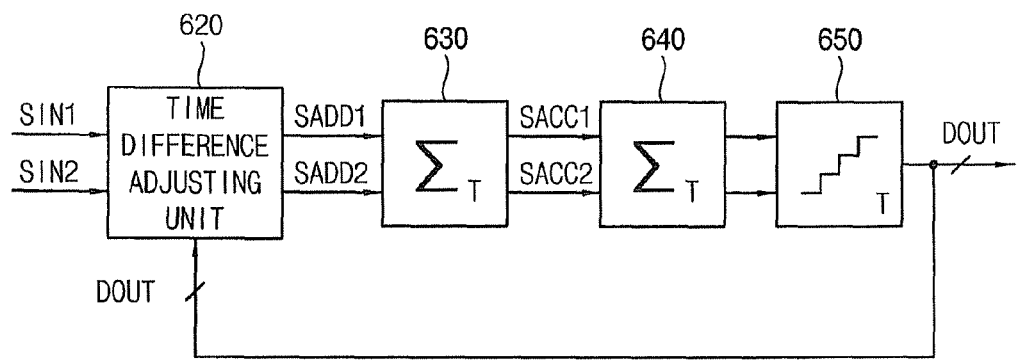
FIG. 34 is a block diagram illustrating a sigma-delta time-to-digital converter according to example embodiments.

FIG. 34 is a block diagram illustrating a sigma-delta time-to-digital converter according to example embodiments.

Referring to FIG. 34, a sigma-delta time-to-digital converter 600d includes a time difference adjusting unit 620, a first time difference accumulator 630, a second time difference accumulator 640 and a time domain quantizer 650. Compared with a sigma-delta time-to-digital converter 600c of FIG. 31, the sigma-delta time-to-digital converter 600d may further include the second time difference accumulator 640.

The first time difference accumulator 630 and the second time difference accumulator 640 may form a second-order accumulator, and the sigma-delta time-to-digital converter 600d may be a second-order sigma-delta time-to-digital converter. Although FIG. 34 illustrates an example of the second-order sigma-delta time-to-digital converter 600d, in some example embodiments, the sigma-delta time-to-digital converter 600d may be a third (or more) order time-to-digital converter.

The sigma-delta time-to-digital converter 600d according to example embodiments may further reduce a quantization noise in a signal band by including a second (or more) order accumulator.

Figure 35:
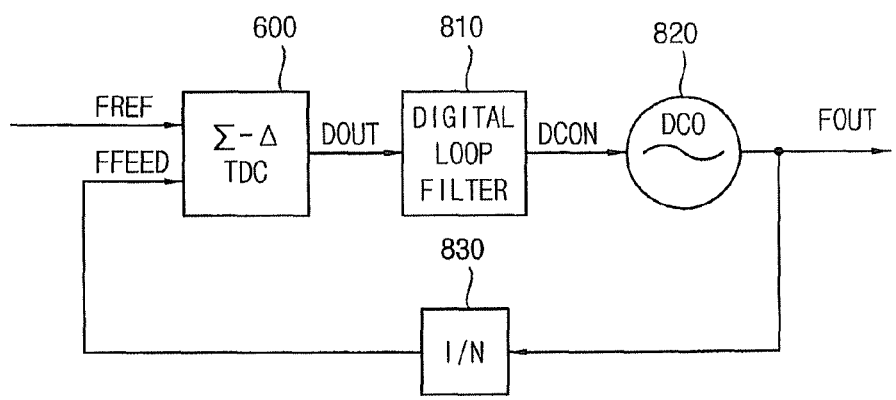
FIG. 35 is a block diagram illustrating a digital phase locked loop according to example embodiments.

FIG. 35 is a block diagram illustrating a digital phase locked loop according to example embodiments.

Referring to FIG. 35, a digital phase locked loop 800 includes a sigma-delta time-to-digital converter 600, a digital loop filter 810, a digitally controlled oscillator 820 and a divider 830.

The sigma-delta time-to-digital converter 600 may include a time difference adder, a time difference accumulator, a time domain quantizer and a digital-to-time converter. The sigma-delta time-to-digital converter 600 may generate a digital time difference signal DOUT corresponding to a time difference between a reference input signal FREF and a feedback signal FFEED. The sigma-delta time-to-digital converter 600 may have relatively high resolution by converting the time difference into a digital value in a sigma-delta manner. According to example embodiments, the reference input signal FREF may be a wired or wireless signal received from an external circuit or device, or may be an oscillation signal generated by an oscillator located inside or outside the digital phase locked loop 800. For example, the reference input signal FREF may be the oscillation signal generated by a crystal oscillator.

According to example embodiments, the sigma-delta time-to-digital converter 600 may be implemented as a sigma-delta time-to-digital converter 600a of FIG. 24, a sigma-delta time-to-digital converter 600b of FIG. 230, a sigma-delta time-to-digital converter 600c of FIG. 31, a sigma-delta time-to-digital converter 600d of FIG. 31, or the like.

The digital loop filter 810 may generate a digital control signal DCON by filtering the digital time difference signal DOUT. The digital loop filter 810 may be implemented as a low pass filter. For example the digital loop filter 810 may have the following transfer function:

$$\alpha + \beta * z - 1/(1-z-1).$$

The digitally controlled oscillator 820 may generate an output signal FOUT having a desired frequency in response to the digital control signal DCON. For example, the digitally controlled oscillator 820 may increase or decrease the frequency of the output signal FOUT in response to the digital control signal DCON.

The divider 830 may generate the feedback signal FFEED by dividing the output signal FOUT. In some example embodiments, the digital phase locked loop 800 may not include the divider 830. In this case, the sigma-delta time-to-digital converter 600 may receive the output signal FOUT as the feedback signal FFEED.

Because the digital phase locked loop 800 includes the sigma-delta time-to-digital converter 600 having relatively high resolution, the digital phase locked loop 800 may have an improved jitter performance, and may more accurately generate the output signal FOUT having the desired frequency even in a relatively low power supply voltage environment. The digital phase locked loop 800 according to example embodiments may be used in frequency synthesis, clock recovery, clock generation, spread spectrum, clock distribution, de-skewing, jitter and noise reduction, etc.

Figure 36:
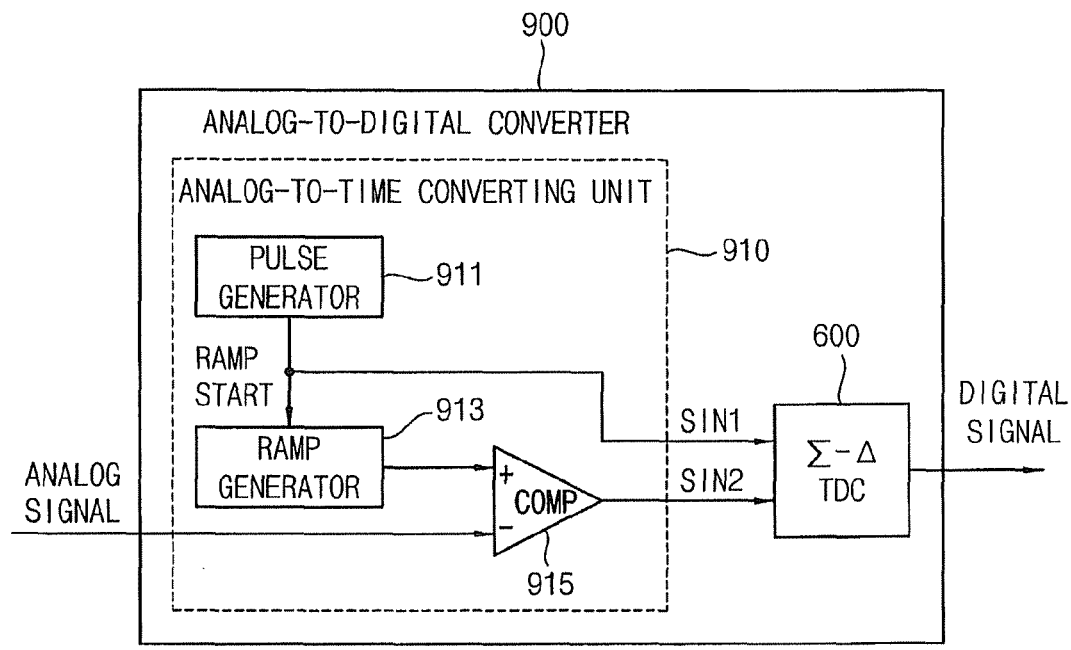
FIG. 36 is a block diagram illustrating an analog-to-digital converter including a sigma-delta time-to-digital converter according to example embodiments.

FIG. 36 is a block diagram illustrating an analog-to-digital converter including a sigma-delta time-to-digital converter according to example embodiments.

Referring to FIG. 36, an analog-to-digital converter 900 includes an analog-to-time converting unit 910 and a sigma-delta time-to-digital converter 600.

The analog-to-time converting unit 910 may convert an analog signal into first and second input signals SIN1 and SIN2 having a time difference corresponding to a level of the analog signal.

For example, the analog-to-time converting unit 910 may include a pulse generator 911, a ramp generator 913 and a comparator 915. The pulse generator 911 may generate a pulse, may provide the ramp generator 913 with the pulse as a ramp start signal, and may provide the sigma-delta time-to-digital converter 600 with the pulse as a first input signal SIN1. The ramp generator 913 may output a ramp signal to the comparator 915 in response to the ramp start signal. The comparator 915 may generate a second input signal SIN2 having a rising edge at a time point corresponding to the level of the analog signal by comparing the ramp signal with the analog signal.

The sigma-delta time-to-digital converter 600 may generate a digital signal corresponding to a time difference between the first and second input signals SIN1 and SIN2. The sigma-delta time-to-digital converter 600 may have relatively high resolution by converting the time difference into a digital value in a sigma-delta manner.

Since the analog-to-digital converter 900 includes the sigma-delta time-to-digital converter 600 having relatively high resolution, the analog-to-digital converter 900 according to example embodiments may more accurately convert the analog signal into the digital signal even in a relatively low power supply voltage environment.

Figure 37:
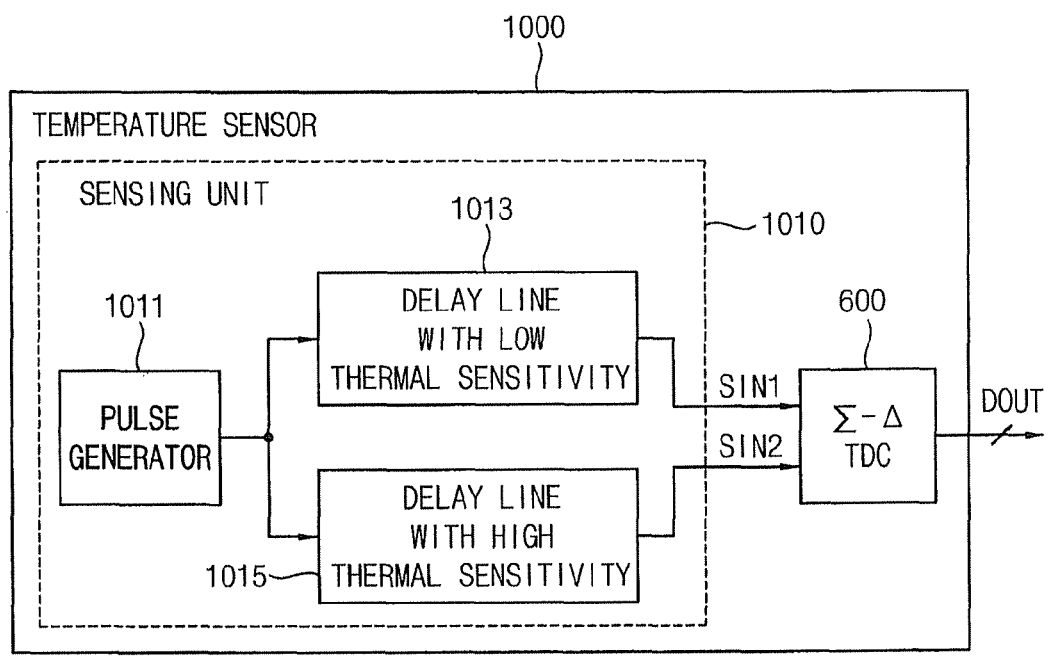
FIG. 37 is a block diagram illustrating a sensor including a sigma-delta time-to-digital converter according to example embodiments.

FIG. 37 is a block diagram illustrating a sensor including a sigma-delta time-to-digital converter according to example embodiments.

Referring to FIG. 37, a sensor 1000 includes a sensing unit 1010 and a sigma-delta time-to-digital converter 600.

The sensing unit 1010 may sense a physical quantity, such as temperature, velocity, mass, intensity of light, etc., and may generate first and second input signals SIN1 and SIN2 having a time difference corresponding to the physical quantity.

For example, in a case where the sensor 1000 is a temperature sensor, the sensing unit 1010 may include a pulse generator 1011, a temperature insensitive delay line 1013 (or a delay line with low thermal sensitivity) and a temperature sensitive delay line 1015 (or a delay line with high thermal sensitivity). The pulse generator 1011 may generate a pulse, and may provide the pulse to the temperature insensitive delay line 1013 and the temperature sensitive delay line 1015. The temperature insensitive delay line 1013 may delay the pulse by a delay time that is constant or substantially constant regardless or independent of a temperature, and may output the delayed pulse as a first input signal SIN1. The temperature sensitive delay line 1015 may delay the pulse by a delay time that is adjusted according to the temperature, and may output the delayed pulse as a second input signal SIN2. Thus, a time difference of the first input signal SIN1 and the second input signal SIN2 may be determined according to the temperature.

The sigma-delta time-to-digital converter 600 may generate a digital output signal DOUT corresponding to the time difference between the first and second input signals SIN1 and SIN2. The sigma-delta time-to-digital converter 600 may have relatively high resolution by converting the time difference into a digital value in a sigma-delta manner. For example, in a case where the sensor 1000 is the temperature sensor, the sigma-delta time-to-digital converter 600 may generate the digital output signal DOUT corresponding to a sensed temperature.

Since the sensor 1000 includes the sigma-delta time-to-digital converter 600 having relatively high resolution, the sensor 1000 according to example embodiments may accurately generate the digital output signal DOUT corresponding to a sensed physical quantity even in a relatively low power supply voltage environment.

Figure 38:
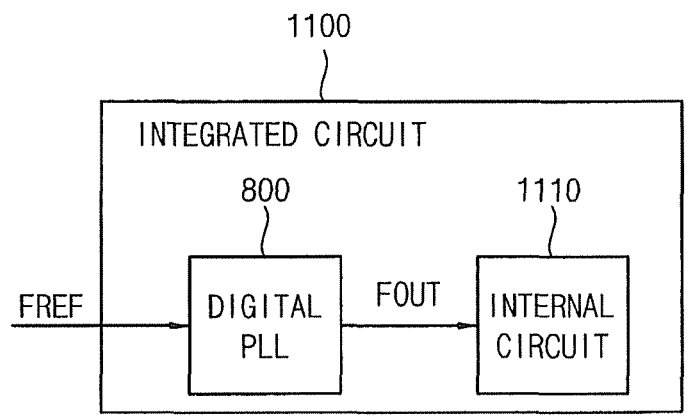
FIG. 38 is a block diagram illustrating an integrated circuit including a digital phase locked loop according to example embodiments.

FIG. 38 is a block diagram illustrating an integrated circuit including a digital phase locked loop according to example embodiments.

Referring to FIG. 38, an integrated circuit 1100 includes a digital phase locked loop 800 and an internal circuit 1110. According to example embodiments, the integrated circuit

1100 may be an application processor (AP), a microprocessor, a central processing unit (CPU), an application-specific integrated circuit (ASIC), a mobile system-on-chip (SOC), a multimedia SOC, a smart card, or the like.

The digital phase locked loop 800 may generate an output signal FOUT having a desired frequency or phase based on a reference input signal FREF. According to example embodiments, the reference input signal FREF may be a wired or wireless signal received from an external circuit or device, or may be an oscillation signal generated by an oscillator located inside or outside the digital phase locked loop 800. The digital phase locked loop 800 may include a sigma-delta time-to-digital converter that performs a time-to-digital conversion in a sigma-delta manner. Accordingly, the digital phase locked loop 800 may have an improved jitter performance, and may accurately generate the output signal FOUT having the desired frequency even in a relatively low power supply voltage environment. The digital phase locked loop 800 according to example embodiments may be used in frequency synthesis, clock recovery, clock generation, spread spectrum, clock distribution, de-skewing, jitter and noise reduction, etc. The internal circuit 1110 may operate based on the output signal FOUT. For example, the internal circuit 1110 may use the output signal FOUT as a clock signal for operating the internal circuit 1110.

Figure 39:
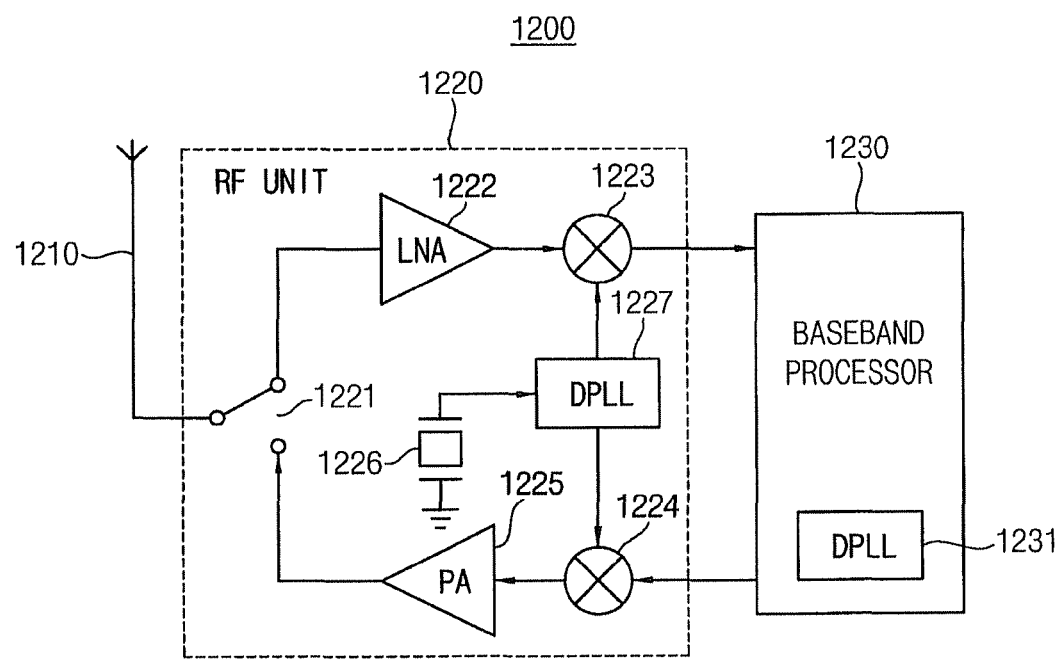
FIG. 39 is a block diagram illustrating a transceiver including a digital phase locked loop according to example embodiments.

FIG. 39 is a block diagram illustrating a transceiver including a digital phase locked loop according to example embodiments.

Referring to FIG. 39, a transceiver 1200 includes an antenna 1210, a radio frequency (RF) unit 1220 and a baseband processor 1230.

The RF unit 1220 may convert a wireless signal received through the antenna 1210 into a baseband signal to provide the baseband processor 1230 with the baseband signal, and may convert a baseband signal provided from the baseband processor 1230 into a wireless signal to transmit the wireless signal through the antenna 1210. In some example embodiments, the RF unit 1220 may directly (or alternatively indirectly) convert the received wireless signal into the baseband signal. In other example embodiments, the RF unit 1220 may first convert the received wireless signal into an intermediate frequency (IF) signal, and then may convert the IF signal into the baseband signal. In some example embodiments, the RF unit 1220 may convert the received wireless signal into an in-phase baseband signal and a quadrature baseband signal.

For example, the RF unit 1220 may include a switch 1221, a low noise amplifier (LNA) 1222, a reception mixer 1223, a transmission mixer 1224, a power amplifier (PA) 1225, a local oscillator (LO) 1226 and a first digital phase locked loop 1227. In some example embodiments, the RF unit 1220 may further include a filter for removing a noise or an out-of-band component of the received wireless signal or for removing an out-of-band spurious component of the wireless signal to be transmitted. According to example embodiments, the RF unit 1220 may further include a variable gain amplifier, a low pass filter, etc.

The switch 1221 may selectively couple the antenna 1210 to a reception path or a transmission path. The LNA 1222 may have a relatively low noise figure to reduce an influence of a noise, and may amplify the wireless signal received through the antenna 1210. The reception mixer 1223 may down-convert the wireless signal amplified by the LNA 1222 into the baseband signal by mixing the wireless signal with an output signal of the first digital phase locked loop 1227. The transmission mixer 1224 may up-convert a baseband signal provided from the baseband processor 1230 into a wireless signal by mixing the baseband signal with the output signal of the first digital phase locked loop 1227. The PA 1225 may amplify the wireless signal that is up-converted by the transmission mixer 1224 such that a wireless signal transmitted through the antenna 1210 has a power greater than a given, desired or predetermined power.

The LO 1226 may generate an oscillation signal. For example, the LO 1226 may include a crystal oscillator. The first digital phase locked loop 1227 may generate an output signal having a desired frequency based on the oscillation signal provided from the LO 1226. The first digital phase locked loop 1227 may include a sigma-delta time-to-digital converter that performs a time-to-digital conversion in a sigma-delta manner, and thus, may more accurately generate the output signal having the desired frequency even in a relatively low power supply voltage environment.

The baseband processor 1230 may perform data processing based on the baseband signal received from the RF unit 1220, and may generate a baseband signal to be transmitted to provide the RF unit 1220 with the baseband signal to be transmitted. For example, the baseband processor 1230 may include a physical layer processor (PHY) for generating a data stream by demodulating a baseband signal received from the RF unit 1220 and for generating the baseband signal to be provided to the RF unit 1220 by modulating a data steam. According to example embodiments, the PHY may include a fast Fourier transformer (FFT), a demapper, a deinterleaver, a channel decoder, etc. to demodulate the baseband signal, and may include a channel encoder, an interleaver, a mapper, an inverse fast Fourier transformer (IFFT), etc. to modulate the data stream.

The baseband processor 1230 may include a second digital phase locked loop 1231. For example, the baseband processor 1230 may use an output signal of the second digital phase locked loop 1231 as a clock signal for operating the baseband processor 1230. The second digital phase locked loop 1231 may include a sigma-delta time-to-digital converter that performs a time-to-digital conversion in a sigma-delta manner, and thus, may more accurately generate the output signal having a desired frequency even in a relatively low power supply voltage environment.

Figure 40:
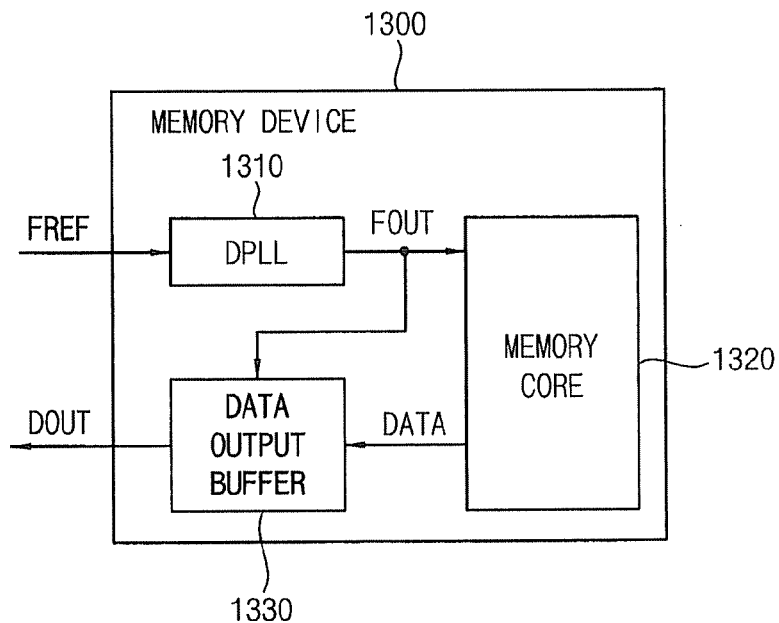
FIG. 40 is a block diagram illustrating a memory device including a digital phase locked loop according to example embodiments.

FIG. 40 is a block diagram illustrating a memory device including a digital phase locked loop according to example embodiments.

Referring to FIG. 40, a memory device 1300 includes a digital phase locked loop 1310, a memory core 1320 and a data output buffer 1330. According to example embodiments, the memory device 1300 may be a dynamic random access memory (DRAM), a mobile DRAM, a static random access memory (SRAM), an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. For example, the memory device 1300 may be a double data rate (DDR) synchronous dynamic random access memory (SDRAM) or a graphic double data rate (GDDR) synchronous dynamic random access memory (SDRAM).

The digital phase locked loop 1310 may generate an output signal FOUT having a desired frequency based on a reference input signal FREF. The digital phase locked loop 1310 may include a sigma-delta time-to-digital converter that performs a time-to-digital conversion in a sigma-delta manner, and thus, may more accurately generate the output signal FOUT having the desired frequency even in a relatively low power supply voltage environment.

The memory core 1320 may perform a write operation that stores data provided from a data input buffer (not shown), and may perform a read operation that provides the stored data DATA to the data output buffer 1330. The memory core 1320 may perform the write operation and/or the read operation based on the output signal FOUT of the digital phase locked loop 1310. The memory core 1320 may include a memory cell array having a plurality of memory cells for storing data, row and column decoders selecting a wordline and a bitline of the memory cell array based on an address signal, and a sense amplifier sensing the data stored in selected memory cells.

The data output buffer 1330 may output the data DATA provided from the memory core 1320 as output data DOUT in response to the output signal FOUT of the digital phase locked loop 1310. The output data DOUT may be synchronized with the output signal FOUT of the digital phase locked loop 1310, and may be provided to an external device, such as a memory controller.

Figure 41:
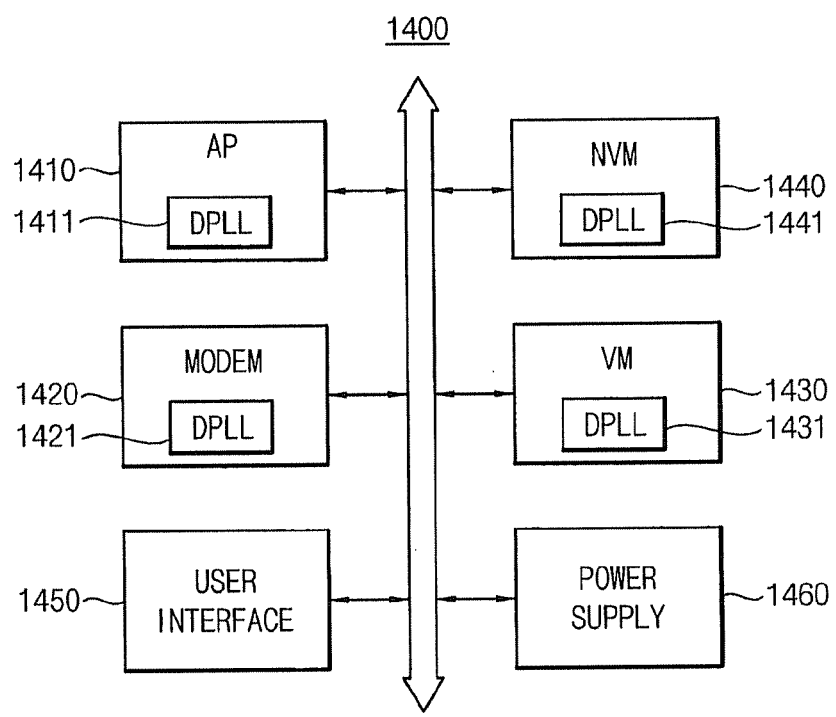
FIG. 41 is a block diagram illustrating a mobile system according to example embodiments.

FIG. 41 is a block diagram illustrating a mobile system according to example embodiments.

Referring to FIG. 41, a mobile system 1400 includes an application processor 1410, a modem 1420, a volatile memory device 1430, a nonvolatile memory device 1440, a user interface 1450 and a power supply 1460. According to example embodiments, the mobile system 1400 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation system, etc.

The application processor 1410 may execute applications, such as an internet browser, a game application, a video player application, etc. The application processor 1410 may include a first digital phase locked loop 1411 for frequency synthesis, clock recovery, clock generation, spread spectrum, clock distribution, de-skewing, jitter and noise reduction, etc. The application processor 1410 may operate based on a clock signal generated by the first digital phase locked loop 1411. The first digital phase locked loop 1411 may include a sigma-delta time-to-digital converter that performs a time-to-digital conversion in a sigma-delta manner, and thus, may more accurately generate the clock signal having a desired frequency even in a relatively low power supply voltage environment. According to example embodiments, the application processor 1410 may include a single processor core or a plurality of processor cores. For example, the application processor 1410 may be a multi-core processor, such as a dual-core processor, a quad-core processor, a hexa-core processor, etc. In some example embodiments, the application processor 1410 may further include a cache memory located inside and/or outside the application processor 1410.

The modem 1420 may perform wired or wireless communication with an external device. For example, the modem 1420 may perform universal serial bus (USB) communication, Ethernet communication, near field communication (NFC), radio frequency identification (RFID) communication, mobile telecommunication, memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The modem 1420 may include a baseband chipset. The modem 1420 may further include a second digital phase locked loop 1421 for frequency synthesis, clock recovery, clock generation, spread spectrum, clock distribution, de-skewing, jitter and noise reduction, etc. The second digital phase locked loop 1421 may include a sigma-delta time-to-digital converter that performs a time-to-digital conversion in a sigma-delta manner, and thus, may more accurately generate an output signal having a desired frequency even in a relatively low power supply voltage environment.

The volatile memory device 1430 may store an instruction/data processed by the application processor 1410, or may serve as a working memory. For example, the volatile memory device 1430 may be implemented by a dynamic random access memory (DRAM), a static random access memory (SRAM), a mobile DRAM, or the like. The volatile memory device 1430 may include a third digital phase locked loop 1431 for frequency synthesis, clock recovery, clock generation, spread spectrum, clock distribution, de-skewing, jitter and noise reduction, etc. The third digital phase locked loop 1431 may include a sigma-delta time-to-digital converter that performs a time-to-digital conversion in a sigma-delta manner, and thus, may more accurately generate an output signal having a desired frequency even in a relatively low power supply voltage environment.

The nonvolatile memory device 1440 may store a boot image for booting the mobile system 1400. For example, the nonvolatile memory device 1440 may be implemented by an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like. The nonvolatile memory device 1440 may include a fourth digital phase locked loop 1441 for frequency synthesis, clock recovery, clock generation, spread spectrum, clock distribution, de-skewing, jitter and noise reduction, etc. The fourth digital phase locked loop 1441 may include a sigma-delta time-to-digital converter that performs a time-to-digital conversion in a sigma-delta manner, and thus, may more accurately generate an output signal having a desired frequency even in a relatively low power supply voltage environment.

The user interface 1450 may include at least one input device, such as a keypad, a touch screen, etc., and at least one output device, such as a display device, a speaker, etc. The power supply 1460 may supply the mobile system 1400 with power. In some example embodiments, the mobile system 1400 may further include a camera image processor (CIS), storage device, such as a memory card, a solid state drive (SDD), a CD-ROM, etc.

According to example embodiments, the mobile system 1400 and/or components of the mobile system 1400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 42:
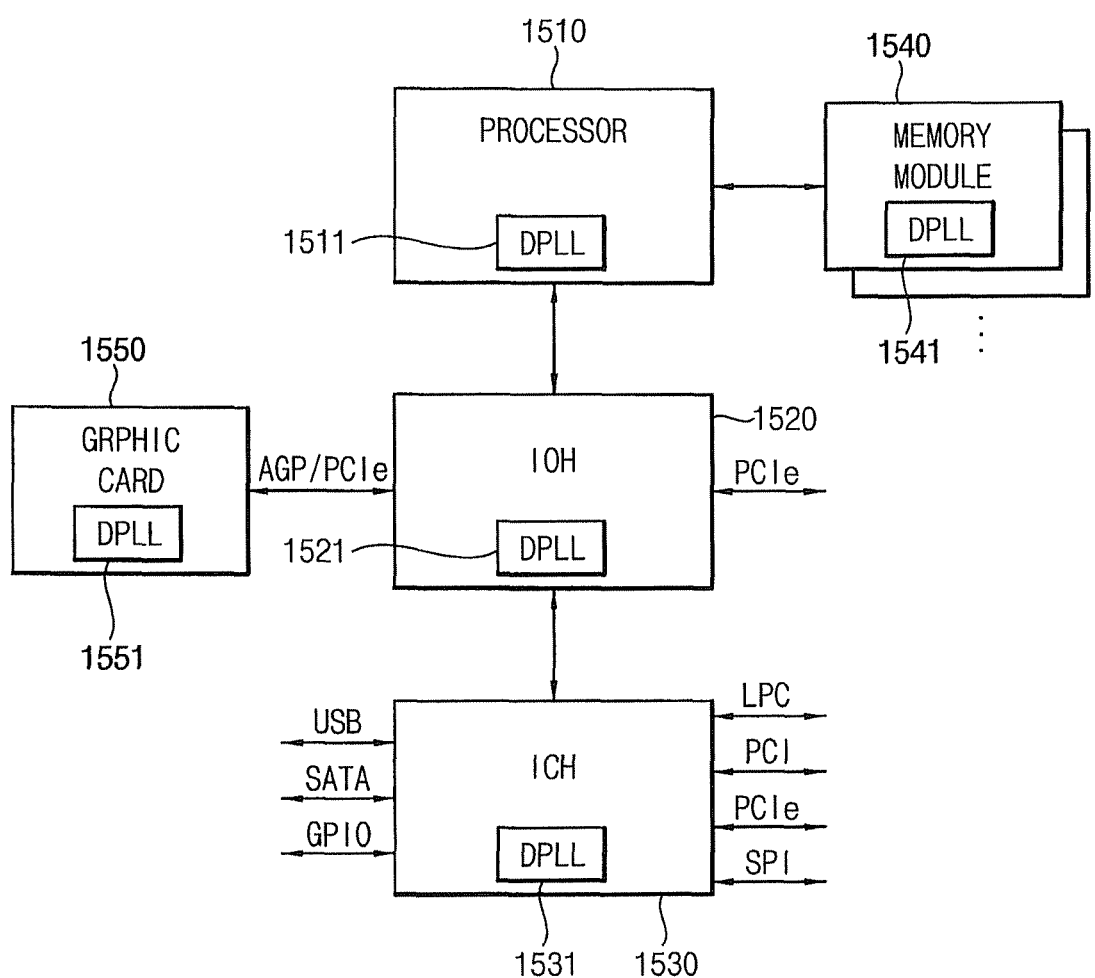
FIG. 42 is a block diagram illustrating a computing system according to example embodiments.

FIG. 42 is a block diagram illustrating a computing system according to example embodiments.

Referring to FIG. 42, a computing system 1500 includes a processor 1510, an input/output hub 1520, an input/output controller hub 1530, at least one memory module 1540 and a graphic card 1550. According to example embodiments, the computing system 1500 may be any computing system, such as a personal computer (PC), a server computer, a workstation, a tablet computer, a laptop computer, a mobile phone, a smart phone, a personal digital assistant (PDA), a portable multimedia player (PMP), a digital camera, a digital television, a set-top box, a music player, a portable game console, a navigation device, etc.

The processor 1510 may perform specific calculations and/or tasks. For example, the processor 1510 may be a microprocessor, a central process unit (CPU), a digital signal processor, or the like. The processor 1510 may include a first digital phase locked loop 1511 for frequency synthesis, clock recovery, clock generation, spread spectrum, clock distribution, de-skewing, jitter and noise reduction, etc. The processor 1510 may operate based on a clock signal generated by the first digital phase locked loop 1511. The first digital phase locked loop 1511 may include a sigma-delta time-to-digital converter that performs a time-to-digital conversion in a sigma-delta manner, and thus, may more accurately generate the clock signal having a desired frequency even in a relatively low power supply voltage environment. According to example embodiments, the processor 1510 may include a single processor core or a plurality of processor cores. For example, the processor 1510 may be a multi-core processor, such as a dual-core processor, a quad-core processor, a hexa-core processor, etc. Although FIG. 42 illustrates an example of the computing system 1500 including one processor 1510, according to example embodiments, the computing system 1500 may include a plurality of processors. In some example embodiments, the processor 1510 may further include a cache memory located inside or outside the processor 1510.

The processor 1510 may include a memory controller (not shown) that controls an operation of the memory module 1540. The memory controller included in the processor 1510 may be referred to as an integrated memory controller (IMC). A memory interface between the memory controller and the memory module 1540 may be implemented by one channel including a plurality of signal lines, or by a plurality of channels. Each channel may be coupled to at least one memory module 1540. In some example embodiments, the memory controller may be included in the input/output hub 1520. The input/output hub 1520 including the memory controller may be referred to as a memory controller hub (MCH).

The memory module 1540 may include a plurality of memory devices that store data provided from the memory controller. The memory module 1540 may include a fourth digital phase locked loop 1541 for frequency synthesis, clock recovery, clock generation, spread spectrum, clock distribution, de-skewing, jitter and noise reduction, etc. In some example embodiments, the fourth digital phase locked loop 1541 may be disposed on the memory module 1540, and may be used to operate a buffer between the memory controller and the memory devices. In other example embodiments, the digital phase locked loop 1541 may be disposed on each memory device, and may be used to operate each memory device. The fourth digital phase locked loop 1541 may include a sigma-delta time-to-digital converter that performs a time-to-digital conversion in a sigma-delta manner, and thus, may more accurately generate an output signal having a desired frequency even in a relatively low power supply voltage environment.

The input/output hub 1520 may manage data transfer between the processor 1510 and devices, such as the graphic card 1550. The input/output hub 1520 may include a second digital phase locked loop 1521 for frequency synthesis, clock recovery, clock generation, spread spectrum, clock distribution, de-skewing, jitter and noise reduction, etc. The second digital phase locked loop 1521 may include a sigma-delta time-to-digital converter that performs a time-to-digital conversion in a sigma-delta manner, and thus, may more accurately generate an output signal having a desired frequency even in a relatively low power supply voltage environment.

The input/output hub 1520 may be coupled to the processor 1510 via at least one of various interfaces, such as a front side bus (FSB), a system bus, a HyperTransport, a lightning data transport (LDT), a QuickPath interconnect (QPI), a common system interface (CSI), etc. Although FIG. 42 illustrates an example of the computing system 1500 including one input/output hub 1520, according to example embodiments, the computing system 1500 may include a plurality of input/output hubs.

The input/output hub 1520 may provide various interfaces with the devices. For example, the input/output hub 1520 may provide an accelerated graphics port (AGP) interface, a peripheral component interface-express (PCIe), a communications streaming architecture (CSA) interface, etc.

The graphic card 1550 may be coupled to the input/output hub 1520 via the AGP or the PCIe. The graphic card 1550 may control a display device (not shown) for displaying an image. The graphic card 1550 may include an internal processor and an internal memory to process the image. The graphic card 1550 may further include a fifth digital phase locked loop 1551 for frequency synthesis, clock recovery, clock generation, spread spectrum, clock distribution, de-skewing, jitter and noise reduction, etc. The fifth digital phase locked loop 1551 may include a sigma-delta time-to-digital converter that performs a time-to-digital conversion in a sigma-delta manner, and thus, may more accurately generate an output signal having a desired frequency even in a relatively low power supply voltage environment. In some example embodiments, the input/output hub 1520 may include an internal graphic device along with or instead of the graphic card 1550. The internal graphic device may be referred to as an integrated graphics, and an input/output hub including the memory controller and the internal graphic device may be referred to as a graphics and memory controller hub (GMCH).

The input/output controller hub 1530 may perform data buffering and interface arbitration to efficiently operate various system interfaces. The input/output controller hub 1530 may include a third digital phase locked loop 1531 for frequency synthesis, clock recovery, clock generation, spread spectrum, clock distribution, de-skewing, jitter and noise reduction, etc. The third digital phase locked loop 1531 may include a sigma-delta time-to-digital converter that performs a time-to-digital conversion in a sigma-delta manner, and thus, may more accurately generate an output signal having a desired frequency even in a relatively low power supply voltage environment.

The input/output controller hub 1530 may be coupled to the input/output hub 1520 via an internal bus. For example, the input/output controller hub 1530 may be coupled to the input/output hub 1520 via at least one of various interfaces, such as a direct media interface (DMI), a hub interface, an enterprise Southbridge interface (ESI), PCIe, etc.

The input/output controller hub 1530 may provide various interfaces with peripheral devices. For example, the input/output controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some example embodiments, the processor 1510, the input/output hub 1520 and the input/output controller hub 1510 may be implemented as separate chipsets or separate integrated circuits. In other embodiments, at least two of the processor 1510, the input/output hub 1520 and the input/output controller hub 1530 may be implemented as one chipset.

Example embodiments may be used in any device or system including a phase locked loop, such as a mobile phone, a smart phone, a personal digital assistant (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although only a few example embodiments have been described, those skilled in the art will readily appreciate that many modifications are possible in the example embodiments without materially departing from the novel teachings and advantages of inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A system-on-chip (SOC) including a time difference adder, the time difference adder comprising:
    a first register unit configured to receive first and second input signals having a first time difference, the first register unit being further configured to generate a first output signal in response to a first signal; and
    a second register unit configured to receive third and fourth input signals having a second time difference, the second register unit being further configured to generate a second output signal having a third time difference with respect to the first output signal in response to the first signal, the third time difference corresponding to a sum of the first time difference and the second time difference.

2. The SOC of claim 1, wherein the first register unit includes,
    a first offset delay unit configured to generate a first hold signal by delaying the second input signal by an offset time, and
    a first time register including a first input terminal configured to receive the first input signal, a first hold terminal configured to receive the first hold signal, a first awake terminal configured to receive the first signal, and a first output terminal configured to output the first output signal, and wherein the second register unit includes,
    a second offset delay unit configured to generate a second hold signal by delaying the third input signal by the offset time, and
    a second time register including a second input terminal configured to receive the fourth input signal, a second hold terminal configured to receive the second hold signal, a second awake terminal configured to receive the first signal, and a second output terminal configured to output the second output signal.

3. The SOC of claim 2, wherein the first output signal has a rising edge after a first time period after a rising edge of the first signal, the first time period being equal to a discharge time minus the offset time minus the first time difference, and wherein the second output signal has a rising edge after a second time period after the rising edge of the first signal, the second time period being equal to the discharge time minus the offset time plus the second time difference.

4. The SOC of claim 3, wherein the first time register includes a first capacitor, and the second time register includes a second capacitor, wherein the first capacitor and the second capacitor have substantially the same capacitance, and wherein the discharge time is determined according to the capacitance.

5. The SOC of claim 2, wherein the first time register comprises:
    a first inverter configured to invert the first input signal;
    an inverter controlling unit configured to deactivate the first inverter in response to the first hold signal, the inverter controlling unit being further configured to activate the first inverter in response to the first signal;
    a capacitor configured to be charged or discharged in response to an output signal from the first inverter; and
    a second inverter configured to generate the first output signal based on a voltage of the capacitor.

6. The SOC of claim 5, wherein the capacitor is discharged during a time interval between the first input signal and the first hold signal to store information about the time difference between the first input signal and the first hold signal.

7. The SOC of claim 5, wherein a discharging of the capacitor is started in response to a rising edge of the first input signal, is stopped in response to a rising edge of the first hold signal, and is restarted in response to a rising edge of the first signal.

8. The SOC of claim 5, wherein the first inverter includes,
    a first transistor including a gate configured to receive the first input signal, a source coupled to a power supply voltage via the inverter controlling unit, and a drain coupled to a middle node, and
    a second transistor including a gate configured to receive the first input signal, a source coupled to a ground voltage via the inverter controlling unit, and a drain coupled to the middle node, wherein the inverter controlling unit includes,
    a third transistor coupled between the power supply voltage and the first transistor, a fourth transistor coupled between the ground voltage and the second transistor,
    a D flip-flop including an output terminal coupled to a gate of the third transistor, an inverted output terminal coupled to a gate of the fourth transistor, a data terminal coupled to the inverted output terminal, and a clock terminal, and
    a selector configured to selectively output the first hold signal or the first signal to the clock terminal of the D flip-flop in response to an inverted output signal output from the inverted output terminal of the D flip-flop, wherein the capacitor is coupled between the middle node and the ground voltage, and
    wherein the second inverter includes,
        a fifth transistor including a gate coupled to the middle node, a source coupled to the power supply voltage, and a drain configured to output the first output signal, and
        a sixth transistor including a gate coupled to the middle node, a source coupled to the ground voltage, and a drain configured to output the first output signal.

9. The SOC of claim 2, wherein the first time register comprises:
    a first inverter configured to invert the first input signal;

an inverter controlling unit configured to deactivate the first inverter in response to the first hold signal, and to activate the first inverter in response to the first signal;

a capacitor configured to be charged or discharged in response to an output signal of the first inverter; and a comparator configured to generate the first output signal by comparing a voltage of the capacitor with a reference voltage.

10. The SOC of claim 1, wherein the first signal is an awake signal generated by delaying or inverting one of the first input signal, the second input signal, the third input signal and the fourth input signal.

11. A system-on-chip (SOC) including a time difference adder, the time difference adder comprising:

a first register unit configured to receive first and second input signals having a first time difference, the first register unit being further configured to generate a first output signal in response to a first signal; and a second register unit configured to receive third and fourth input signals having a second time difference, the second register unit being further configured to generate a second output signal having a third time difference with respect to the first output signal in response to the first signal, the third time difference corresponding to a sum of the first time difference and the second time difference, wherein the first register unit includes,
a first offset delay unit configured to generate a first hold signal by delaying the second input signal by an offset time, and
a first time register including a first input terminal configured to receive the first input signal, a first hold terminal configured to receive the first hold signal, a first awake terminal configured to receive the first signal, and a first output terminal configured to output the first output signal, and wherein the second register unit includes,
a second offset delay unit configured to generate a second hold signal by delaying the third input signal by the offset time, and
a second time register including a second input terminal configured to receive the fourth input signal, a second hold terminal configured to receive the second hold signal, a second awake terminal configured to receive the first signal, and a second output terminal configured to output the second output signal.

12. A system on chip comprising:

a time difference adder configured to generate at least a first output signal and a second output signal based on a plurality of input signals, the first output signal being generated in response to a trigger signal and based on a first pair of the plurality of input signals having a first time difference, and the second output signal being generated in response to the trigger signal and based on a second pair of the plurality of input signals having a second time difference, wherein the first output signal and the second output signal have a third time difference determined based on the first time difference and the second time difference.

13. The system on chip of claim 12, wherein the time difference adder comprises:

a first register unit configured to generate the first output signal based on the first pair of the plurality of input signals, and in response to the trigger signal; and a second register unit configured to generate the second output signal based on the second pair of the plurality of input signals, and in response to the trigger signal.

14. The system on chip of claim 13, wherein the first pair of the plurality of input signals includes a first input signal and a second input signal, the first register unit including, a first offset delay unit configured to generate a first hold signal by delaying the second input signal by an offset time, and a first time register including a first input terminal configured to receive the first input signal, a first hold terminal configured to receive the first hold signal, a first awake terminal configured to receive the trigger signal, and a first output terminal configured to output the first output signal.

15. The system on chip of claim 14, wherein the second pair of the plurality of input signals includes a third input signal and a fourth input signal, the second register unit including, a second offset delay unit configured to generate a second hold signal by delaying the third input signal by the offset time, and a second time register including a second input terminal configured to receive the fourth input signal, a second hold terminal configured to receive the second hold signal, a second awake terminal configured to receive the trigger signal, and a second output terminal configured to output the second output signal.

16. The system on chip of claim 13, wherein the first pair of the plurality of input signals includes a first input signal and a second input signal, the first register unit including, a first time register including a first input terminal configured to receive the first input signal, a first hold terminal configured to receive the second input signal, a first awake terminal configured to receive the trigger signal, and a first output terminal configured to output the first output signal.

17. The system on chip of claim 16, wherein the second pair of the plurality of input signals includes a third input signal and a fourth input signal, the second register unit including, a second time register including a second input terminal configured to receive the fourth input signal, a second hold terminal configured to receive the third input signal, a second awake terminal configured to receive the trigger signal, and a second output terminal configured to output the second output signal.

* * * * *